(12) United States Patent
Esaki

(10) Patent No.: US 6,512,282 B2
(45) Date of Patent: *Jan. 28, 2003

(54) SEMICONDUCTOR DEVICE AND METHOD FOR FABRICATING THE SAME

(75) Inventor: Hideya Esaki, Toyonaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/778,099

(22) Filed: Feb. 7, 2001

(65) Prior Publication Data

US 2001/0050396 A1 Dec. 13, 2001

(30) Foreign Application Priority Data

Mar. 14, 2000 (JP) ........................... 2000-071151

(51) Int. Cl.$^7$ ................................ H01L 29/00
(52) U.S. Cl. .................. 257/499; 257/506; 257/510
(58) Field of Search ................. 257/327, 330, 257/331, 332, 333, 335, 336, 337, 374, 506, 510, 513, 499

(56) References Cited

U.S. PATENT DOCUMENTS 6,130,121 A * 10/2000 Sze ........................ 438/167
6,239,472 B1 * 5/2001 Shenoy ................... 257/338
6,291,282 B1 * 9/2001 Wilk et al. ............... 438/199

\* cited by examiner

*Primary Examiner*—Olik Chaudhuri
*Assistant Examiner*—Hoai Pham
(74) *Attorney, Agent, or Firm*—Nixon Peabody LLP; Donald R. Studebaker

(57) ABSTRACT

A sidewall insulating film is formed on the side faces of a buried gate electrode on a substrate. A trench isolation film, self-aligned with the gate electrode, is also formed so that the upper surface of the isolation film is higher than that of the gate electrode. And source/drain contacts, which make electrical contact with source/drain regions, are formed between the sidewall insulating film and isolation film. Since the source/drain contacts and isolation film are both self-aligned with the gate electrode, no mask overlay margin is needed. Thus, the size of the entire active region and that of the source/drain contacts or source/drain regions can be reduced in the gate length direction.

10 Claims, 42 Drawing Sheets

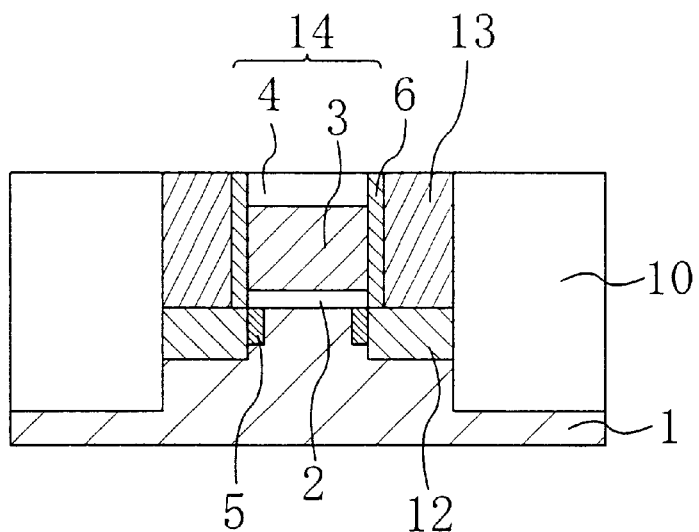
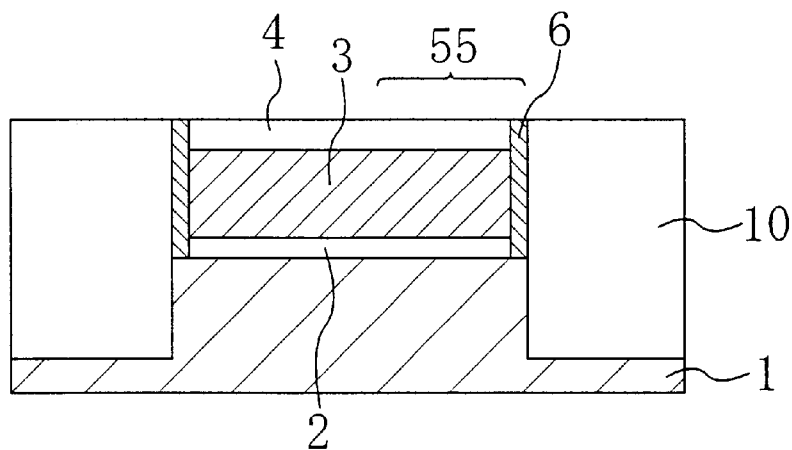
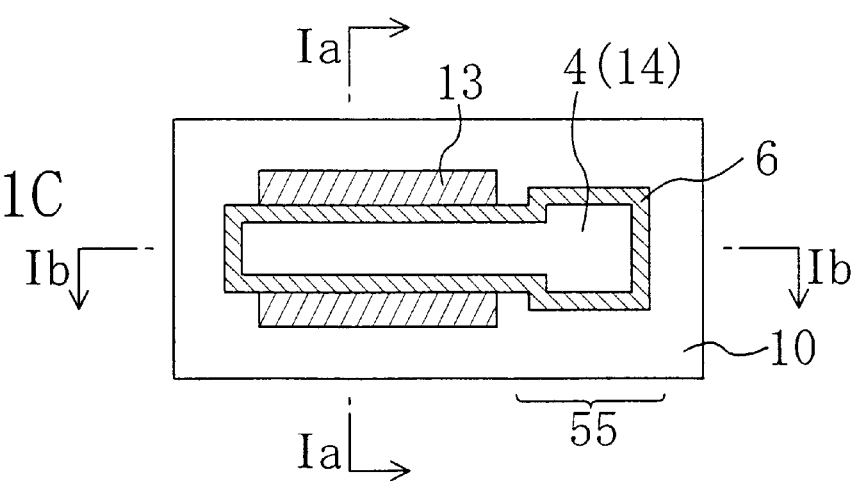

SEMICONDUCTOR DEVICE AND METHOD FOR FABRICATING THE SAME

BACKGROUND OF THE INVENTION

The present invention relates to a semiconductor device, which includes a buried gate electrode and an isolation film and source/drain contacts that are self-aligned with the buried gate electrode, and also relates to a method for fabricating a device with such a structure.

Recently, the number of semiconductor devices that can be integrated on a single chip has increased by leaps and bounds as those devices have been tremendously downsized. As this miniaturization trend accelerates, a contact hole (or a contact formed by filling in the hole with a conductor), provided for interconnecting the gate electrode or doped layer of an MIS semiconductor device to an interconnection layer, has further reduced its size every time size generations alternate.

To reduce a margin needed in overlaying masks one upon the other during a photolithographic process and thereby further increase the number of semiconductor devices integrated, various methods for forming contacts self-aligned with a gate electrode have been researched and developed vigorously. Those contacts will be herein called "self-aligned contacts". Hereinafter, a semiconductor device including the known self-aligned contacts and its fabrication process will be described.

FIG. 40 illustrates a cross section of a known MIS semiconductor device, including self-aligned contacts, taken in the channel direction (i.e., the gate length direction) thereof. As shown in FIG. 40, a trench isolation film 104 is provided on an Si substrate 101 and an MIS transistor is formed in an active region surrounded by the isolation film 104. The MIS transistor includes: a gate insulating film 105 of $SiO_2$; a gate electrode 106 of polysilicon; an upper insulating film 107 of SiN; a nitride sidewall 109 of SiN; LDD regions 108; and heavily doped source/drain regions 110. The gate insulating film 105, gate electrode 106 and upper insulating film 107 are stacked in this order on the substrate 101 and the side faces of the gate electrode 106 and upper insulating film 107 are covered with the sidewall 109. The LDD regions 108 and heavily doped source/drain regions 110 are defined within the substrate 101 by introducing dopants thereto. Contacts 112 of tungsten, for example, are formed to pass through an interlevel dielectric film 111 over the substrate 101 and to reach the heavily doped source/drain regions 110. Depending on the direction of mask misalignment, these contacts 112 come into partial contact with the upper insulating film 107 and sidewall 109. And these contacts 112 are self-aligned contacts that have been aligned with the gate electrode 106 automatically.

FIGS. 41A through 41E are cross-sectional views illustrating respective process steps for fabricating the MIS semiconductor device including the known self-aligned contacts.

First, in the process step shown in FIG. 41A, a stopper insulating film 102, which may be a multilayer structure consisting of silicon dioxide and silicon nitride films, is deposited on an Si substrate 101. Then, parts of the stopper insulating film 102 and substrate 101, where the trench isolation will be formed, are etched to a predetermined depth, thereby forming a trench 103 in the substrate 101.

Next, in the process step shown in FIG. 41B, a CVD silicon dioxide film is deposited over the substrate and has its surface planarized by a chemical/mechanical polishing (CMP) process using the stopper insulating film 102 as a polish stopper. In this manner, the trench 103 is filled in with the CVD silicon dioxide film, thereby forming the trench isolation film 104. As a result, the upper surfaces of the isolation film 104 and stopper insulating film 102 are planarized to the same level. Once a desired planarity is attained, the stopper insulating film 102 is removed.

Then, in the process step shown in FIG. 41C, the exposed surface of the substrate 101 is thermally oxidized, thereby forming a gate insulating film 105 of $SiO_2$. Subsequently, after polysilicon and silicon nitride film have been stacked in this order over the substrate, those two films are patterned by lithography and dry etching techniques to form a gate electrode 106 and an upper insulating film 107 in the active region. Thereafter, dopants ions are lightly implanted into the substrate 101 using the upper insulating film 107 and isolation film 104 as a mask, thereby defining LDD regions 108 self-aligned with the gate electrode 106.

Next, in the process step shown in FIG. 41D, a silicon nitride film is deposited over the substrate and then etched back, thereby forming a nitride sidewall 109 over the side faces of the upper insulating film 107 and gate electrode 106. Then, dopants ions are heavily implanted into the substrate 101 using the upper insulating film 107, sidewall 109 and isolation film 104 as a mask, thereby defining heavily doped source/drain regions 110 self-aligned with the gate electrode 106.

Subsequently, in the process step shown in FIG. 41E, a relatively thick CVD silicon dioxide film is deposited over the substrate and then planarized by a CMP process, thereby forming an interlevel dielectric film 111. Thereafter, contact holes, reaching the heavily doped source/drain regions 110, are opened through the interlevel dielectric film 111 and then filled in with a conductor, thereby forming source/drain contacts 112 that make electrical contact with the heavily doped source/drain regions 110.

According to this method, when the contact holes are opened through the interlevel dielectric film 111 so as to reach the heavily doped source/drain regions 110, the gate electrode 106 has already been covered with the SiN upper insulating film 107 and nitride sidewall 109. Thus, even if those holes are formed to overlap with the gate electrode 106 due to mask misalignment, the silicon nitride film serves as an etch stopper. As a result, the source/drain contacts 112 can be formed as self-aligned contacts without making the holes partially etch the gate electrode 106.

The semiconductor device with the known self-aligned contacts and its fabrication process, however, has the following drawbacks.

Firstly, in the known method of making the self-aligned contacts, the source/drain contacts must be formed within the contact holes that have been prepared by lithography and dry etching processes. Thus, the size of the source/drain contacts can be reduced to no smaller than the minimum opening size of a resist pattern for use in an exposure process.

The self-aligning technique for the known self-aligned contacts was developed to form the contact holes, reaching the source/drain regions, without getting the gate electrode etched even if those holes horizontally overlap with the gate electrode due to the placement error of photomasks for use in making the holes. This is because the upper and side faces of the gate electrode have already been covered with the silicon nitride film when those holes are opened. That is to say, this self-aligned contact making method was designed to increase an allowable mask overlay margin for a photolithographic process for forming the contact holes. Thus, the size of the contact holes themselves, in which the contacts should be formed by filling the holes with a conductor, is determined by the minimum opening size of a resist pattern.

FIG. 42A is a cross-sectional view illustrating an MIS transistor including the known self-aligned contacts along with the sizes of respective parts of the transistor. FIG. 42B is a plan view illustrating a photomask used for forming the contact holes.

As shown in FIG. 42A, the contact holes 114 reaching the heavily doped source/drain regions 110 are formed by etching the interlevel dielectric film 111 using a resist pattern 113 as a mask. Thus, it is impossible to reduce the size of the contact holes 114, in which the source/drain contacts should be formed, to less than the minimum opening size of the resist pattern 113 (i.e., a positive photoresist film in the illustrated example). The lower part 114a of the contact hole 114 on the left-hand side, located between the sidewall 109 and interlevel dielectric film 111, has a size smaller than the minimum opening size. However, this part 114a is formed due to the mask misalignment and this size is non-controllable. Accordingly, when a contact is formed inside the contact hole 114, the area of contact between the contact and heavily doped source/drain region 110 is smaller than the desired one. On the other hand, the upper part 114b of the contact hole 114 has a size approximately equal to the minimum opening size. Thus, it is virtually impossible to reduce the area of contact between the contact formed inside the contact hole 114 and an interconnection line, which will be formed on the contact, to less than the minimum opening size.

According to a normal exposure technique, the gate length determined by a resist pattern for a gate electrode (i.e., the length of the resultant gate electrode 106) may be equal to the minimum opening size (or the design rule in this case), e.g., 0.15 $\mu$m. However, the resolution of a resist pattern with no line-and-space pattern, e.g., a resist pattern for making contact holes, is lower than that of a gate electrode pattern. Accordingly, openings with the minimum size of 0.15 $\mu$m cannot be formed, and therefore the minimum opening size of the resist pattern 113 shown in FIG. 42A is about 0.2 $\mu$m in a normal case. Thus, if the gate length of the gate electrode is defined at the minimum opening size, it is difficult to reduce the size of the source/drain contacts (or contact holes) to approximately equal to, or less than, the gate length in accordance with the currently available technique.

Secondly, the relative positional relationship among the gate electrode, isolation film and source/drain contacts is changeable depending on the mask overlay accuracy of an exposure system. Thus, an extra mask overlay margin is needed and the area of the active region cannot be reduced proportionally to a reduced design rule. And it is very difficult to further reduce the areas of the source/drain regions or the junction capacitance between the source/drain regions and substrate.

Usually, a photomask is designed in such a shape that the contact holes 114 will not overlap with the gate electrode 106 but will be located over the heavily doped source/drain regions 110 as shown in FIG. 42B. Suppose a semiconductor device has been formed by using such a photomask and by setting the mask overlay margin to zero and the gate length of the gate electrode 106 to the minimum opening size. In that case, the sizes of respective parts of the device as measured in the channel direction (i.e., the gate length direction) will be as shown in FIG. 42A. The gate length of the gate electrode 106 will be 0.15 $\mu$m. The horizontal size of the sidewall 109 will be 0.12 $\mu$m in total (i.e., 0.6 $\mu$m each side). And the size of part of the source/drain regions 110 that is located between the sidewall 109 and isolation film 104 as measured in the gate length direction will be 0.4 $\mu$m in total (i.e., 0.2 $\mu$m each side). As described above, this size is approximately equal to the designed size of the contact holes 114. Add all of these sizes together, and the size of the entire active region interposed between the right- and left-hand side portions of the isolation film 104 will be about 0.67 $\mu$m as measured in the gate length direction. The size of the active region except the gate electrode 106 with the length of 0.15 $\mu$m will be about 0.52 $\mu$m in total (i.e., 0.26 $\mu$m each side) as measured in the gate length direction. The size of the heavily doped source/drain regions 110, including their parts diffused under the gate electrode 106, will also be about 0.52 $\mu$m in total (i.e., 0.26 $\mu$m each side) as measured in the gate length direction. On the other hand, supposing a mask overlay margin of about 0.01 $\mu$m is needed in aligning each pair of parts with each other, the size of the entire active region will be about 0.75 $\mu$m as measured in the gate length direction. Even if the design rule for a gate electrode, for example, has been reduced, this mask overlay margin does not decrease proportionally. Since it is expected that the design rule will be continuously reduced from now on, the mask overlay margin will constitute an increasingly great obstacle to downsizing of semiconductor devices.

According to the sizes specified above, the sizes of the active region and heavily doped source/drain regions as measured in the gate length direction are five or more times greater and four or more times greater than the gate length, respectively. Thus, it is necessary, but very difficult, to further reduce the sizes of the active region and heavily doped source/drain regions for the purpose of downsizing the semiconductor devices and reducing the junction capacitance.

Thirdly, in the conventional fabrication process, a gate electrode is formed by patterning and then LDD and heavily doped source/drain regions are defined. Thus, after the gate electrode has been formed, annealing should be performed to activate the dopants that have been introduced to define the LDD and source/drain regions. Accordingly, it is difficult to use a metal for the gate electrode and therefore the gate electrode is normally made of polysilicon or polycide with good thermal resistance. However, as the size of gate electrodes has been reduced, it has become increasingly hard to lower the resistance of the gate electrode made of polysilicon or polycide. Furthermore, when the gate electrode is made of polysilicon, boron, which has been introduced as a dopant, might diffuse from the polysilicon gate electrode through the gate insulating film into the channel region inside the substrate. As a result, the dopant concentration in the channel region and the threshold voltage of the device might change unintentionally.

SUMMARY OF THE INVENTION

To further downsize the semiconductor devices, the present invention adopts a completely new approach, which is totally different from the prior art.

An object of this invention is providing a downsized semiconductor device, of which the components can be freely disposed in an active region without being limited by the mask overlay margin, by self-aligning not only contacts but also an isolation film as well with a buried gate electrode.

Another object of this invention is providing a method for fabricating the device by this new self-aligning technique.

An inventive semiconductor device includes: a gate insulating film formed on a semiconductor substrate; a buried gate electrode formed on the gate insulating film; an upper insulating film formed on the buried gate electrode; a sidewall insulating film formed on side faces of the buried gate electrode and the upper insulating film; and a trench isolation film self-aligned with the buried gate electrode. The upper surface of the isolation film is located at a level higher than that of the buried gate electrode. The lower surface of the isolation film is located at a level lower than the upper surface of the substrate at least on a cross section of the device taken in a gate length direction. The device further includes: source/drain diffused regions defined in respective regions of the substrate beside the buried gate electrode; and source/drain contacts formed between the sidewall insulating film and the isolation film and self-aligned with the buried gate electrode to make electrical contact with the source/drain diffused regions.

In the inventive device, the upper surface of the trench isolation film is higher than that of the buried gate electrode and the source/drain contacts are interposed between the gate electrode and isolation film. In addition, since the source/drain contacts and isolation film are both self-aligned with the gate electrode, no mask overlay margin is needed. Thus the active region, surrounded by the isolation film, can have its size reduced in the gate length direction.

In one embodiment of the present invention, the gate electrode may be made of a metal. Then, a resultant MIS semiconductor device, including a buried gate electrode with low resistance, can exhibit high current drivability.

In another embodiment of the present invention, the gate insulating film may be formed out of a high dielectric constant insulating film with a dielectric constant higher than that of $SiO_2$. In such an embodiment, even if the gate insulating film is thickened, the $SiO_2$ converted thickness thereof (i.e., the thickness of an $SiO_2$ film that has a capacitance equal to that of the gate insulating film) still can be reduced. As a result, the current drivability thereof improves and the leakage current, which usually increases when the gate insulating film is thinned, does not increase.

In still another embodiment, as viewed from over the device the source/drain contacts are preferably in substantially the same planar shape as the source/drain diffused regions in respective areas where the contacts overlap the source/drain diffused regions, and are preferably formed only over the source/drain diffused regions. Unlike the known source/drain contacts, which are formed by filling in contact holes with a conductor, the contacts can be made in any size. That is to say, the size of the source/drain contacts as measured in the gate length direction can be smaller than even the minimum opening size of a resist pattern. For example, the size of the source/drain contacts in the gate length direction may be in the range from 0.01 $\mu$m to 0.1 $\mu$m, for example.

In still another embodiment, the respective upper surfaces of the upper insulating film, the isolation film and the source/drain contacts are preferably planarized to substantially the same levels. In that case, the planarity of the substrate increases as a whole, thus improving the reliability of upper-level interconnects, for example.

In yet another embodiment, on a transversal cross section of the device taken across a part of the buried gate electrode, a periphery, outlining the sidewall insulating film, the buried gate electrode and the source/drain contacts, is preferably surrounded by the isolation film. Then, the isolation capability of the semiconductor device improves.

In yet another embodiment, the buried gate electrode in its entirety, including a gate contact region thereof, is preferably located only over the gate insulating film.

In this particular embodiment, on a transversal cross section of the device taken across a part of the buried gate electrode, a trench may be formed in the substrate around a periphery outlining the sidewall insulating film, the buried gate electrode and the source/drain contacts, and filled in with the isolation film.

In still another embodiment, on a cross section of the device taken in a gate width direction, the isolation film may be formed only over the upper surface of the substrate. And the device may further include a gate-width-defining trench isolation film, which reaches at least a region under a portion of the buried gate electrode where a gate contact will be formed on the cross section taken in the gate width direction. In such an embodiment, the channel region is sandwiched by the gate-width-defining trench isolation film, thus reducing the variation in electrical characteristics of the device.

In an alternative embodiment, the isolation film may include a gate-width-defining portion, which reaches at least a region under a portion of the buried gate electrode where a gate contact will be formed on a cross section taken in a gate width direction. And at least the lower surface of that portion of the buried gate electrode, where the gate contact will be formed, may be in contact with the gate-width-defining portion of the isolation film. Even in such an embodiment, the variation in electrical characteristics of the device can also be reduced.

An inventive method for fabricating a semiconductor device includes the steps of: a) forming at least a gate electrode dummy on a region of a semiconductor substrate where a buried gate electrode will be formed; b) forming a self-aligned sidewall film on side faces of the gate electrode dummy so that the sidewall film is self-aligned with the gate electrode dummy; c) depositing an insulating film over the substrate and removing part of the insulating film at least until the upper surfaces of the gate electrode dummy and the self-aligned sidewall film are exposed, thereby forming a trench isolation film; d) forming a gate hole, which exposes the substrate, by selectively removing the gate electrode dummy; e) forming a gate insulating film on the surface of the substrate, which is exposed inside the gate hole; f) forming the buried gate electrode on the gate insulating film by filling in the gate hole with a conductor; and g) defining source/drain diffused regions self-aligned with the buried gate electrode after the step a) has been performed.

According to the inventive method, the trench isolation film can be self-aligned with the buried gate electrode. Thus, the size of the active region, located between the gate electrode and isolation film, can be reduced in the gate length direction.

In one embodiment of the present invention, a trench is preferably formed in the step c) by etching the substrate to a predetermined depth using the gate electrode dummy and the self-aligned sidewall film as a mask, and then the isolation film is preferably formed by depositing the insulating film thereon. In this manner, the isolation capability of the isolation film can be improved in the resultant device.

In another embodiment, the inventive method may further include the steps of: h) selectively removing the self-aligned sidewall film after the step f) has been performed, thereby forming contact holes, which expose the substrate, beside the buried gate electrode; and i) filling in the contact holes with a contact material, thereby forming source/drain contacts. In this manner, source/drain contacts, self-aligned with the buried gate electrode, can be formed.

In this particular embodiment, the inventive method may further include the step of forming a sidewall insulating film on the side faces of the gate hole or the contact holes between the steps d) and i).

In an alternative embodiment, an insulating film, which will be shaped into the gate insulating film and a sidewall insulating film, may be formed in the step e) over the entire inner surfaces of the gate hole.

In still another embodiment, the inventive method may further include the step of forming a sidewall insulating film on the side faces of the gate electrode dummy between the steps a) and b).

In yet another embodiment, the step g) may be performed between the steps a) and b), and the self-aligned sidewall film may be used as source/drain contacts as it is.

In this particular embodiment, an insulating film, which will be shaped into the gate insulating film and a sidewall insulating film, may be formed in the step e) over the entire inner surfaces of the gate hole. In such an embodiment, there is no need to perform any thermal oxidation process and the process can be carried out at a relatively low temperature. Accordingly, the source/drain contacts can be formed out of a metal film with low resistance.

In yet another embodiment, a dummy upper passivation film may be formed in the step a) on the gate electrode dummy. In the step b), the self-aligned sidewall film may be formed on the side faces of the gate electrode dummy and the dummy upper passivation film. And in the step c), the insulating film and the dummy upper passivation film may be removed until the upper surface of the gate electrode dummy is exposed. In this manner, the self-aligned sidewall film can be formed in a good shape. Accordingly, whether this self-aligned sidewall film is used as the source/drain contacts themselves or as a dummy for the contacts, the reliability of the device improves.

In still another embodiment, the respective upper surfaces faces of the gate electrode dummy, the self-aligned sidewall film and the isolation film may be planarized in the step c) to substantially the same levels by a CMP process.

In yet another embodiment, a metal may be filled as the conductor in the step f). In such an embodiment, the resultant MIS semiconductor device, including a buried gate electrode with low resistance, has increased current drivability.

In yet another embodiment, a high dielectric constant insulating film with a dielectric constant higher than that of $SiO_2$ may be formed in the step e) as the gate insulating film. In such an embodiment, the resultant semiconductor device will have higher current drivability and smaller gate leakage current.

In yet another embodiment, the inventive method may further include the step of forming a gate-width-defining trench isolation film in the substrate before the step a) is performed. In such an embodiment, the variation in electrical characteristics of the device can be suppressed.

In yet another embodiment, the inventive method may further include the steps of: removing both ends of the gate electrode dummy and the self-aligned sidewall film in a gate width direction between the steps b) and c); and etching away at least part of the isolation film, where a gate contact will be formed for the buried gate electrode, to substantially the same level as the upper surface of the substrate after the step d) has been performed. In such an embodiment, the variation in electrical characteristics of the device can also be suppressed.

BRIEF DESCRIPTION OF THE DRAWINGS

FIGS. 1A through 1C illustrate the structure of a semiconductor device according to a first embodiment of the present invention:

FIGS. 1A and 1B are cross-sectional views of the device taken along the lines Ia—Ia and Ib—Ib shown in FIG. IC, while FIG. 1C is a plan view thereof.

FIGS. 2A and 2B are cross-sectional views of the structure taken along the lines IIa—IIa and IIb—IIb shown in FIG. 2C, while FIG. 2C is a plan view thereof.

FIGS. 3A and 3B are cross-sectional views of the structure taken along the lines IIIa—IIIa and IIIb—IIIb shown in FIG. 3C, while FIG. 3C is a plan view thereof.

FIGS. 4A and 4B are cross-sectional views of the structure taken along the lines IVa—IVa and IVb—IVb shown in FIG. 4C, while FIG. 4C is a plan view thereof.

FIGS. 5A and 5B are cross-sectional views of the structure taken along the lines Va—Va and Vb—Vb shown in FIG. 5C, while FIG. 5C is a plan view thereof.

FIGS. 6A and 6B are cross-sectional views of the structure taken along the lines VIa—VIa and VIb—VIb shown in FIG. 6C, while FIG. 6C is a plan view thereof.

FIGS. 7A and 7B are cross-sectional views of the structure taken along the lines VIIa—VIIa and VIIb—VIIb shown in FIG. 7C, while FIG. 7C is a plan view thereof.

FIGS. 8A and 8B are cross-sectional views of the structure taken along the lines VIIIa—VIIIa and VIIIb—VIIIb shown in FIG. 8C, while FIG. 8C is a plan view thereof.

FIGS. 9A and 9B are cross-sectional views of the structure taken along the lines IXa—IXa and IXb—IXb shown in FIG. 9C, while FIG. 9C is a plan view thereof.

FIGS. 10A and 10B are cross-sectional views of the structure taken along the lines Xa—Xa and Xb—Xb shown in FIG. 10C, while FIG. 10C is a plan view thereof.

FIGS. 11A and 11B are cross-sectional views of the structure taken along the lines XIa—XIa and XIb—XIb shown in FIG. 11C, while FIG. 11C is a plan view thereof.

FIGS. 12A and 12B are cross-sectional views of the structure taken along the lines XIIa—XIIa and XIIb—XIIb shown in FIG. 12C, while FIG. 12C is a plan view thereof.

FIGS. 13A and 13B are cross-sectional views of the structure taken along the lines XIIIa—XIIIa and XIIIb—XIIIb shown in FIG. 13C, while FIG. 13C is a plan view thereof.

FIGS. 14A and 14B are cross-sectional views of the device taken along the lines XIVa—XIVa and XIVb—XIVb shown in FIG. 14C, while FIG. 14C is a plan view thereof.

FIGS. 15A and 15B are cross-sectional views of the structure taken along the lines XVa—XVa and XVb—XVb shown in FIG. 15C, while FIG. 15C is a plan view thereof.

FIGS. 16A and 16B are cross-sectional views of the structure taken along the lines XVIa—XVIa and XVIb—XVIb shown in FIG. 16C, while FIG. 16C is a plan view thereof.

FIGS. 17A and 17B are cross-sectional views of the structure taken along the lines XVIIa—XVIIa and XVIIb—XIIb shown in FIG. 17C, while FIG. 17C is a plan view thereof.

FIGS. 18A and 18B are cross-sectional views of the structure taken along the lines XVIIIa—XVIIIa and XVIIIb—XVIIIb shown in FIG. 18C, while FIG. 18C is a plan view thereof.

FIGS. 19A and 19B are cross-sectional views of the structure taken along the lines XIXa—XIXa and XIXb—XIXb shown in FIG. 19C, while FIG. 19C is a plan view thereof.

FIGS. 20A and 20B are cross-sectional views of the structure taken along the lines XXa—XXa and XXb—XXb shown in FIG. 20C, while FIG. 20C is a plan view thereof.

FIGS. 21A and 21B are cross-sectional views of the structure taken along the lines XXIa—XXIa and XXIb—XXIb shown in FIG. 21C, while FIG. 21C is a plan view thereof.

FIGS. 22A and 22B are cross-sectional views of the structure taken along the lines XXIIa—XXIIa and XXIIb—XXIIb shown in FIG. 22C, while FIG. 22C is a plan view thereof.

FIGS. 23A and 23B are cross-sectional views of the structure taken along the lines XXIIIa—XXIIIa and XXIIIb—XXIIIb shown in FIG. 23C, while FIG. 23C is a plan view thereof.

FIGS. 24A and 24B are cross-sectional views of the structure taken along the lines XXIVa—XXIVa and XXIVb—XXIVb shown in FIG. 24c, while FIG. 24C is a plan view thereof.

FIGS. 25A and 25B are cross-sectional views of the device taken along the lines XXVa—XXVa and XXVb—XXVb shown in FIG. 25C, while FIG. 25C is a plan view thereof.

FIGS. 26A and 26B are cross-sectional views of the structure taken along the lines XXVIa—XXVIa and XXVIb—XXVIb shown in FIG. 26C, while FIG. 26C is a plan view thereof.

FIGS. 27A and 27B are cross-sectional views of the structure taken along the lines XXVIIa—XXVIIa and XXVIIb—XXVIIb shown in FIG. 27C, while FIG. 27C is a plan view thereof.

FIGS. 28A and 28B are cross-sectional views of the structure taken along the lines XXVIIIa—XXVIIIa and XXVIIIb—XXIIIb shown in FIG. 28C, while FIG. 28C is a plan view thereof.

FIGS. 29A and 29B are cross-sectional views of the structure taken along the lines XXIXa—XXIXa and XXIXb—XXIXb shown in FIG. 29C, while FIG. 29C is a plan view thereof.

FIGS. 30A and 30B are cross-sectional views of the structure taken along the lines XXXa—XXXa and XXXb—XXXb shown in FIG. 30C, while FIG. 30C is a plan view thereof.

FIGS. 31A and 31B are cross-sectional views of the structure taken along the lines XXXIa—XXXIa and XXXIb—XXXIb shown in FIG. 31C, while FIG. 31C is a plan view thereof.

FIGS. 32A and 32B are cross-sectional views of the structure taken along the lines XXXIIa—XXXIIa and XXXIIb—XXXIIb shown in FIG. 32C, while FIG. 32C is a plan view thereof.

FIGS. 33A and 33B are cross-sectional views of the structure taken along the lines XXXIIIa—XXXIIIa and XXXIIIb—XXXIIIb shown in FIG. 33C, while FIG. 33C is a plan view thereof.

FIGS. 34A and 34B are cross-sectional views of the structure taken along the lines XXXIVa—XXXIVa and XXXIVb—XXXIVb shown in FIG. 34C, while FIG. 34C is a plan view thereof.

FIGS. 35A and 35B are cross-sectional views of the structure taken along the lines XXXVa—XXXVa and XXXVb—XXXVb shown in FIG. 35C, while FIG. 35C is a plan view thereof.

FIGS. 36A and 36B are cross-sectional views of the structure taken along the lines XXXVIa—XXXVIa and XXXVIb—XXXVIb shown in FIG. 36C, while FIG. 36C is a plan view thereof.

FIGS. 37A and 37B are cross-sectional views of the structure taken along the lines XXXVIIa—XXXVIIa and XXXVIIb—XXXVIIb shown in FIG. 37C, while FIG. 37C is a plan view thereof.

DESCRIPTION OF THE PREFERRED EMBODIMENTS

Figure 2A:
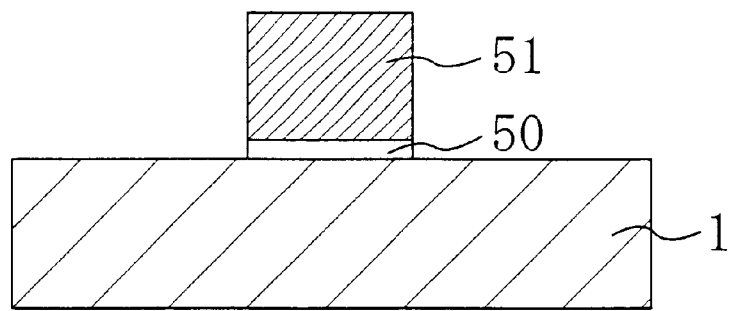
FIGS. 2A through 2C illustrate the step of forming a gate electrode dummy in a semiconductor device fabrication process according to the first embodiment.

Hereinafter, preferred embodiments of the present invention will be described with reference to the accompanying drawings.

Embodiment 1

FIGS. 1A through 1C illustrate the structure of a semiconductor device according to a first embodiment of the present invention. Specifically, FIG. 1A illustrates a cross section of the device taken in the channel direction (i.e., in the gate length direction). FIG. 1B illustrates a cross section of the device vertically to the channel direction (i.e., in the gate width direction). And FIG. 1C is a plan view thereof. FIGS. 1A and 1B are taken along the lines Ia—Ia and Ib—Ib shown in FIG. 1C.

As shown in FIG. 1A, an MIS transistor, i.e., an exemplary semiconductor device of the first embodiment, includes Si substrate 1, gate insulating film 2, buried gate electrode 3, upper insulating film 4, sidewall insulating film 6, LDD regions 5 and heavily doped source/drain regions 12 on the cross section taken in the gate length direction. The gate insulating film 2 is formed out of a silicon dioxide film on the substrate 1. The buried gate electrode 3 is formed on the gate insulating film 2 by filling in a hole over the insulating film 2 with an aluminum alloy. The upper insulating film 4 is stacked on the gate electrode 3 and may be formed out of a plasma silicon dioxide film. The sidewall insulating film 6, formed out of a CVD silicon dioxide film, covers the side faces of the gate electrode 3 and upper insulating film 4. And the LDD and heavily doped source/drain regions 5 and 12 are defined in the substrate 1. In the following description, the buried gate electrode 3 and upper insulating film 4 will be collectively called a "gate electrode section" 14. The transistor further includes a trench isolation film 10 and source/drain contacts 13. The isolation film 10 and source/drain contacts 13 are both self-aligned with the gate electrode 3 (or the gate electrode section 14). The source/drain contacts 13 are made of tungsten, for example, interposed between the sidewall insulating film 6 and isolation film 10 and are located over the heavily doped source/drain regions 12. And the respective upper surfaces of the upper insulating film 4, isolation film 10, sidewall insulating film 6 and source/drain contacts 13 have all been planarized to almost the same levels.

A retrograde well has also been defined in the substrate 1. The bottom of the isolation film 10 is located closely to a deeper region of the retrograde well with a relatively high dopant concentration. That deeper region of the retrograde well functions as a channel stopper region. On the other hand, another region of the retrograde well, which is located under the gate insulating film 2, functions as a channel region. Thus, that region has been doped with a threshold-controlling dopant. In an n-channel MIS transistor, the LDD and heavily doped source/drain regions 5 and 12 are doped with an n-type dopant such as phosphorus or arsenic, while the retrograde well is doped with a p-type dopant such as boron. In a p-channel MIS transistor on the other hand, the LDD and heavily doped source/drain regions 5 and 12 are doped with a p-type dopant such as boron, while the retrograde well is doped with an n-type dopant such as phosphorus or arsenic.

Also, as shown in FIG. 1B, the buried gate electrode 3 in its entirety, including its gate contact region 55, is located over the gate insulating film 2. In other words, the gate electrode 3 is electrically insulated from the substrate 1 with ONLY the gate insulating film 2 interposed therebetween. Thus, according to the first embodiment, the gate width is not defined by the isolation film 10 but by the size of the heavily doped source/drain regions 12, which face each other with the gate electrode 3 interposed therebetween, as measured in the gate width direction.

Furthermore, as shown in FIG. 1C, the gate electrode section 14 is surrounded by the sidewall insulating film 6 and part of the sidewall insulating film 6 is surrounded by the trench isolation film 10. Contact holes were provided between the sidewall insulating film 6, which is located over the heavily doped source/drain regions 12, and the isolation film 10. And these contact holes have been filled in with the source/drain contacts 13. That is to say, on a transversal cross section of the transistor taken across a part of the buried gate electrode 3, a periphery, outlining the gate electrode 3, sidewall insulating film 6 and source/drain contacts 13, is surrounded by the isolation film 10 as shown in FIG. 1C.

Figure 40:
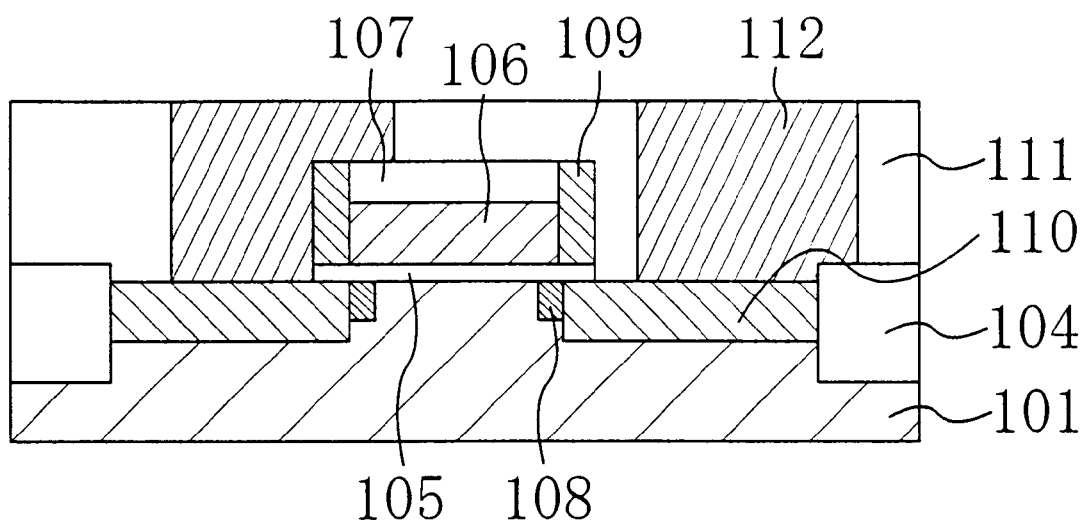
FIG. 40 is a cross-sectional view, taken in the gate length direction, of an MIS semiconductor device including known self-aligned contacts.
Figure 41A:
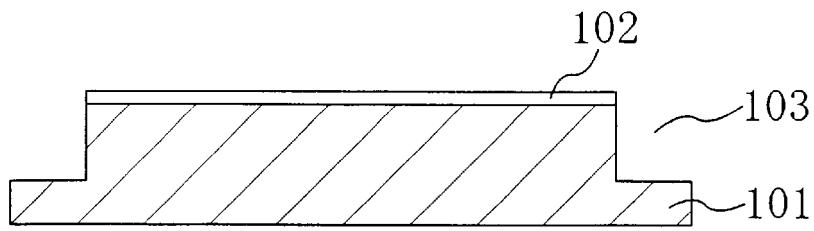
FIGS. 41A through 41E are cross-sectional views, taken in the gate length direction, illustrating respective process steps for fabricating the MIS semiconductor device including the known self-aligned contacts.
Figure 41B:
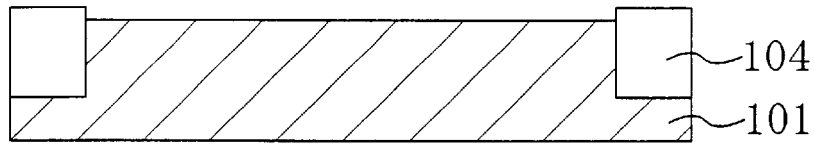
Figure 41C:
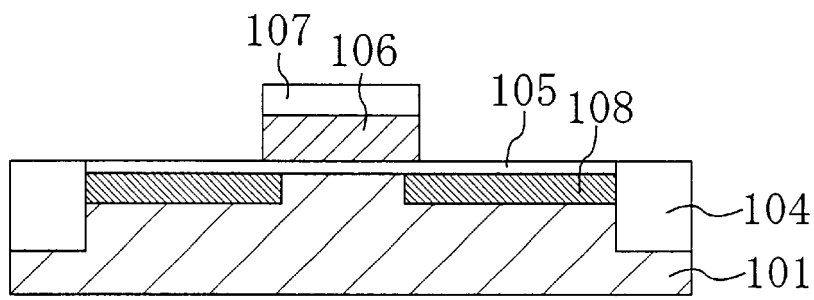
Figure 41D:
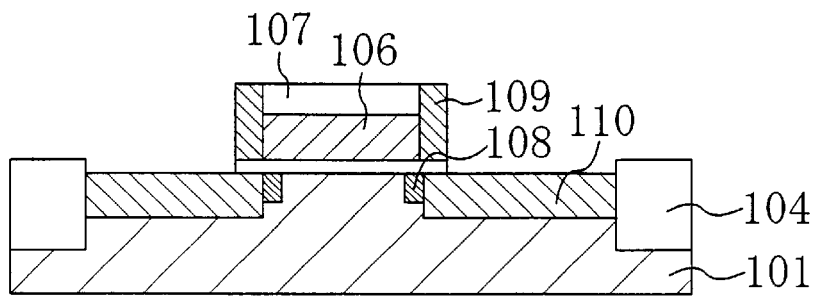
Figure 41E:
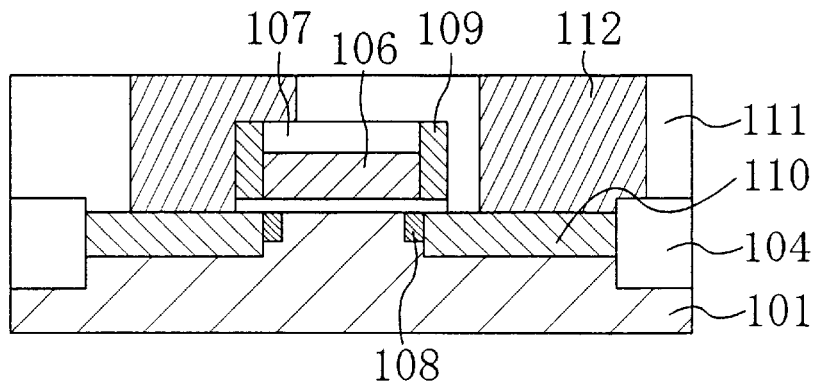

The device structure of the first embodiment is characterized by the following respects. Firstly, not only the sidewall insulating film 6 and source/drain contacts 13 but also the isolation film 10 are self-aligned with the gate electrode section 14 (i.e., the buried gate electrode 3) as well. Secondly, the upper surface of the trench isolation film 10 is higher than that of the gate electrode 3 and the upper part of the isolation film 10 is adjacent to the source/drain contacts 13. In other words, the upper half of the isolation film 10 functions as the interlevel dielectric film 111 in the known device shown in FIG. 40. Thirdly, the buried gate electrode 3 is formed by filling in a hole, which is left after a gate electrode dummy has been removed therefrom, with a conductor film. In addition, not just the sidewall insulating film 6 but the isolation film 10 and source/drain contacts 13 are also formed by a non-exposure technique as will be described later. Thus, the positional relationship between the isolation film 10 or source/drain contacts 13 and the gate electrode section 14 can be defined in a self-aligned manner. Accordingly, as can be seen from the cross section shown in FIG. 1A, the isolation film 10 is equally spaced apart from the gate electrode section 14 on both sides. And the source/drain contacts 13 of an equal horizontal size are formed on the right- and left-hand sides of the gate electrode section 14 with the sidewall insulating film 6 interposed therebetween. In such a structure, the buried gate electrode 3 can be made of a metal, e.g., an aluminum alloy or tungsten film with a low resistance, and the source/drain contacts 13 can be formed by a non-exposure technique. Thus, the size of these contacts 13 can be less than the minimum opening size (or the design rule) as defined for the exposure process. For example, the size of the source/drain contacts 13 as measured in the gate length direction can be arbitrarily defined between 0.01 $\mu$m to 0.1 $\mu$m, which is smaller than the minimum opening size. In addition, there is no need to secure a mask overlay margin in aligning the gate electrode section 14, isolation film 10 and source/drain contacts 13 with each other. Thus, the sizes of the active region and heavily doped source/drain regions 12 as measured in the gate length direction can be less than the minimum opening size.

Next, a method for fabricating the semiconductor device in accordance with the first embodiment of the present invention will be described with reference to FIGS. 2A through 13C. FIGS. 2C, 3C, 4C, 5C, 6C, 7C, 8C, 9C, 10C, 11C, 12C and 13C are plan views of respective structures prepared to complete the device. FIGS. 2A, 3A, 4A, 5A, 6A, 7A, 8A, 9A, 10A, 11A, 12A and 13A illustrate cross sections taken in the gate length direction (i.e., along the lines IIa—IIa, IIIa—IIIa, IVa—IVa, Va—Va, VIa—VIa, VIIa—VIIa, VIIIa—VIIIa, IXa—IXa, Xa—Xa, XIa—XIa, XIIa—XIIa and XIIIa—XIIIa shown in FIGS. 2C, 3C, 4C, 5C, 6C, 7C, 8C, 9C, 10C, 11C, 12C and 13C, respectively). FIGS. 2B, 3B, 4B, 5B, 6B, 7B, 8B, 9B, 10B, 11B, 12B and 13B illustrate cross sections taken in the gate width direction (i.e., along the lines IIb—IIb, IIIb—IIIb, IVb—IVb, Vb—Vb, VIb—VIb, VIIb—VIIb, VIIIb—VIIIb, IXb—IXb, Xb—Xb, XIb—XIb, XIIb—XIIb, and XIIIb—XIIIb shown in FIGS. 2C, 3C, 4C, 5C, 6C, 7C, 8C, 9C, 10C, 11C, 12C and 13C, respectively).

Figure 2B:
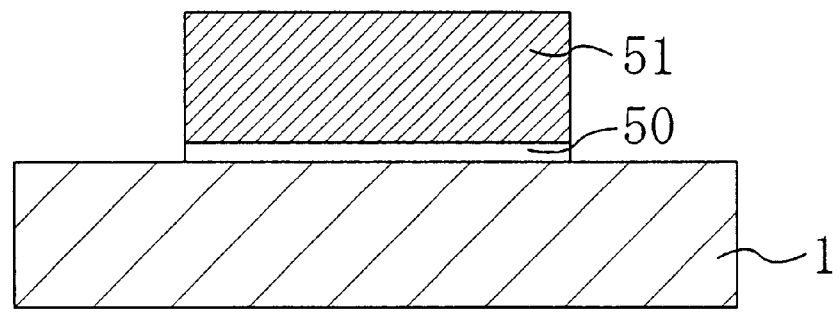
Figure 2C:
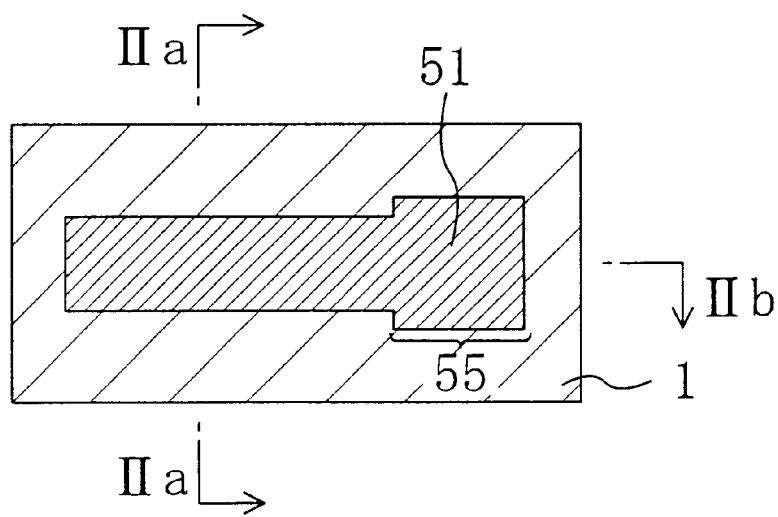

First, in the process step shown in FIGS. 2A through 2C, a retrograde well is formed in an Si substrate 1 by high-energy ion implantation. And the surface of the substrate 1 is thermally oxidized, thereby forming a silicon dioxide film to a thickness of about 5 nm. Thereafter, a PSG film is deposited to a thickness of 300 nm on the silicon dioxide film by a CVD process. Then, a resist pattern (not shown) for gate electrode dummy is defined and these films are dry etched, thereby patterning the PSG and silicon dioxide films. In this manner, the PSG film is shaped into a gate electrode dummy 51 and the silicon dioxide film is shaped into an undercoat insulating film 50. In this case, the size of the gate electrode dummy 51 as measured in the gate length direction should be the sum of a finally required gate length and the total thickness of the right and left-hand side portions of a sidewall insulating film to be formed later. Part of the gate electrode dummy 51 with a relatively large width, where a gate contact will be formed later, is a gate contact region 55. It should be noted that the undercoat insulating film 50 does not have to be patterned into the same shape as the gate electrode dummy 51 at this stage.

Figure 3A:
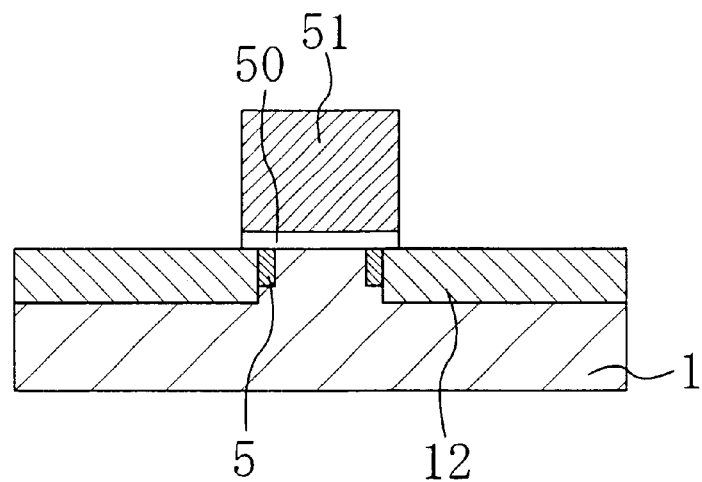
FIGS. 3A through 3C illustrate the step of implanting ions to define LDD and heavily doped source/drain regions in the process of the first embodiment.
Figure 3B:
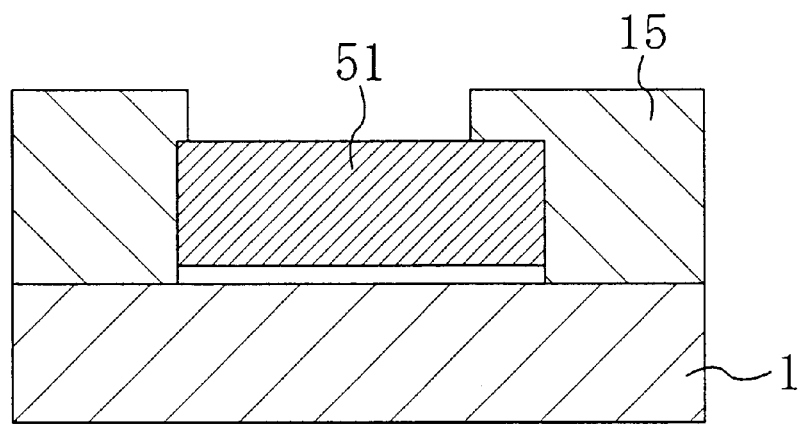
Figure 3C:
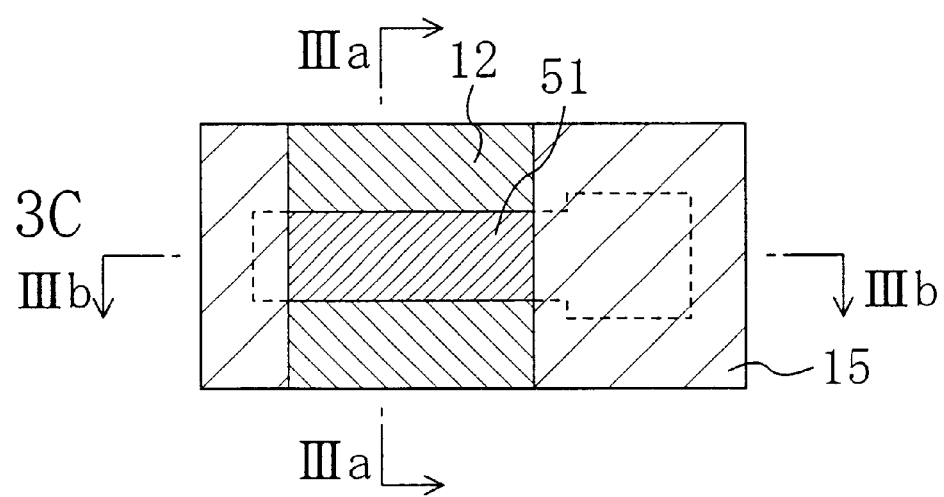

Next, in the process step shown in FIGS. 3A through 3C, dopant ions are lightly implanted into the substrate 1 by large-angle-tilt ion implantation so that an angle between 20 and 45 degrees is formed with a normal to the substrate surface. In this case, a resist film 15, which has an opening at least over the regions where the source and drain will be formed, and the gate electrode dummy 51 are used as a mask. In this manner, lightly doped source/drain regions (which will be herein simply called "LDD regions") 5 are defined in the substrate 1 to be self-aligned with the gate electrode dummy 51. Thereafter, dopant ions are implanted into the substrate 1 heavily and almost vertically to the substrate surface (i.e., so that an angle between 0 and 7 degrees is formed with a normal to the substrate surface). In this manner, heavily doped source/drain regions 12 are defined in the substrate 1 to be self-aligned with the gate electrode dummy 51. It should be noted that a thin passivation film may be formed to a thickness of about 5 nm on the exposed surface of the substrate 1 before the ion implantation is carried out to define the LDD regions 5.

Figure 4A:
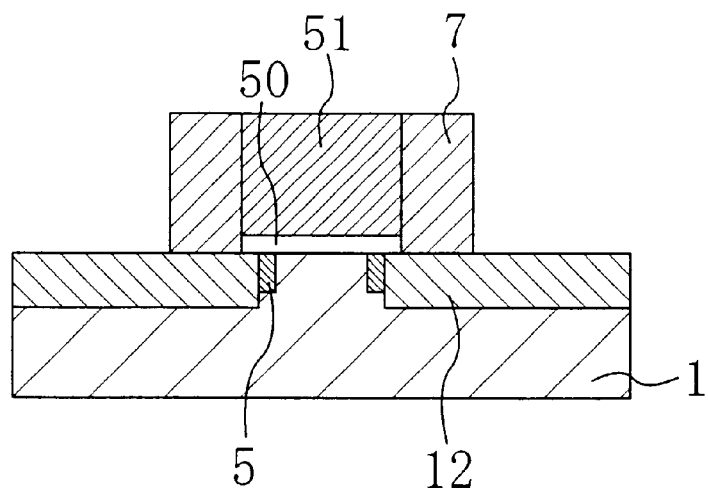
FIGS. 4A through 4C illustrate the step of forming a sidewall dummy in the process of the first embodiment.
Figure 4B:
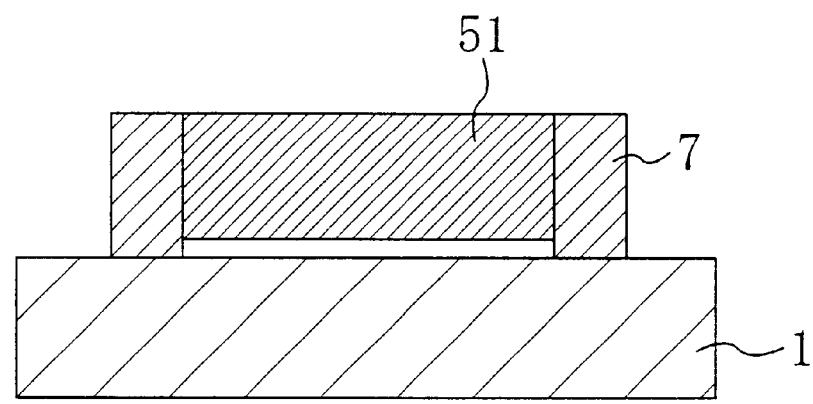
Figure 4C:
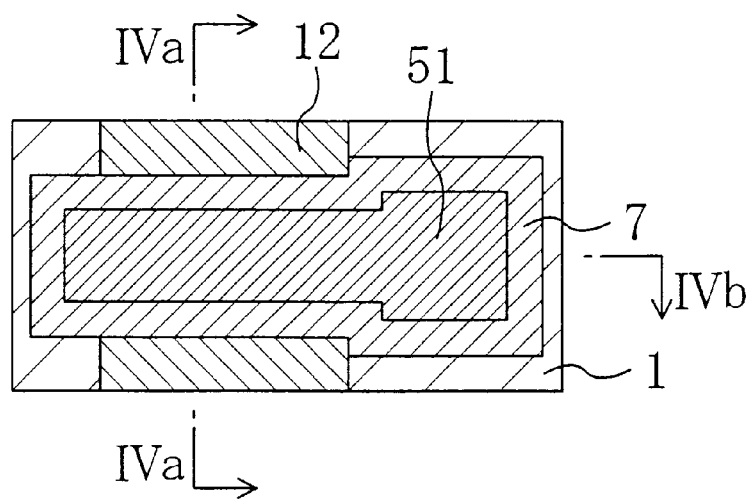

Subsequently, in the process step shown in FIGS. 4A through 4C, after the resist film 15 has been removed, a silicon nitride film is deposited to a thickness of 60 nm over the substrate and then etched back. In this manner, a sidewall dummy 7 is formed on the side faces of the gate electrode dummy 51 so that the film 7 is self-aligned with the gate electrode dummy 51. The final size of the source/drain contacts as measured in the gate length direction will be determined in a self-aligned manner depending on the size of the sidewall dummy 7. Accordingly, by adjusting the thickness of the silicon nitride film deposited to be the sidewall dummy 7, the size of the source/drain contacts is controllable. For example, if the size of the source/drain contacts 13 as measured in the gate length direction should fall within the range from 0.01 $\mu$m to 0.1 $\mu$m, which is smaller than the minimum opening size, the silicon nitride film to be the sidewall dummy 7 should be deposited to a thickness between 10 nm and 100 nm.

Figure 5A:
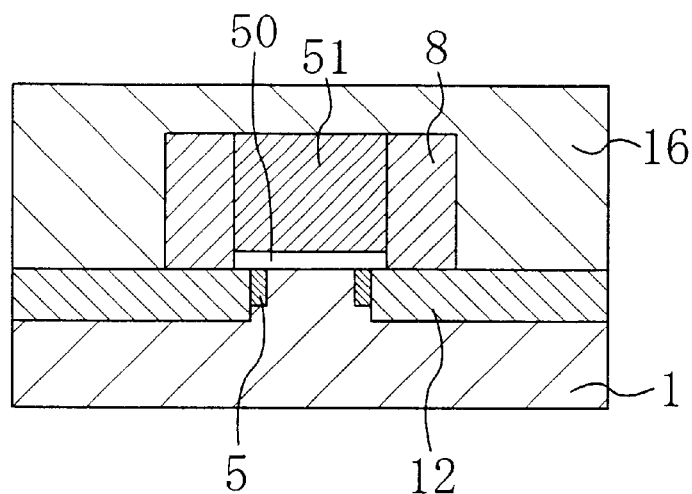
FIGS. 5A through 5C illustrate the step of partially removing the sidewall dummy in the process of the first embodiment.
Figure 5B:
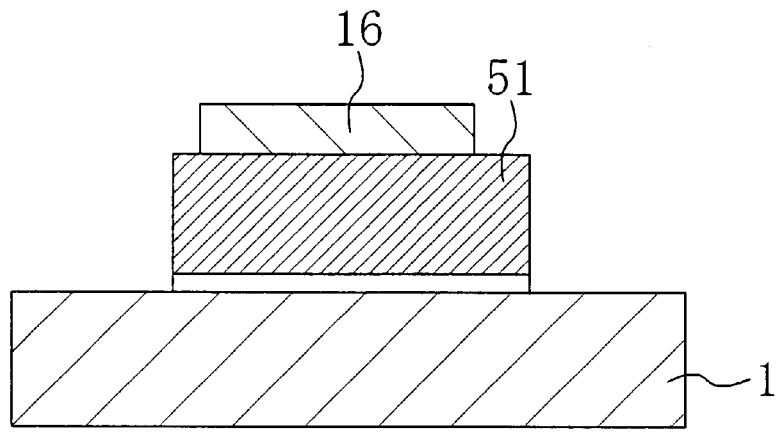
Figure 5C:
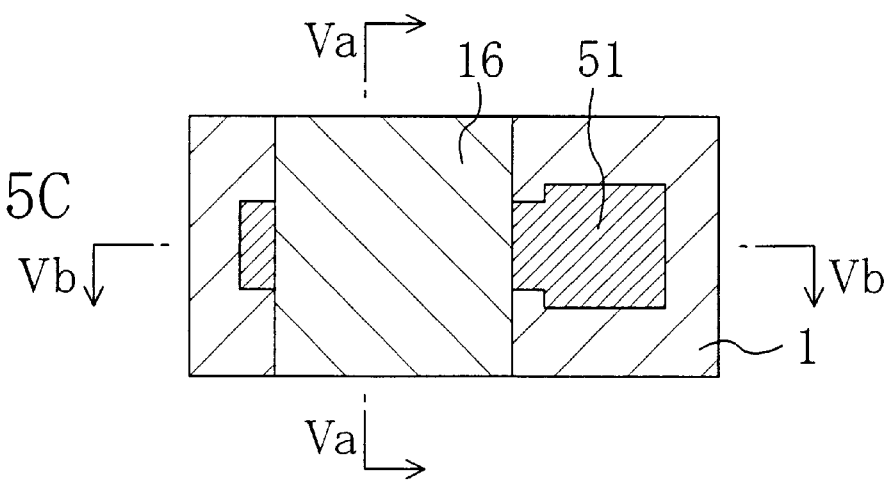

Then, in the process step shown in FIGS. 5A through 5C, a resist film 16 is defined to cover the regions where the source and drain will be formed. And the sidewall dummy 7 is selectively dry etched away using the resist film 16 as a mask so that parts of the sidewall dummy 7 are left only over the regions where the source and drain will be formed. In this manner, contact dummies 8 are formed.

The resist film 16 should cover at least the heavily doped source/drain regions 12 in the gate width direction and at least the gate electrode dummy 51 and sidewall dummy 7 in the gate length direction, respectively.

Figure 6A:
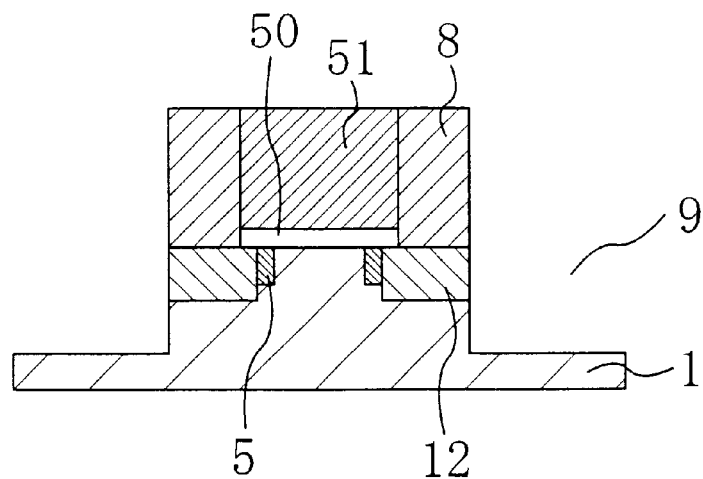
FIGS. 6A through 6C illustrate the step of forming a trench in the process of the first embodiment.
Figure 6B:
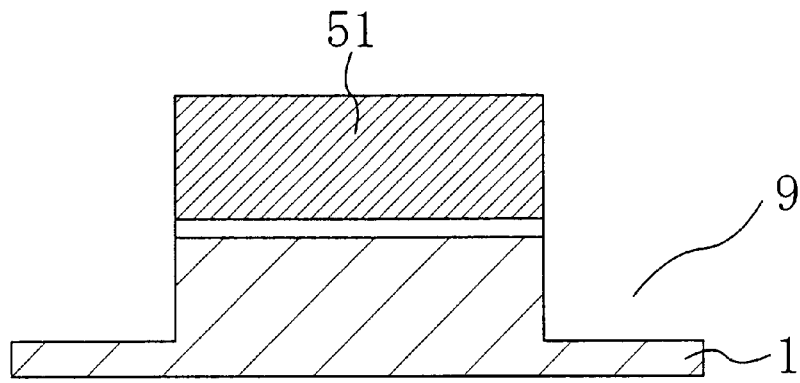
Figure 6C:
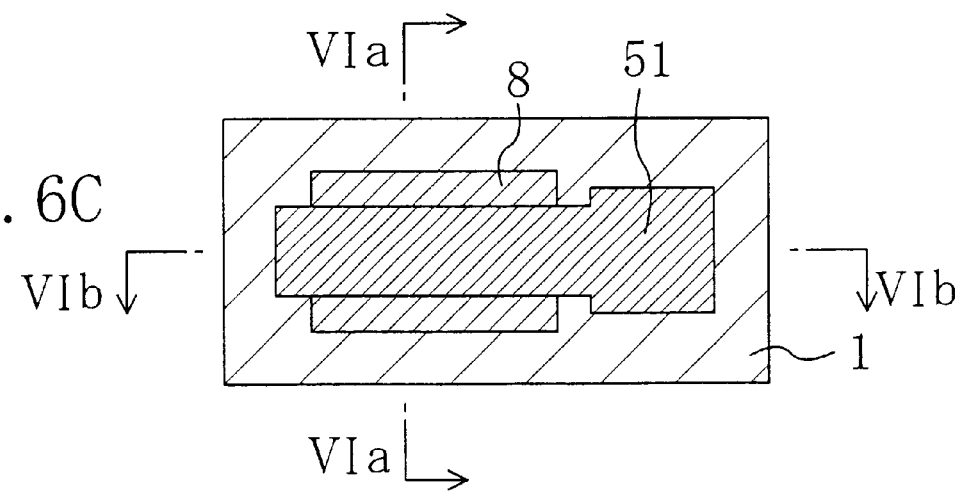

Thereafter, in the process step shown in FIGS. 6A through 6C, the resist film 16 is removed. And the exposed parts of the substrate 1 are selectively etched away vertically using the gate electrode dummy 51 and contact dummies 8 as a mask. In this manner, a trench 9 is formed to a depth of 0.3 µm, which is deeper than the heavily doped source/drain regions 12. The upper parts of the trench 9, adjacent to the contact dummies 8, are self-aligned with the contact dummies 8. And the contact dummies 8 have been self-aligned with the gate electrode dummy 51 as described above. Accordingly, those parts of the trench 9, adjacent to the heavily doped source/drain regions 12, are also self-aligned with the gate electrode dummy 51. The remaining parts of the trench 9 are self-aligned with the gate electrode dummy 51. Thus, the trench 9 can be entirely self-aligned with the gate electrode dummy 51.

Figure 7A:
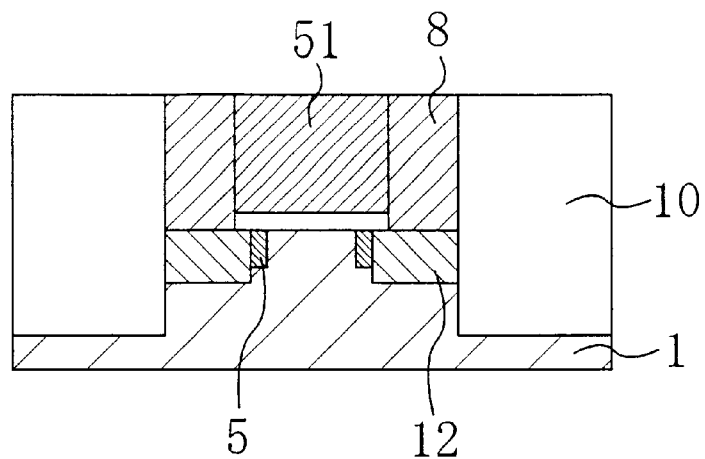
FIGS. 7A through 7C illustrate the step of forming a trench isolation film in the process of the first embodiment.
Figure 7B:
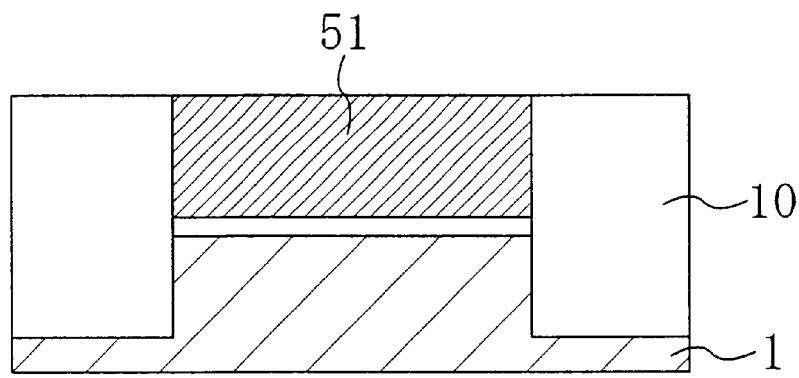
Figure 7C:
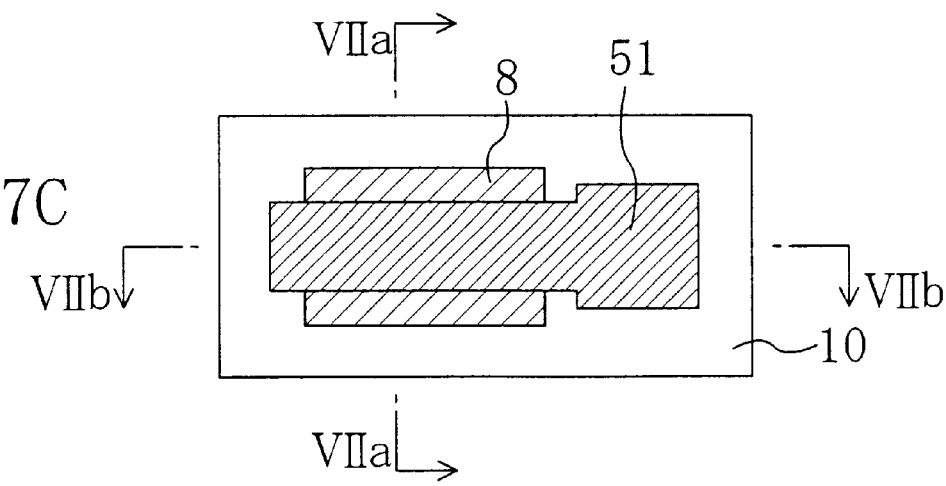

Next, in the process step shown in FIGS. 7A through 7C, a CVD silicon dioxide film is deposited to a thickness of about 1.2 µm over the substrate and then planarized by a CMP process until at least the surfaces of the gate electrode dummy 51 and contact dummies 8 are exposed. In this manner, the trench 9 is filled in with the CVD silicon dioxide film, thereby forming the trench isolation film 10. In this case, the CMP process may be performed until the upper part of the contact dummies 8 is removed to a certain depth. Alternatively, only the CVD silicon dioxide film may have its upper surface planarized by the CMP process first, and then the surfaces of the gate electrode dummy 51 and contact dummies 8 may be exposed by etching back the CVD silicon dioxide film.

As a result of this process step, the gate electrode dummy 51 is surrounded by the trench isolation film 10, which has been formed on the substrate 1, with the contact dummies interposed therebetween in the regions over the heavily doped source/drain regions 12. In the other regions, the gate electrode dummy 51 is directly surrounded by the isolation film 10. In addition, the upper surfaces of the isolation film 10, gate electrode dummy 51 and contact dummies B are planarized to substantially the same levels.

Figure 8A:
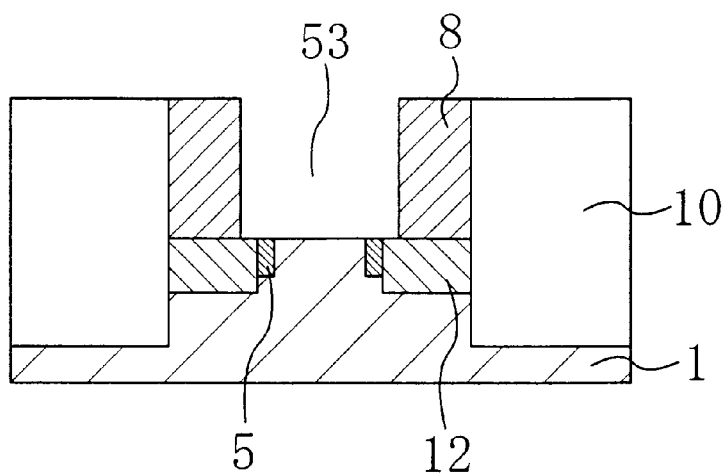
FIGS. 8A through 8C illustrate the step of forming a gate hole in the process of the first embodiment.
Figure 8B:
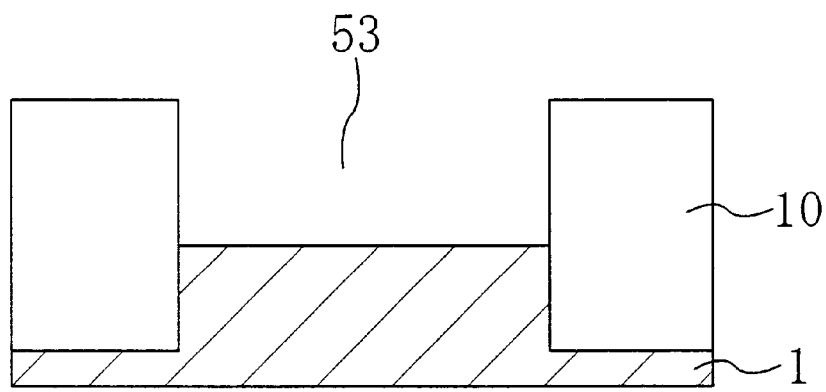
Figure 8C:
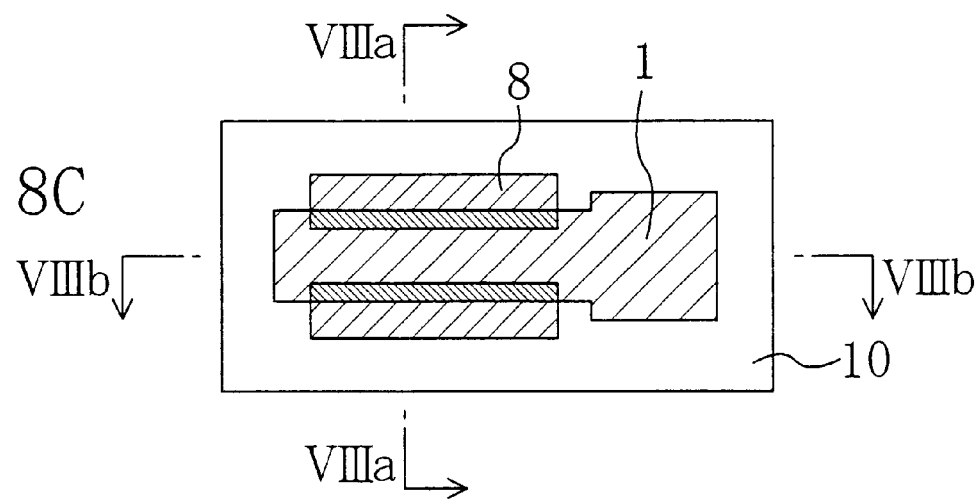

Next, in the process step shown in FIGS. 8A through 8C, the gate electrode dummy 51 is selectively removed with a selective etchant such as hydrofluoric acid, for example. Then, the undercoat insulating film 50, which has been located under the gate electrode dummy 51, is also removed by anisotropic etching. In this manner, a gate hole 53 is formed to be self-aligned with the isolation film 10.

Figure 9A:
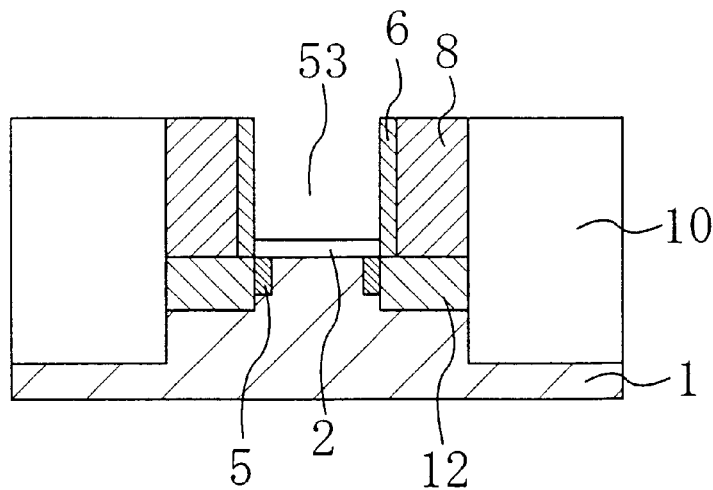
FIGS. 9A through 9C illustrate the step of forming a sidewall insulating film and a gate insulating film in the process of the first embodiment.
Figure 9B:
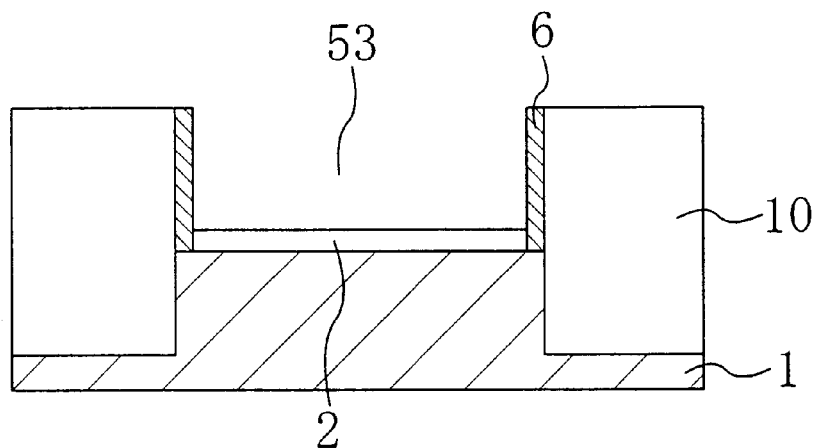
Figure 9C:
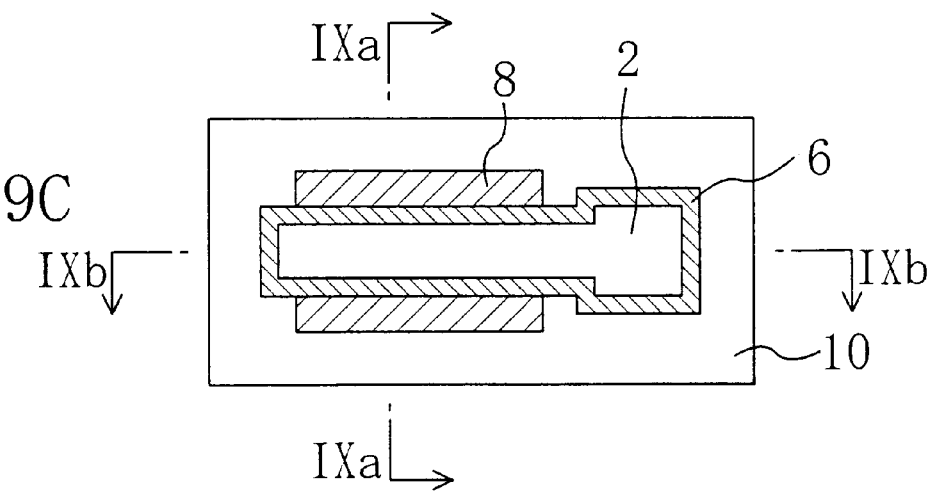

Subsequently, in the process step shown in FIGS. 9A through 9C, a CVD silicon dioxide film is deposited to a thickness of about 20 nm over the substrate and then etched back, thereby forming a sidewall insulating film 6 on the inner side faces of the gate hole 53. Thereafter, the surface of the substrate 1, which is exposed inside the gate hole 53, is thermally oxidized, thereby forming an SiO$_2$ gate insulating film 2 to a thickness of about 5 nm. In this process step, a silicon oxynitride film may be formed as the gate insulating film 2.

Figure 10A:
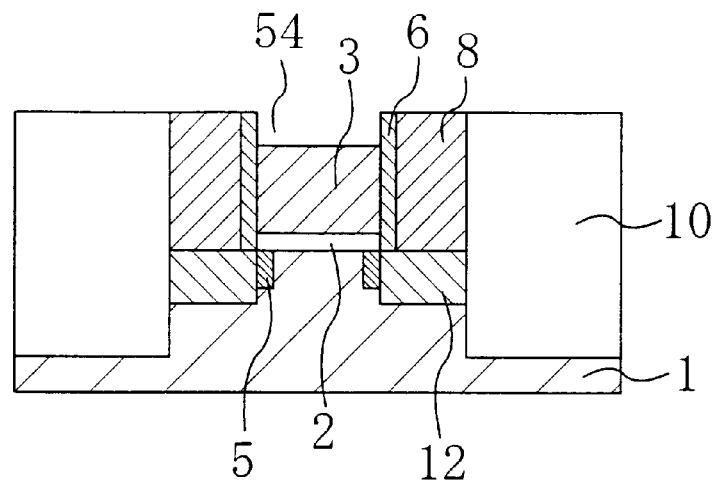
FIGS. 10A through 10C illustrate the step of forming a buried gate electrode in the process of the first embodiment.
Figure 10B:
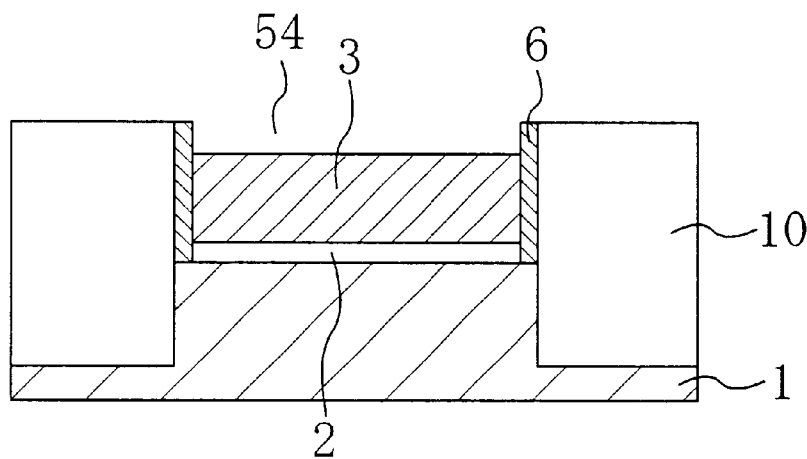
Figure 10C:
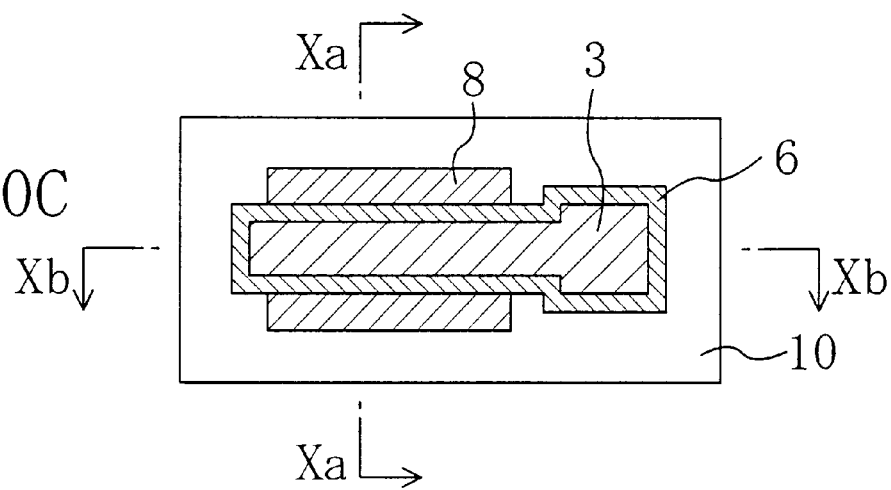

Then, in the process step shown in FIGS. 10A through 10C, an aluminum alloy film is deposited to a thickness of 600 nm over the substrate and then planarized by a CMP process until the surfaces of the isolation film 10 and contact dummies 8 are exposed. Thereafter, the aluminum alloy film, which has been embedded in the gate hole 53, is etched back to a depth of about 100 nm, thereby forming a buried gate electrode 3. In this case, a recess 54 with a depth of about 100 nm is formed over the buried gate electrode 3 and is surrounded by the sidewall insulating film 6. As the conductor film for forming the buried gate electrode 3, a metal film like a tungsten film, a polysilicon film or a polycide film may be used instead of the aluminum alloy film.

Figure 11A:
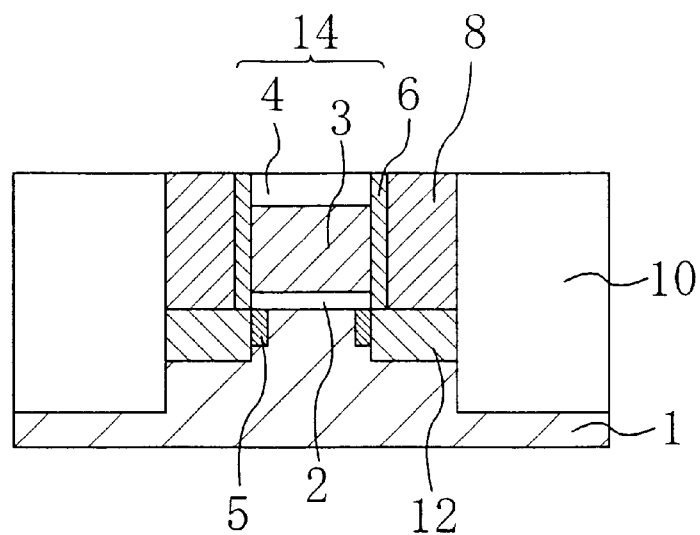
FIGS. 11A through 11C illustrate the step of forming an upper insulating film in the process of the first embodiment.
Figure 11B:
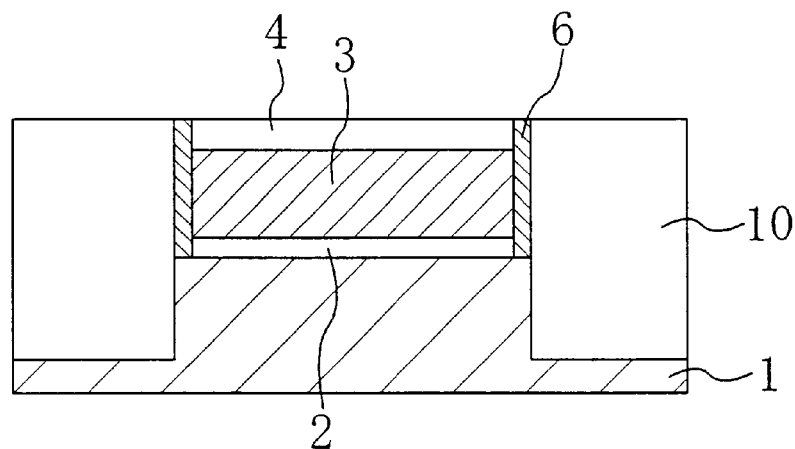
Figure 11C:
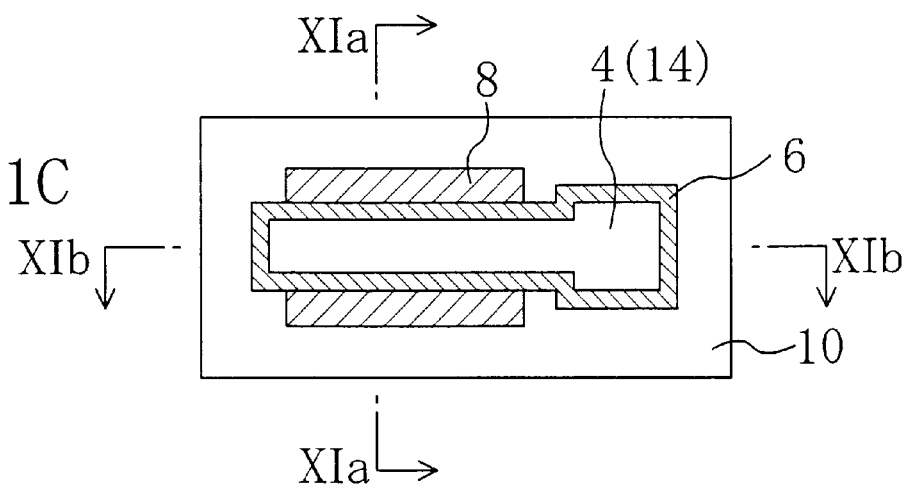

Thereafter, in the process step shown in FIGS. 11A through 11C, a plasma silicon dioxide film is deposited to a thickness of 200 nm over the substrate and then planarized by a CMP process until the surfaces of the isolation film 10 and contact dummies 8 are exposed. In this manner, the recess 54 is filled in with the plasma silicon dioxide film, thereby forming an upper insulating film 4. As a result of this process step, a gate electrode section 14, consisting of the buried gate electrode 3 and upper insulating film 4, is formed.

Figure 12A:
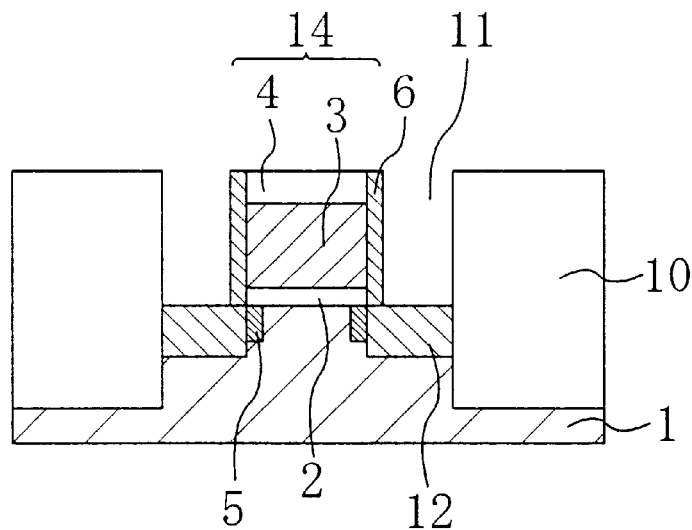
FIGS. 12A through 12C illustrate the step of removing he contact dummies in the process of the first embodiment.
Figure 12B:
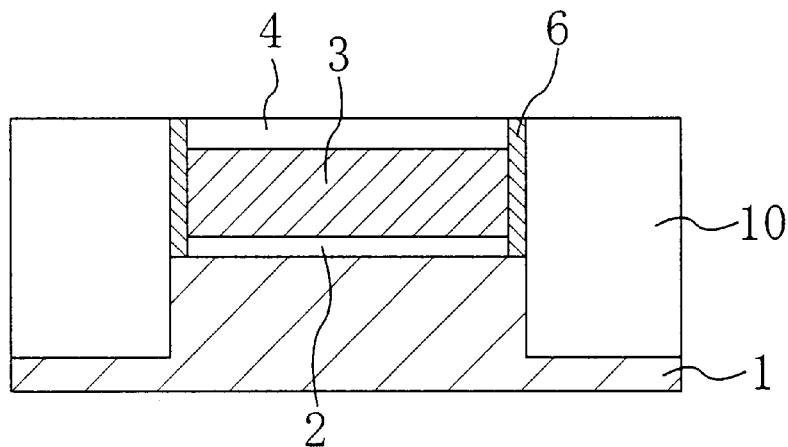
Figure 12C:
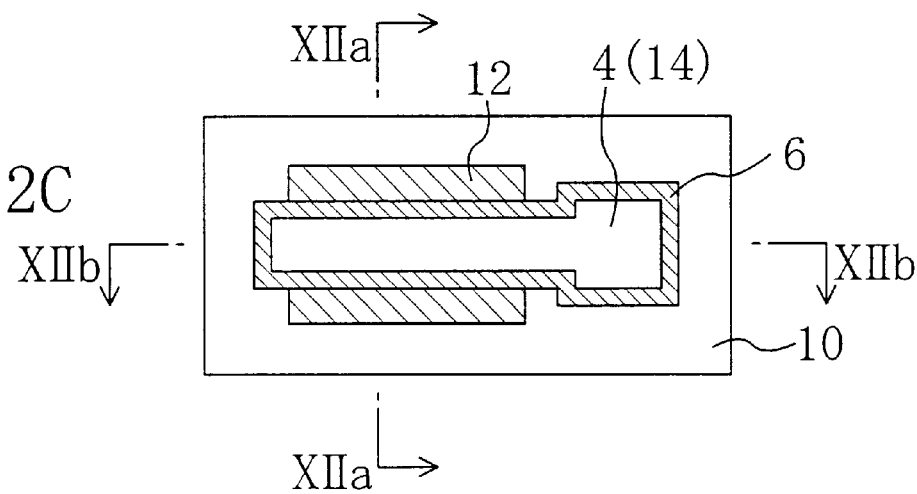

Then, in the process step shown in FIGS. 12A through 12C, the contact dummies 8 are selectively dry etched away. As a result, contact holes 11 are formed to be self-aligned with the isolation film 10 and gate electrode section 14. In this case, the surface of the heavily doped source/drain regions 12 is exposed at the bottom of the contact holes 11.

Figure 13A:
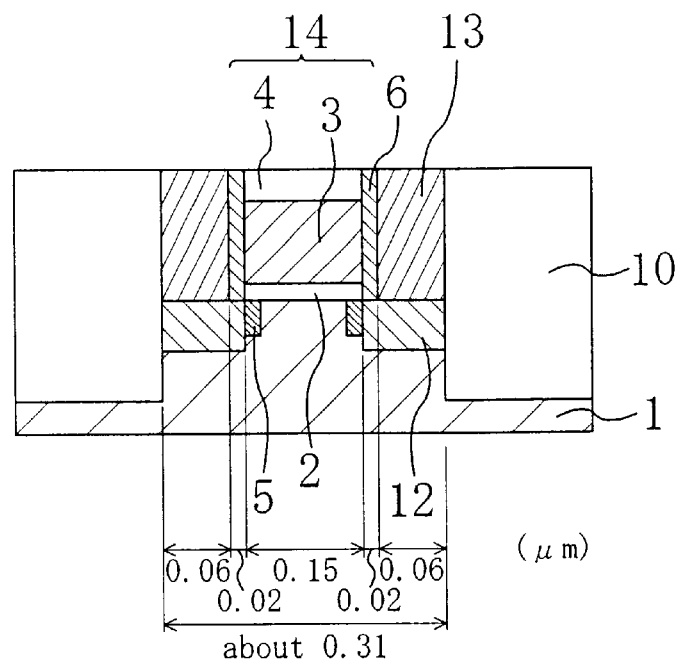
FIGS. 13A through 13C illustrate the step of forming source/drain contacts in the process of the first embodiment.
Figure 13B:
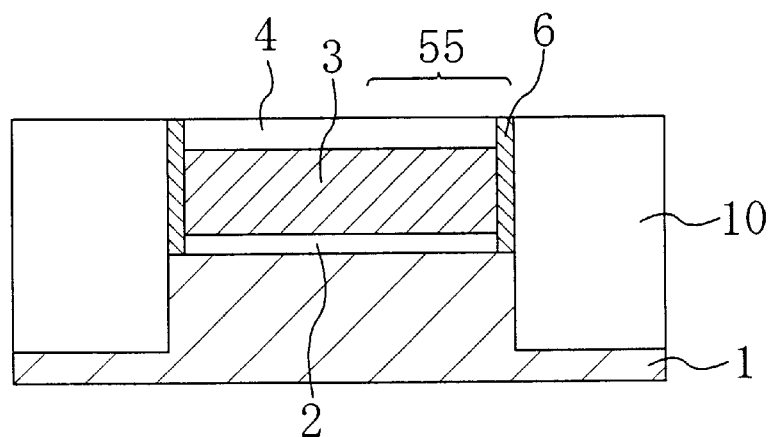
Figure 13C:
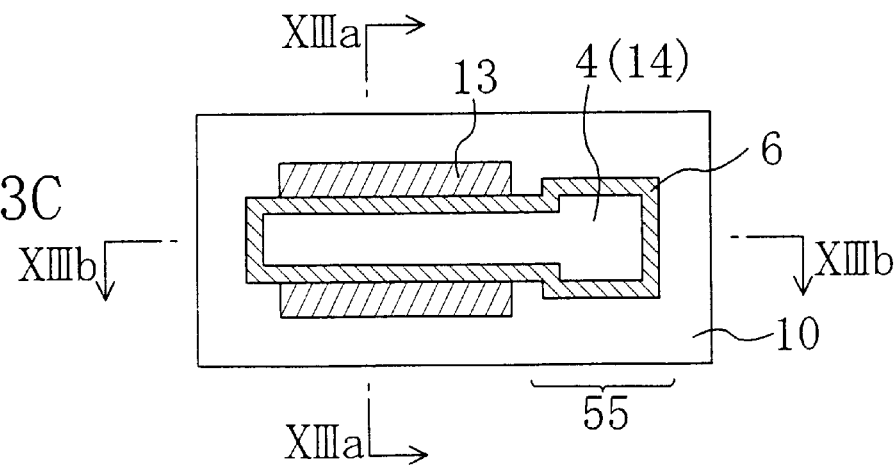

Finally, in the process step shown in FIGS. 13A through 13C, the contact holes 11 are filled in with a conductor such as tungsten, thereby forming source/drain contacts 13. In this case, the source/drain contacts 13 are self-aligned with the gate electrode section 14 and cover the heavily doped source/drain regions 12 almost entirely. Alternatively, the source/drain contacts 13 may be formed by filling in the contact holes with a stack of a barrier metal film of Ti/TiN and a metal film of tungsten, aluminum alloy or copper, for example.

In the fabrication process of this embodiment, the LDD and heavily doped source/drain regions 5 and 12 are defined beside the gate electrode dummy 51 and self-aligned with the gate electrode dummy 51 in the process step shown in FIGS. 3A through 3C. Then, the sidewall dummy 7 is formed around, and self-aligned with, the gate electrode dummy 51 in the process step shown in FIGS. 4A through 4C. Thereafter, in the process steps shown in FIGS. 6A through 7C, the trench 9 and isolation film 10 are formed and self-aligned with the contact dummies 8, i.e., parts of the sidewall dummy 7, and with the gate electrode dummy 51. Subsequently, in the process steps shown in FIGS. 9A through 11C, the sidewall insulating film 6, gate insulating film 2 and gate electrode section 14 consisting of the buried gate electrode 3 and upper insulating film 4 are formed to be self-aligned with the isolation film 10. Then, in the process steps shown in FIGS. 12A through 13C, the contact holes 11 and the source/drain contacts 13, which are formed by filling in the holes 11, are defined to be self-aligned with the gate electrode section 14. That is to say, the LDD regions 5, heavily doped source/drain regions 12, sidewall insulating film 6, isolation film 10 and source/drain contacts 13 can all be self-aligned with the gate electrode section 14 (i.e., the buried gate electrode 3).

Accordingly, the source/drain contacts 13 and heavily doped source/drain regions 12 can be formed to less than the minimum opening size without being limited by the mask overlay accuracy or minimum opening size. Thus, the size of the active region as measured in the gate length direction can be reduced considerably. When the exemplified fabrication conditions are adopted, the sizes of respective parts of the semiconductor device as measured in the gate length direction will be as shown in FIG. 13A. The gate length of the buried gate electrode 3 is 0.15 µm. The size of the sidewall insulating film 6 is 0.04 µm in total (i.e., 0.02 µm each side). And the size of the source/drain contacts 13 is 0.12 µm in total (i.e., 0.06 µm each side). Add all of these sizes together, and the size of the entire active region, interposed between opposite portions of the isolation film 10, is about 0.31 μm as measured in the gate length direction. The size of the active region, except its part under the buried gate electrode 3 with the length of 0.15 μm, is about 0.16 μm in total as measured in the gate length direction.

The semiconductor device of this embodiment has these sizes. Thus, the device of this embodiment has the following advantages over the prior art device.

Figure 42A:
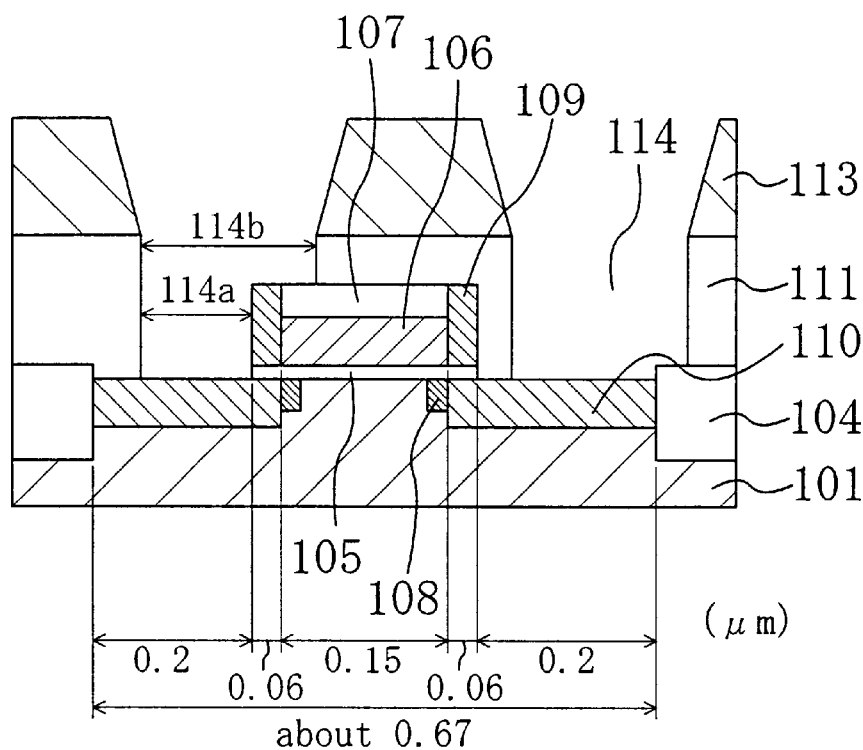
FIG. 42A is a cross-sectional view, taken in the gate length direction, illustrating the sizes of respective parts of the known MIS semiconductor device.
Figure 42B:
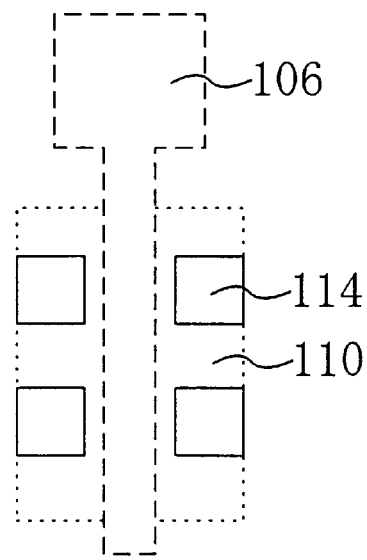
FIG. 42B is a plan view thereof.

First, the size of the entire active region in the inventive device will be compared to that of the prior art device. As shown in FIG. 42A, the size of the entire active region in the gate length direction measures about 0.67 μm in the prior art device. In contrast, the size of the entire active region as measured in the gate length direction can be approximately halved, i.e., about 0.31 μm, in the inventive device.

In the prior art device, even if the design rule for a buried gate electrode, for example, has been reduced, the mask overlay margin does not decrease proportionally to the reduction. Since it is expected that the design rule will be continuously reduced from now on, the mask overlay margin will constitute an increasingly great obstacle to downsizing of semiconductor devices. In the inventive device, however, the size of the overall active region in the gate length direction can be only about twice larger than the gate length. Thus, the inventive device can be downsized almost in proportion to the reduction in gate length.

Also, in the prior art device shown in FIG. 42A, the size of the active region, except its part under the gate electrode 106, measures about 0.52 μm in the gate length direction. In contrast, the size of that region in the gate length direction can be approximately one-third, i.e., about 0.16 μm, in the inventive device. Thus, according to the present invention, the junction capacitance can be reduced and therefore the MIS transistor can operate at much higher speeds.

In this embodiment, if the gate electrode dummy 51 is formed in the process step shown in FIGS. 2A through 2C to have its gate length size defined at the minimize opening size, then the effective gate length of the gate electrode 3 can be reduced by the thickness of the sidewall insulating film 6. And if the CVD silicon dioxide film, which will be the sidewall insulating film 6, is deposited to be relatively thick, then a buried gate electrode 3 with a gate length smaller than the minimize opening size can be formed with good controllability.

Embodiment 2

Figure 14A:
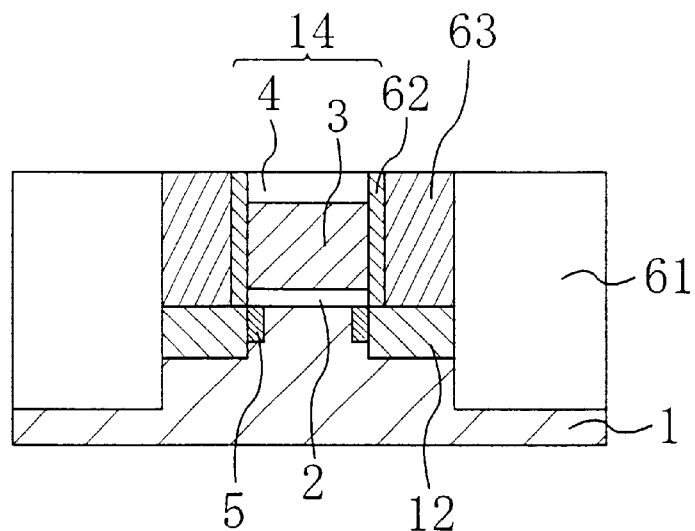
FIGS. 14A through 14C illustrate the structure of a semiconductor device according to a second embodiment of the present invention.
Figure 14B:
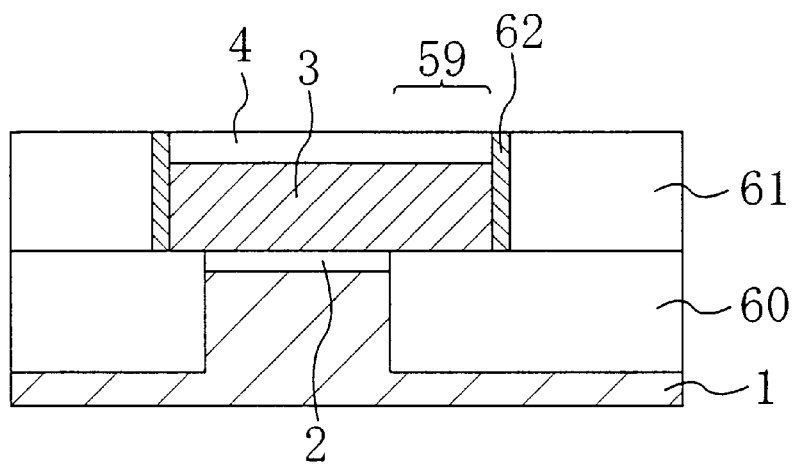
Figure 14C:
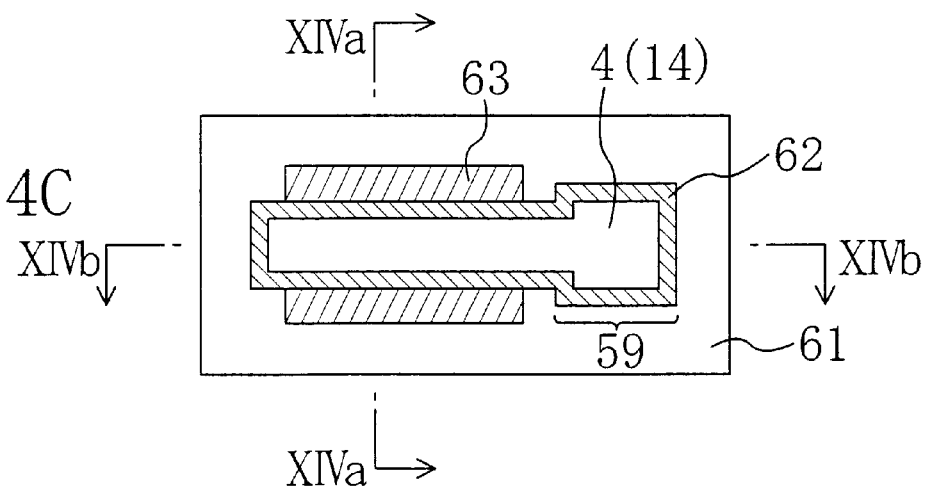

FIGS. 14A through 14C illustrate the structure of a semiconductor device according to a second embodiment of the present invention. Specifically, FIG. 14A illustrates a cross section of the device taken in the channel direction (i.e., in the gate length direction). FIG. 14B illustrates a cross section of the device vertically to the channel direction (i.e., in the gate width direction). And FIG. 14C is a plan view thereof. FIGS. 14A and 14B are taken along the lines XIVa—XVIa and XIVb—XIVb shown in FIG. 14C.

As shown in FIG. 14A, the MIS transistor of the second embodiment has basically the same structure as the counterpart of the first embodiment shown in FIG. 1A when taken in the gate length direction. Specifically, the transistor also includes Si substrate 1, gate insulating film 2, buried gate electrode 3, upper insulating film 4, sidewall insulating film 62, LDD regions 5 and heavily doped source/drain regions 12 on the cross section taken in the gate length direction. The gate insulating film 2 is formed out of a silicon dioxide film on the substrate 1. The buried gate electrode 3 is formed on the gate insulating film 2 by filling in a hole over the insulating film 2 with an aluminum alloy. The upper insulating film 4 is stacked on the gate electrode 3 and formed out of a plasma silicon dioxide film. The sidewall insulating film 62, formed out of a CVD silicon dioxide film, covers the side faces of the gate electrode 3 and upper insulating film 4. And the LDD and heavily doped source/drain regions 5 and 12 are defined in the substrate 1. As in the first embodiment, the buried gate electrode 3 and upper insulating film 4 will be collectively called a gate electrode section 14. The transistor further includes a trench isolation film 61 and source/drain contacts 63. The isolation film 61 and source/drain contacts 63 are both self-aligned with the buried gate electrode 3 (or the gate electrode section 14). The source/drain contacts 63, made of tungsten, for example, are interposed between the sidewall insulating film 62 and isolation film 61 and located just over the heavily doped source/drain regions 12. And the respective upper surfaces of the upper insulating film 4, isolation film 61, sidewall insulating film 62 and source/drain contacts 63 have all been planarized to almost the same levels. A retrograde well, functioning as a channel stopper, for example, has also been defined in the substrate 1 as described for the first embodiment.

As shown in FIG. 14B, the device of the second embodiment is different from the device of the first embodiment shown in FIG. 1B in that the former device includes a gate-width-defining trench isolation film 60 for defining the width of the buried gate electrode 3. The depth of the isolation film 60 may be 0.3 μm. Also, in the second embodiment, a gate contact region 59 is defined on the gate-width-defining trench isolation film 60, not on the substrate 1 directly Furthermore, as shown in FIG. 14C, the gate electrode section 14 is surrounded by the sidewall insulating film 62 and part of the sidewall insulating film 62 is surrounded by the trench isolation film 61. Contact holes were provided between the sidewall insulating film 62, which is located over the heavily doped source/drain regions 12, and the isolation film 61. And the contact holes have been filled in with the source/drain contacts 63. That is to say, on a transversal cross section taken across a part of the buried gate electrode 3, a periphery, outlining the gate electrode 3, sidewall insulating film 62 and source/drain contacts 63, is surrounded by the isolation film 61 as shown in FIG. 14C.

The device of the second embodiment has the same features as the counterpart of the first embodiment. Specifically, not only the sidewall insulating film 62 and source/drain contacts 63 but also the isolation film 61 are self-aligned with the gate electrode section 14 as well. The upper surface of the trench isolation film 61 is higher than that of the substrate 1 and the upper part of the isolation film 61 is adjacent to the source/drain contacts 63. In other words, the upper half of the isolation film 61 functions as the interlevel dielectric film 111 in the known device shown in FIG. 40. In addition, the device of the second embodiment is also characterized in that the active region is sandwiched by the isolation film 61 in the gate length direction and by the gate-width-defining trench isolation film 60 in the gate width direction. As a result, the variation in electrical characteristics of the semiconductor device and the junction capacitance thereof can be reduced as will be described later.

Hereinafter, a method for fabricating the semiconductor device in accordance with the second embodiment of the present invention will be described with reference to FIGS. 15A through 24C. FIGS. 15C, 16C, 17C, 18C, 19C, 20C, 21C, 22C, 23C and 24C are plan views of respective structures prepared to complete the device. FIGS. 15A, 16A, 17A, 18A, 19A, 20A, 21A, 22A, 23A and 24A illustrate cross sections taken in the gate length direction (i.e., along the lines XVa—XVa, XVIa—XVIa, XVIIa—XVIIa, XVIIIa-XVIIIa, XIXa—XIXa, XXa—XXa, XXIa—XXIa, XXIIa—XXIIa, XXIIIa—XXIIIa and XXIVa—XXIVa shown in FIGS. 15C, 16C, 17C, 18C, 19C, 20C, 21C, 22C, 23C and 24C, respectively). FIGS. 15B, 16B, 17B, 18B, 19B, 20B, 21B, 22B, 23B and 24B illustrate cross sections taken in the gate width direction (i.e., along the lines XVb—XVb, XVIb—XVIb, XVIIb—XVIIb, XVIIIb—XVIIIb XIXb—XIXb, XXb—XXb, XXIb—XXIb, XXIIb—XXIIb, XXIIIb—XXIIIb and XXIVb—XXIVb shown in FIGS. 15C, 16C, 17C, 18C, 19C, 20C, 21C, 22C, 23C and 24C, respectively).

Figure 15A:
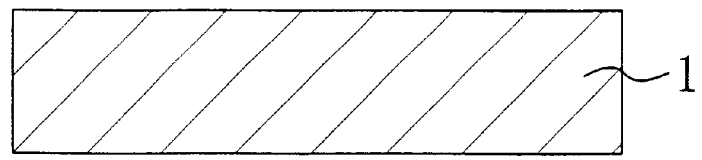
FIGS. 15A through 15C illustrate the step of forming a gate-width-defining trench isolation film in a semiconductor device fabrication process according to the second embodiment.
Figure 15B:
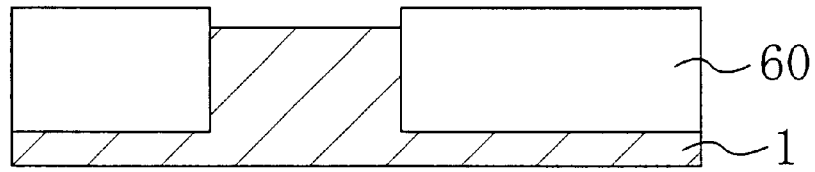
Figure 15C:
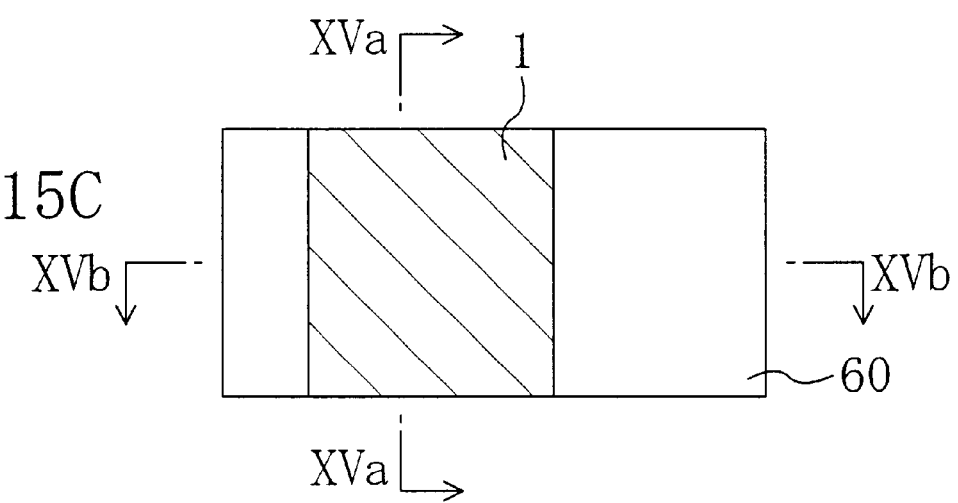

First, in the process step shown in FIGS. 15A through 15C, a retrograde well is formed in an Si substrate 1 by high-energy ion implantation. Then, a gate-width-defining trench isolation film 60 is formed to a depth of 0.3 μm in the substrate 1 to define the size of the active region in the gate width direction.

Figure 16A:
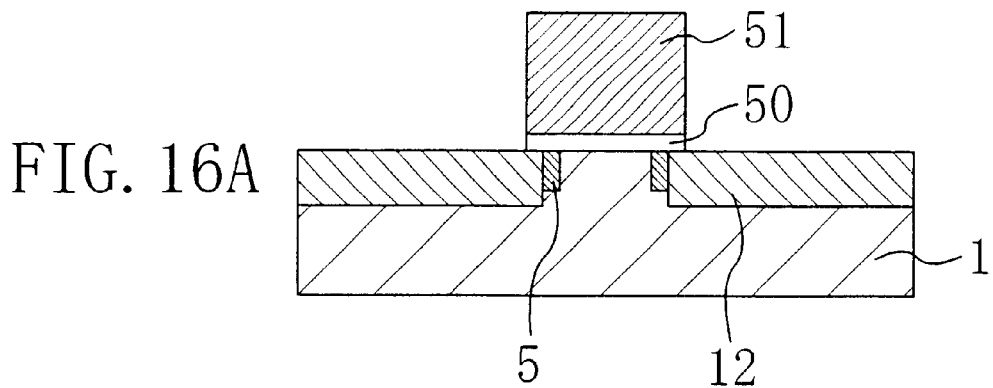
FIGS. 16A through 16C illustrate the step of forming gate electrode dummy and LDD and heavily doped source/drain regions in the process of the second embodiment.
Figure 16B:
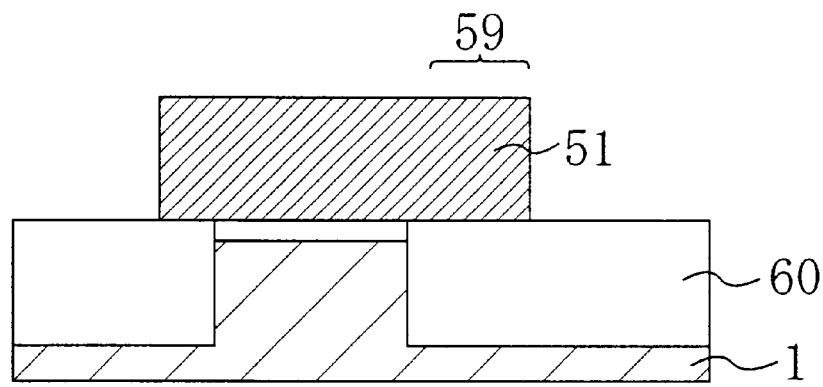
Figure 16C:
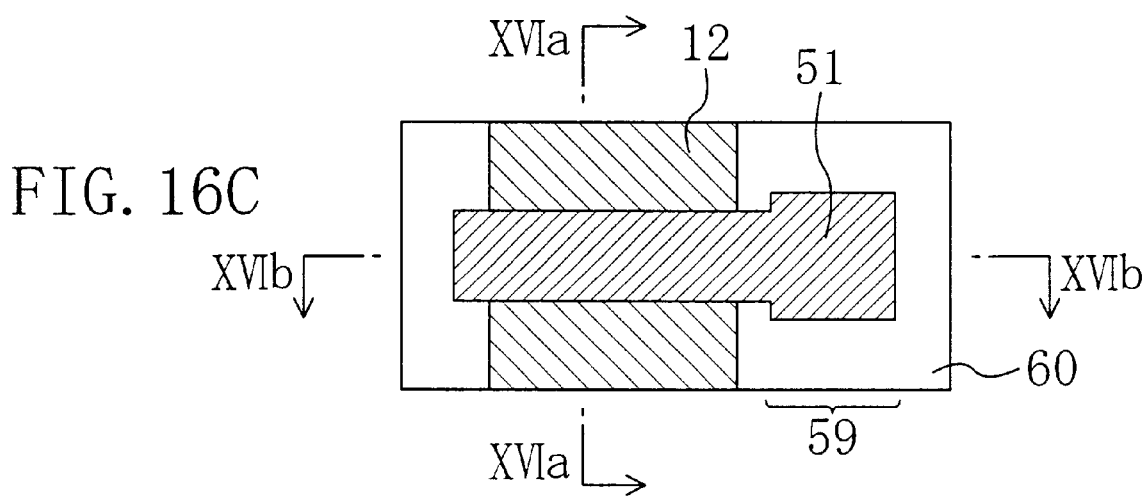

Next, in the process step shown in FIGS. 16A through 16C, the surface of the substrate 1 is thermally oxidized, thereby forming a silicon dioxide film to a thickness of about 5 nm. Thereafter, a PSG film is deposited to a thickness of 300 nm on the silicon dioxide film by a CVD process. Then, a resist pattern (not shown) for a gate electrode dummy is defined and these films are dry etched, thereby patterning the PSG and silicon dioxide films. In this manner, the PSG film is shaped into a gate electrode dummy 51 and the silicon dioxide film is shaped into an undercoat insulating film 50. In this case, the size of the gate electrode dummy 51 as measured in the gate length direction should be the sum of a finally required gate length and the total thickness of the right and left-hand side portions of a sidewall insulating film to be formed later. Part of the gate electrode dummy 51 with a relatively large width is a gate contact region 59 where a contact will be formed between a buried gate electrode and an upper-level interconnection line in a subsequent process step. In the gate width direction, both ends of the gate electrode dummy 51, including the gate contact region 59, are located on the gate-width-defining trench isolation film 60. It should be noted that the undercoat insulating film 50 does not have to be patterned into the same shape as the gate electrode dummy 51 at this stage.

Thereafter, dopant ions are lightly implanted into the substrate 1 by large-angle-tilt ion implantation so that an angle between 20 and 45 degrees is formed with a normal to the substrate surface on a cross section taken in the gate length direction. In this case, the gate-width-defining trench isolation film 60 and gate electrode dummy 51 are used as a mask. In this manner, lightly doped source/drain regions (i.e., LDD regions) 5 are defined in the substrate 1 so as to be self-aligned with the gate electrode dummy 51. Thereafter, dopant ions are implanted into the substrate 1 heavily and almost vertically to the substrate surface (i.e., so that an angle between 0 and 7 degrees is formed with a normal to the substrate surface). In this manner, heavily doped source/drain regions 12 are defined in the substrate 1 so as to be self-aligned with the gate electrode dummy 51. In this case, the gate-width-defining trench isolation film 60 and gate electrode dummy 51 are also used as a mask. It should be noted that a thin passivation film may be formed to a thickness of about 5 nm on the exposed surface of the substrate 1 before the ion implantation is carried out to define the LDD regions 5. In this process step, the LDD and heavily doped source/drain regions 5 and 12 may be formed not only in the regions to be source/drain regions in the end, but also in the regions where the isolation film will be formed in the gate length direction.

Figure 17A:
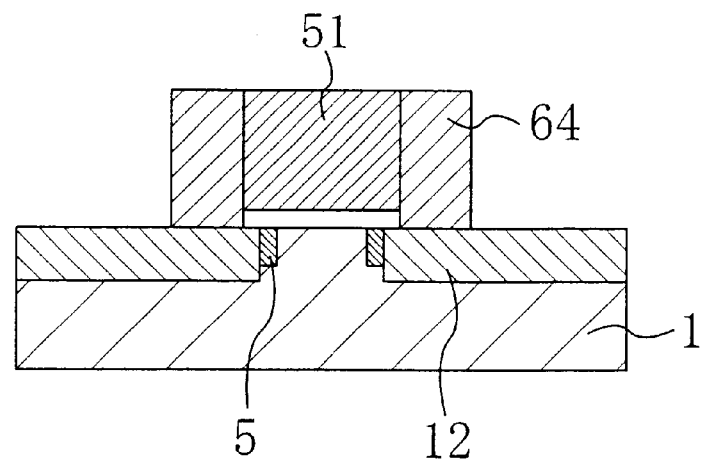
FIGS. 17A through 17C illustrate the step of forming a sidewall dummy in the process of the second embodiment.
Figure 17B:
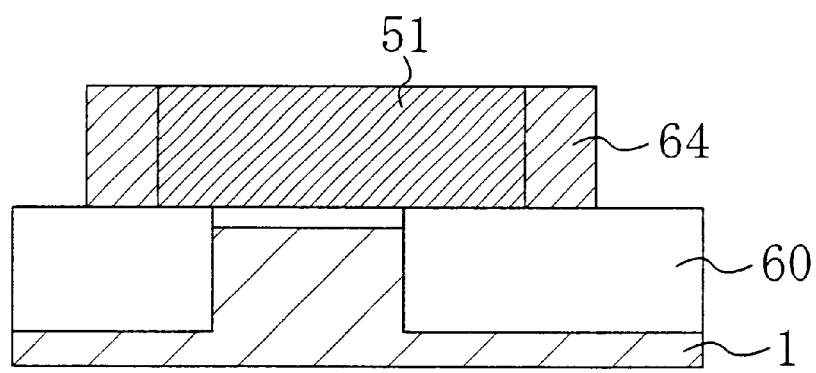
Figure 17C:
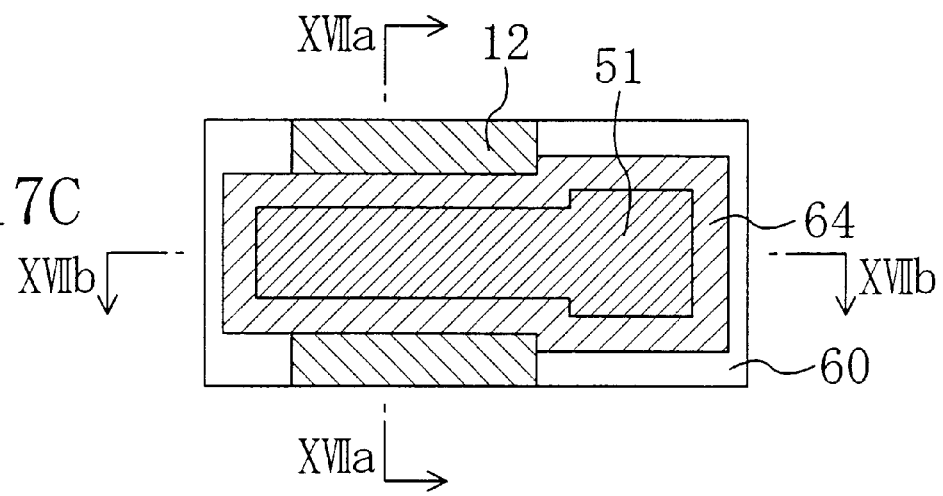

Subsequently, in the process step shown in FIGS. 17A through 17C, a silicon nitride film is deposited to a thickness of 60 nm over the substrate and then etched back, thereby forming a sidewall dummy 64 on the side faces of the gate electrode dummy 51. The final size of the source/drain contacts as measured in the gate length direction will be determined in a self-aligned manner depending on the size of the sidewall dummy 64. Accordingly, by adjusting the thickness of the silicon nitride film deposited to be the sidewall dummy 64, the size of the source/drain contacts is controllable. For example, if the size of the source/drain contacts as measured in the gate length direction should fall within the range from 0.01 μm to 0.1 μm, which is smaller than the minimum opening size, the silicon nitride film to be the sidewall dummy 64 should be deposited to a thickness between 10 nm and 100 nm.

Figure 18A:
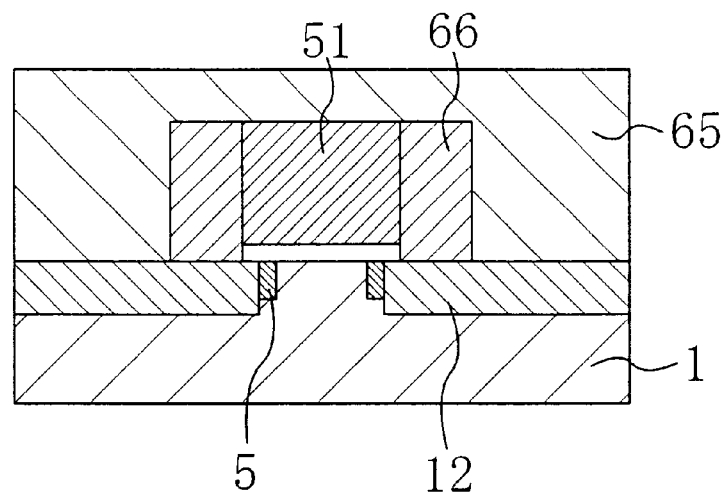
FIGS. 18A through 18C illustrate the step of forming contact dummies in the process of the second embodiment.
Figure 18B:
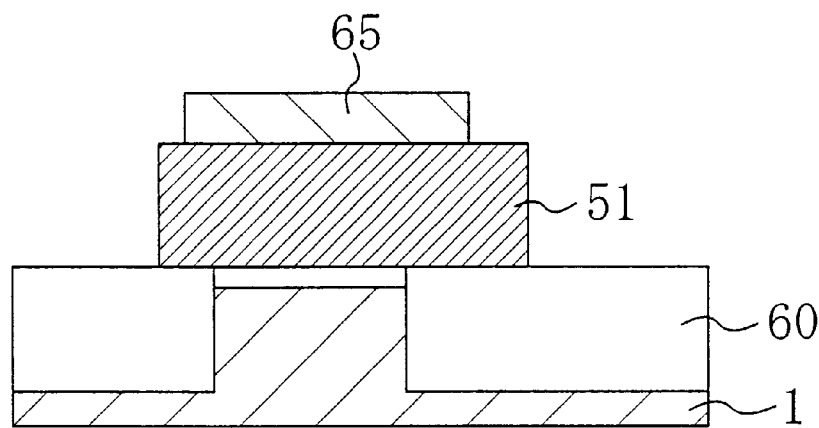
Figure 18C:
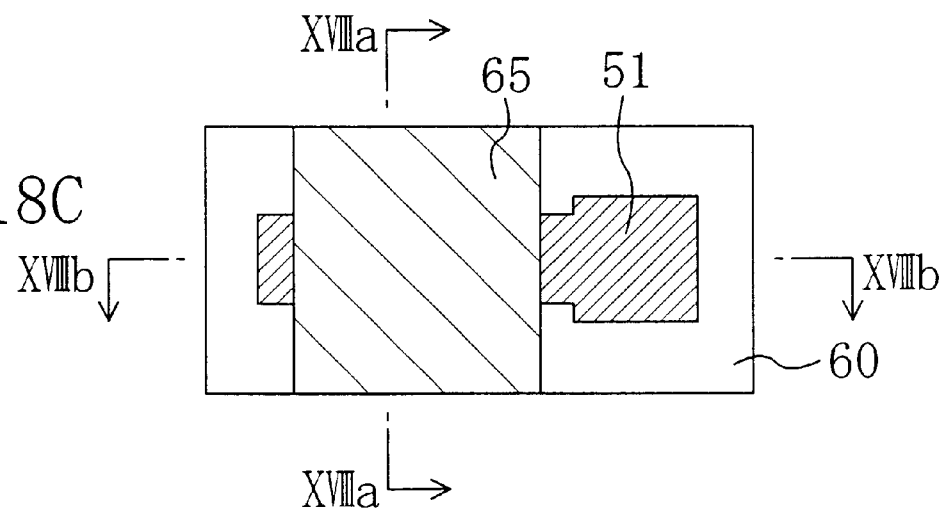

Then, in the process step shown in FIGS. 18A through 18C, a resist film 65 is defined to cover the regions where the source and drain will be formed. Then, the sidewall dummy 64 is selectively etched away using the resist film 65 as a mask so that parts of the sidewall dummy 64 are left only over the regions where the source and drain will be formed. In this manner, contact dummies 66 are formed. The resist film 65 should cover at least the heavily doped source/drain regions 12 in the gate width direction and at least the gate electrode dummy 51 and contact dummies 66 in the gate length direction.

Figure 19A:
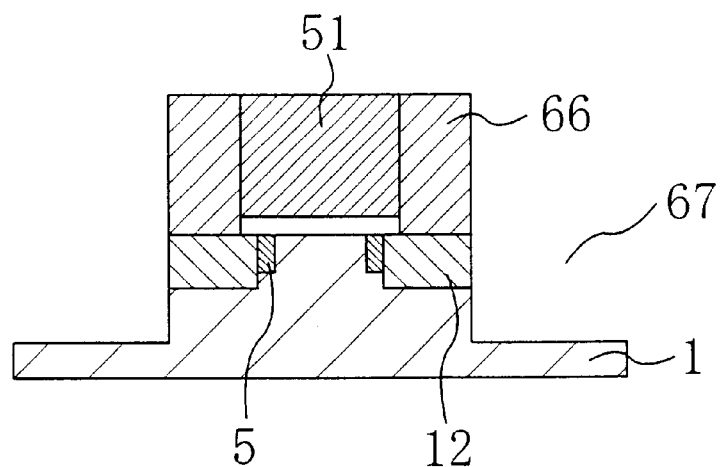
FIGS. 19A through 19C illustrate the step of forming a trench in the process of the second embodiment.
Figure 19B:
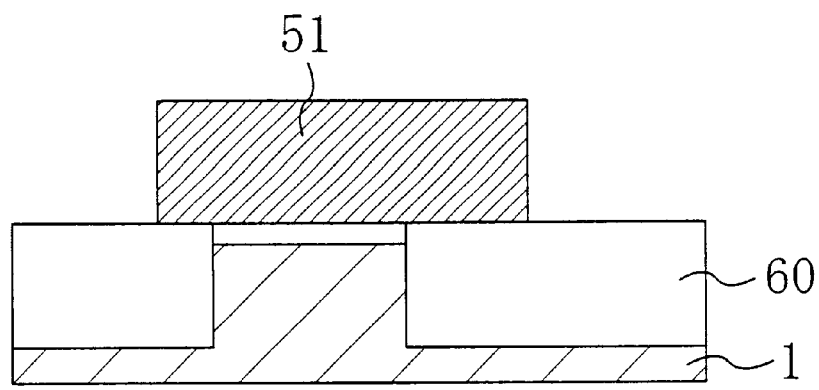
Figure 19C:
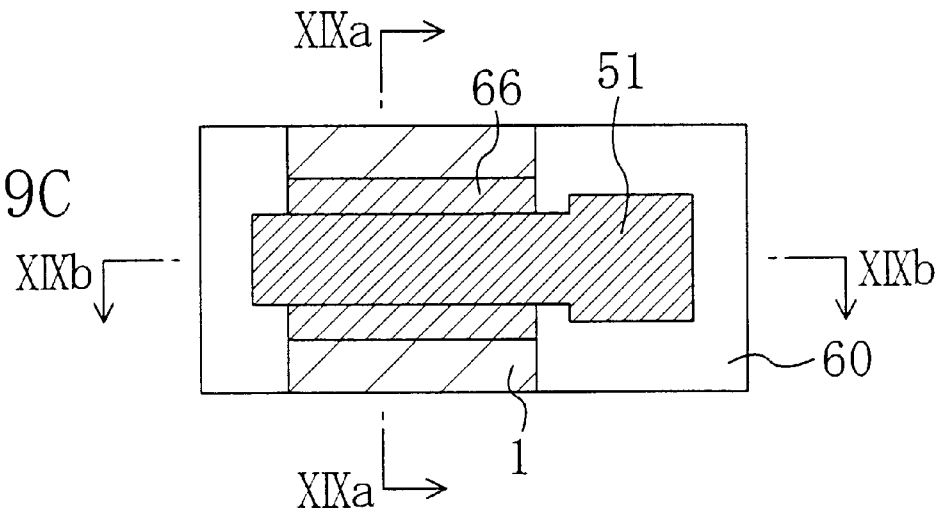

Thereafter, in the process step shown in FIGS. 19A through 19C, the resist film 65 is removed. And the exposed parts of the substrate 1 are selectively etched vertically using the gate electrode dummy 51, gate-width-defining trench isolation film 60 and contact dummies 66 as a mask. In this manner, trenches 67 are formed to a depth of 0.3 μm, which is deeper than the heavily doped source/drain regions 12. These trenches 67 are self-aligned with the contact dummies 66. And the contact dummies 66 have been self-aligned with the gate electrode dummy 51 as described above. Accordingly, the trenches 67 are also self-aligned with the gate electrode dummy 51.

Figure 20A:
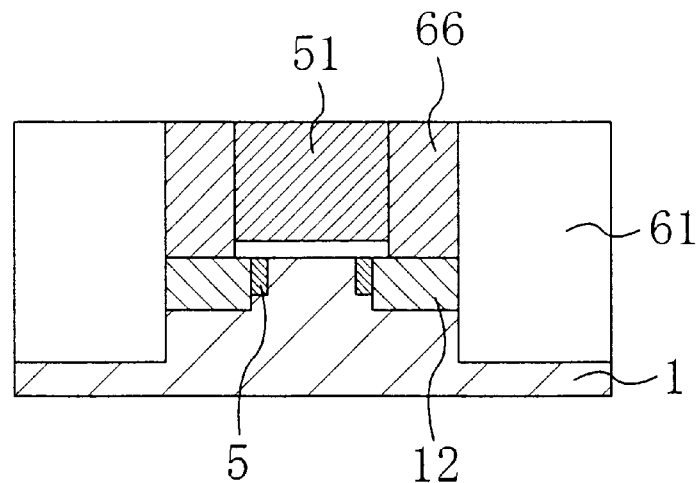
FIGS. 20A through 20C illustrate the step of forming a trench isolation film in the process of the second embodiment.
Figure 20B:
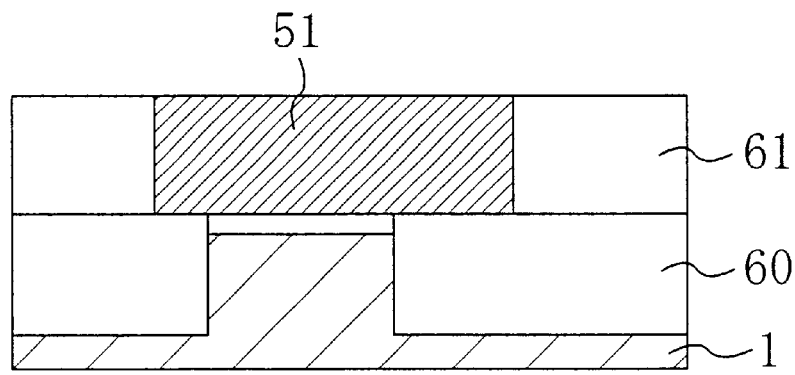
Figure 20C:
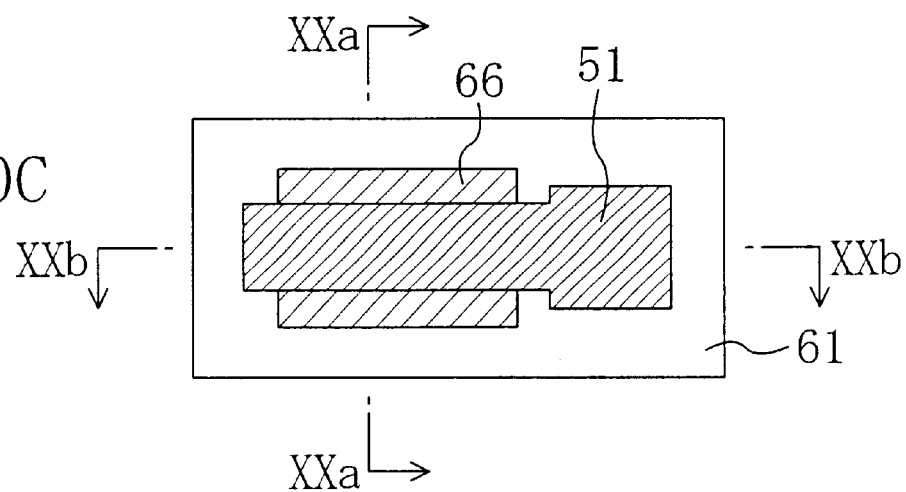

Next, in the process step shown in FIGS. 20A through 20C, a CVD silicon dioxide film is deposited to a thickness of about 1.2 μm over the substrate and then planarized by a CMP process until at least the surfaces of the gate electrode dummy 51 and contact dummies 66 are exposed. In this manner, the trenches 67 are filled in with the CVD silicon dioxide film, thereby forming an isolation film 61. Alternatively, only the CVD silicon dioxide film may have its upper surface planarized by the CMP process first, and then the surfaces of the gate electrode dummy 51 and contact dummies 66 may be exposed by etching back the CVD silicon dioxide film. Also, the upper part of the gate electrode dummy 51 may be removed to a certain depth by the CMP process to make the cross-sectional shape of the contact dummies 66 better.

As a result of this process step, the gate electrode dummy 51 is surrounded by the trench isolation film 61 with the contact dummies 66 interposed therebetween in the regions where the source and drain will be formed. In the other regions, the gate electrode dummy 51 is directly surrounded by the isolation film 61. Also, the active region has already been electrically isolated by the isolation film 61 in the gate length direction. And the size of the active region in the gate length direction is defined. In addition, the upper surfaces of the isolation film 61, gate electrode dummy 51 and contact dummies 66 are planarized to substantially the same levels. Furthermore, the outer ends of the heavily doped source/drain regions 12 in the gate length direction can also be defined definitely by the isolation film 61. As a result, the shapes of the heavily doped source/drain regions 12 are substantially matched to those of the contact dummies 66 in a planar layout.

Figure 21A:
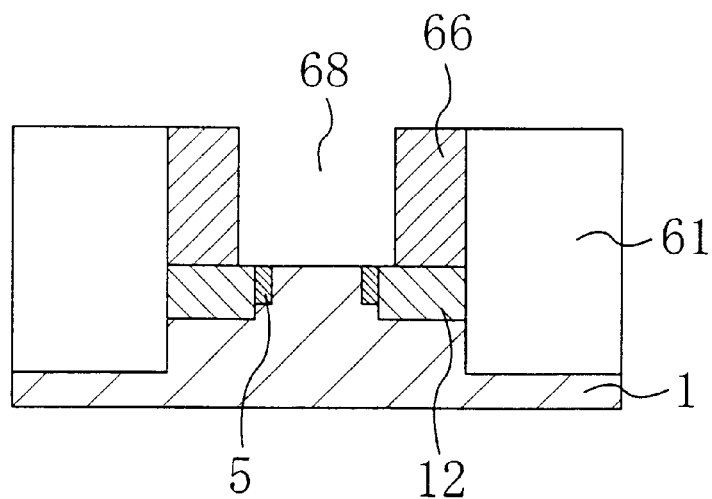
FIGS. 21A through 21C illustrate the step of forming a gate hole in the process of the second embodiment.
Figure 21B:
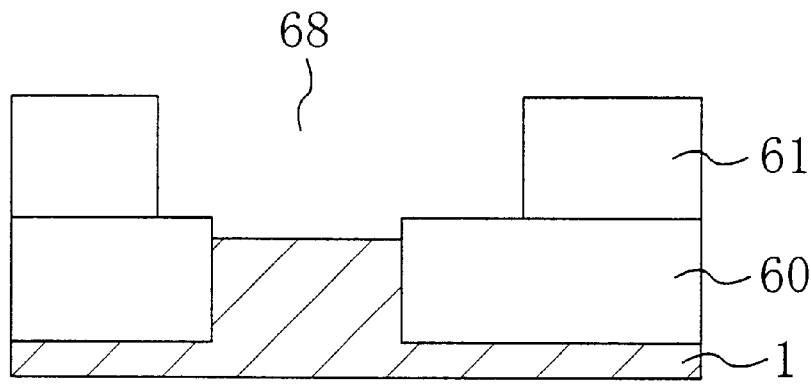
Figure 21C:
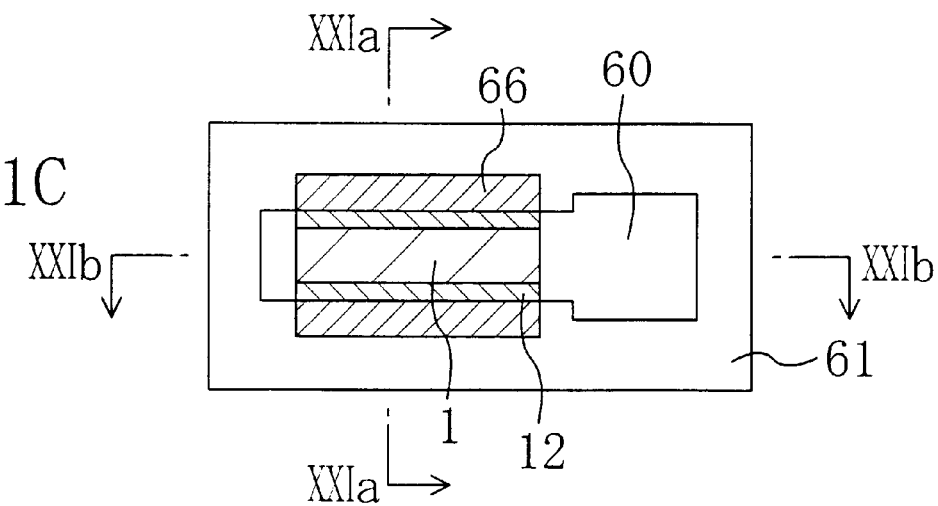

Next, in the process step shown in FIGS. 21A through 21C, the gate electrode dummy 51 is selectively removed with a selective etchant such as hydrofluoric acid, for example. Then, the undercoat insulating film 50, which has been located under the gate electrode dummy 51, is also removed by anisotropic etching. In this manner, a gate hole 68 is formed to be self-aligned with the isolation film 61.

Figure 22A:
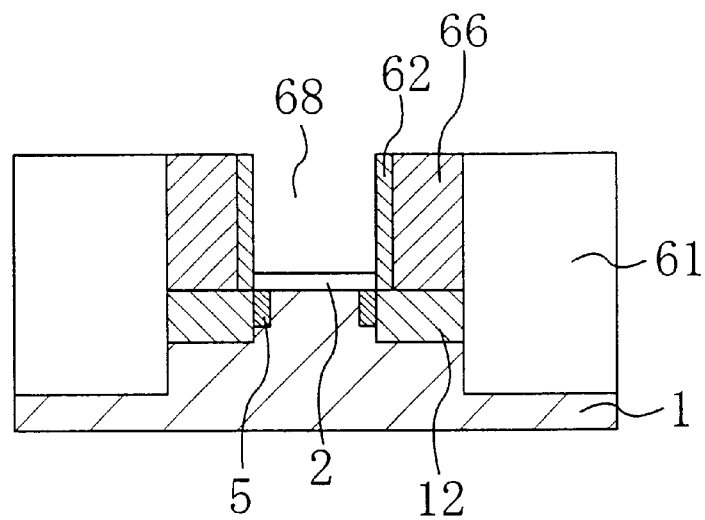
FIGS. 22A through 22C illustrate the step of forming a sidewall insulating film and a gate insulating film in the process of the second embodiment.
Figure 22B:
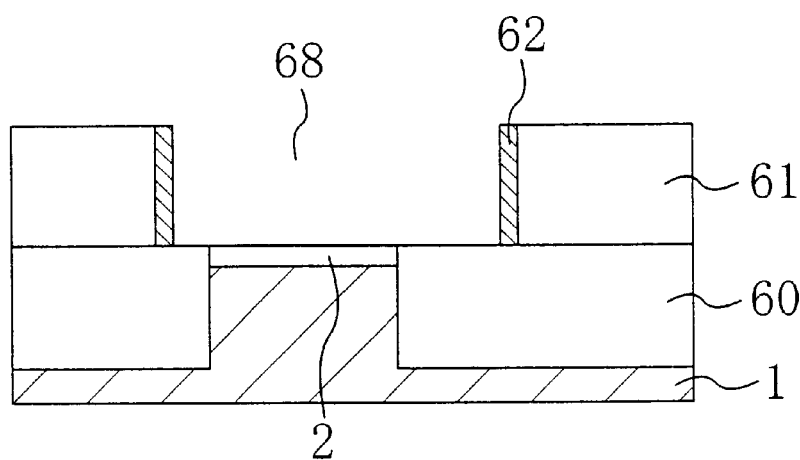
Figure 22C:
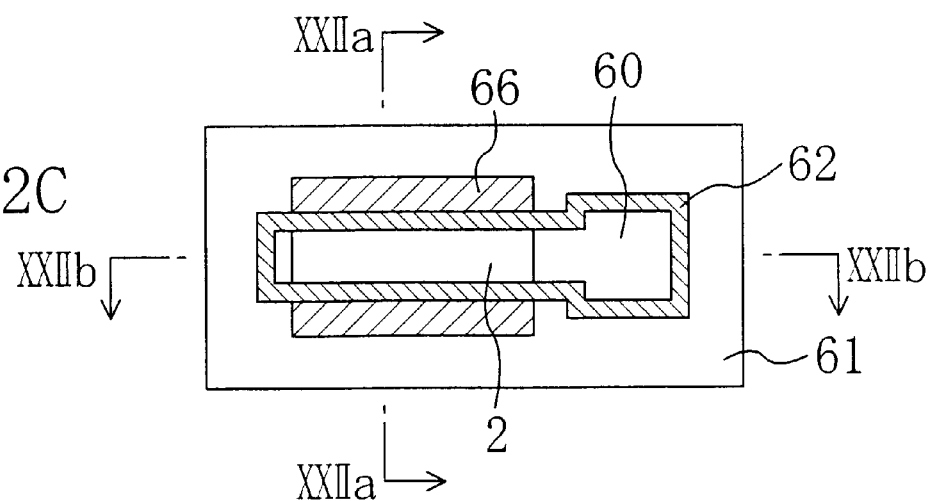

Subsequently, in the process step shown in FIGS. 22A through 22C, a CVD silicon dioxide film is deposited to a thickness of about 20 nm over the substrate and then etched back, thereby forming a sidewall insulating film 62 on the inner side faces of the gate hole 68. Thereafter, the surface of the substrate 1, which is exposed inside the gate hole 68, is thermally oxidized, thereby forming an $SiO_2$ gate insulating film 2 to a thickness of about 5 nm. In this process step, a silicon oxynitride film may be formed as the gate insulating film 2.

Figure 23A:
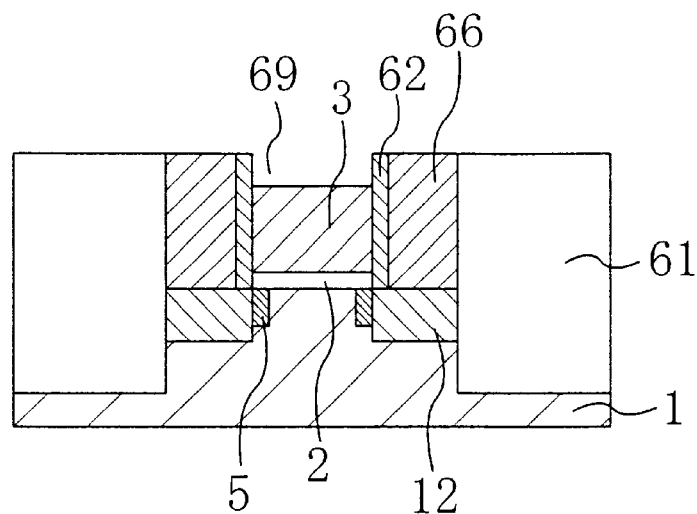
FIGS. 23A through 23C illustrate the step of forming a buried gate electrode in the process of the second embodiment.
Figure 23B:
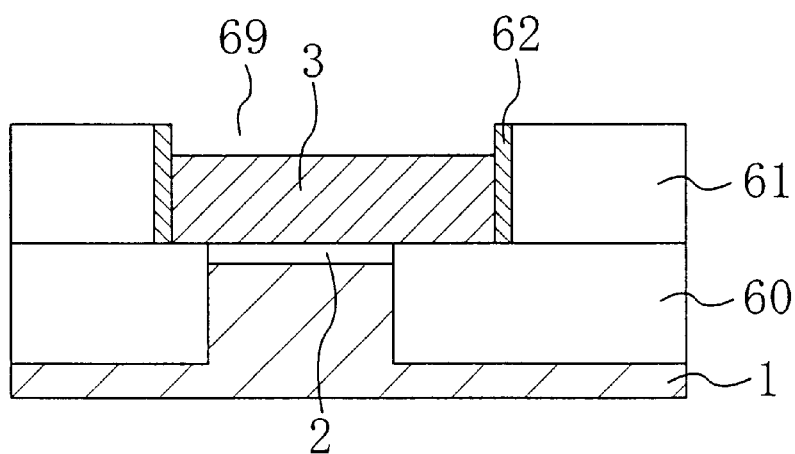
Figure 23C:
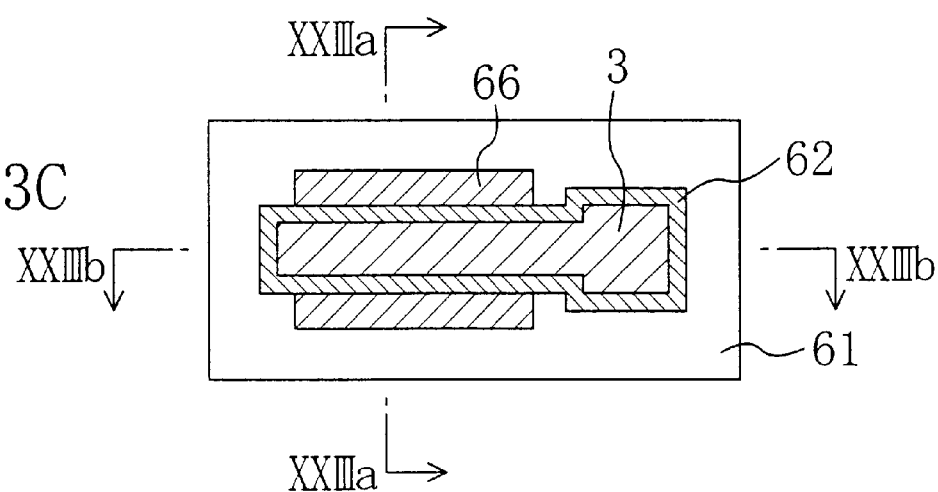

Then, in the process step shown in FIGS. 23A through 23C, an aluminum alloy film is deposited to a thickness of 600 nm over the substrate and then planarized by a CMP process until the surfaces of the isolation film 61 and contact dummies 66 are exposed. Thereafter, the aluminum alloy film, which has been embedded in the gate hole 68, is etched back to a depth of about 100 nm, thereby forming a buried gate electrode 3. In this case, a recess 69 with a depth of about 100 nm is formed over the gate electrode 3 and is surrounded by the sidewall insulating film 62. As the conductor film for forming the gate electrode 3, a metal film like a tungsten film, a polysilicon film or a polycide film may be used instead of the aluminum alloy film.

Figure 24A:
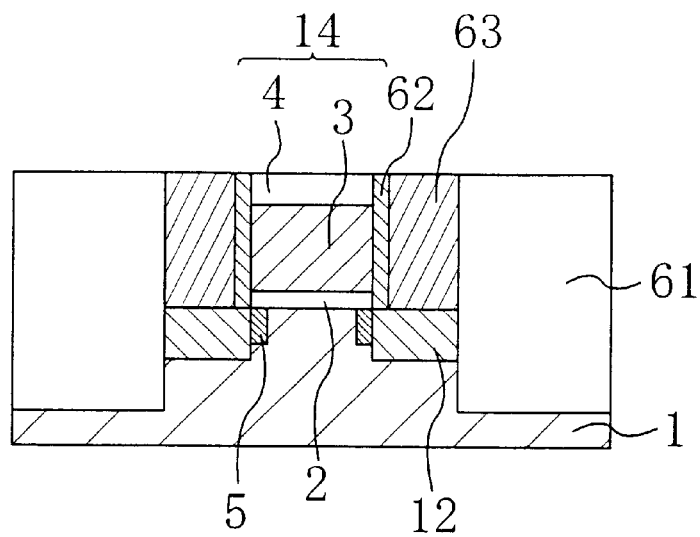
FIGS. 24A through 24C illustrate the step of forming an upper insulating film in the process of the second embodiment.
Figure 24B:
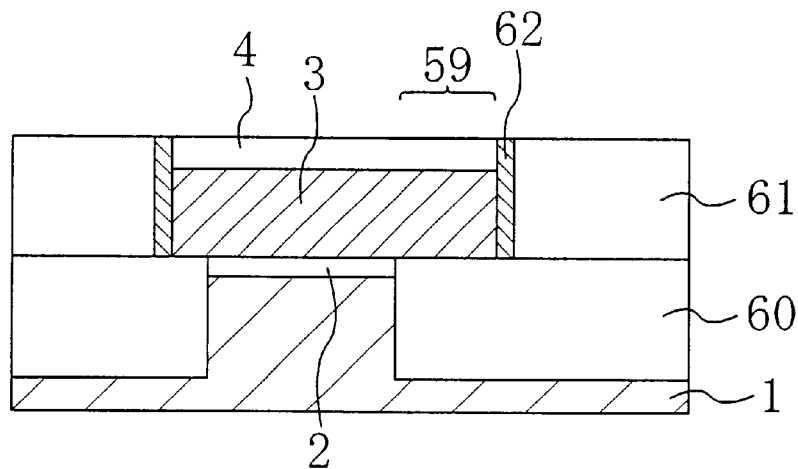
Figure 24C:
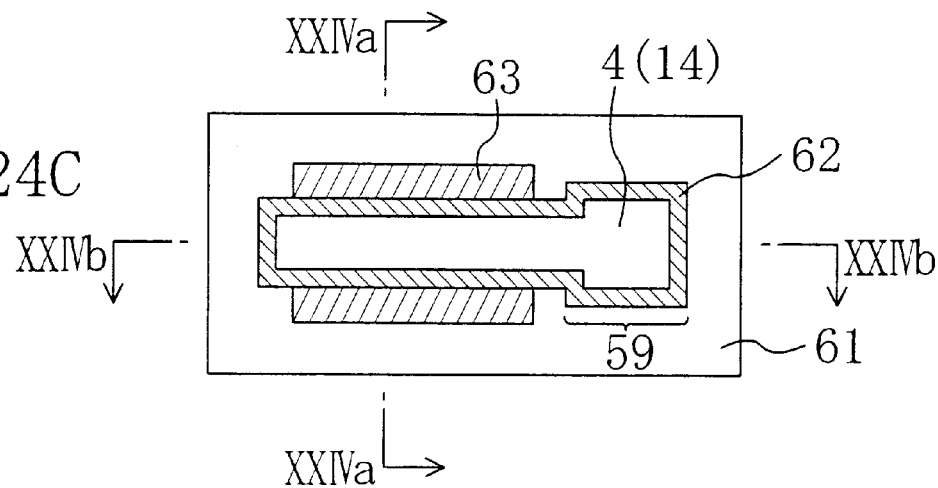

Thereafter, the same process steps as those of the first embodiment illustrated in FIGS. 11A through 13C are performed. In this manner, an upper insulating film 4 is formed on the gate electrode 3. Then, the contact dummies 66 are selectively removed to form contact holes reaching the heavily doped source/drain regions 12. And the contact holes are filled in with tungsten, for example, thereby forming source/drain contacts 63 as shown in FIGS. 24A through 24C.

In the fabrication process of the second embodiment, the LDD and heavily doped source/drain regions 5, 12, sidewall insulating film 62, isolation film 61 and source/drain contacts 63 can all be self-aligned with the gate electrode section 14 (i.e., the buried gate electrode 3) as in the first embodiment.

Accordingly, the source/drain contacts 63 and heavily doped source/drain regions 12 can be formed to less than the minimum opening size without being limited by the mask overlay accuracy or minimum opening size. Thus, the width of the active region can be reduced considerably.

Particularly, in the fabrication process of the second embodiment, the active region is sandwiched by the gate-width-defining trench isolation film 60 in the gate width direction. Thus, the junction capacitance, which is created on both sides of the heavily doped source/drain regions 12 in the gate width direction, can be reduced. In addition, the variation in electrical characteristics (e.g., threshold voltage and I-V characteristic) of the resultant semiconductor device can be suppressed.

Embodiment 3

Figure 25A:
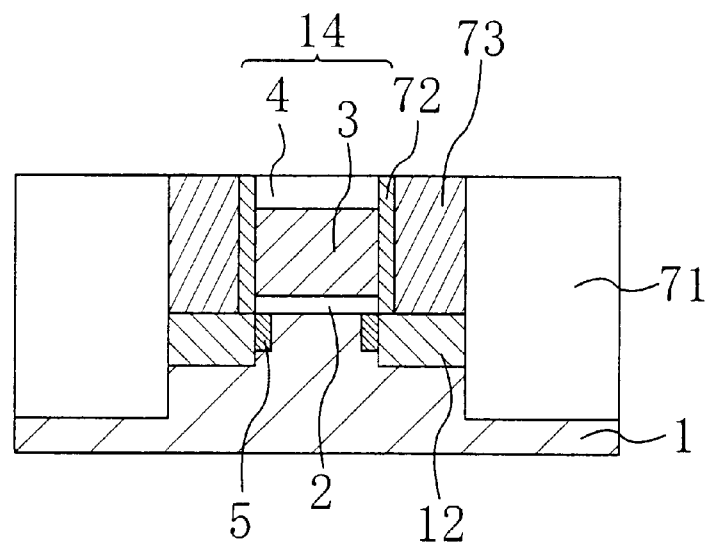
FIGS. 25A through 25C illustrate the structure of a semiconductor device according to a third embodiment of the present invention.
Figure 25B:
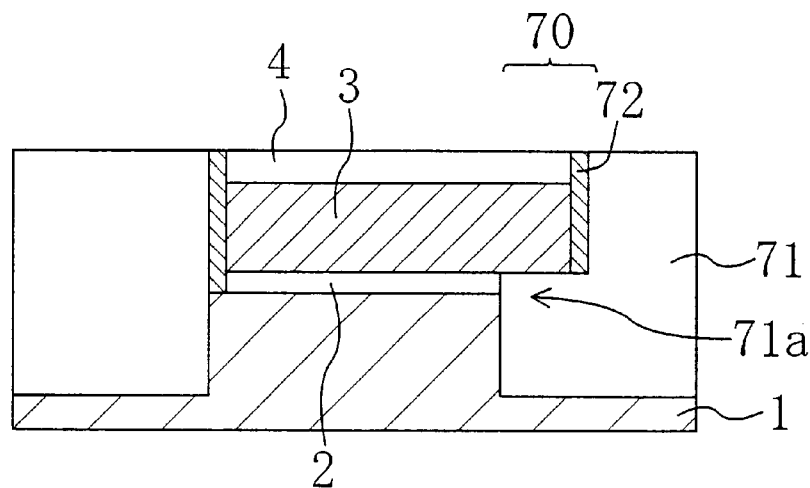
Figure 25C:
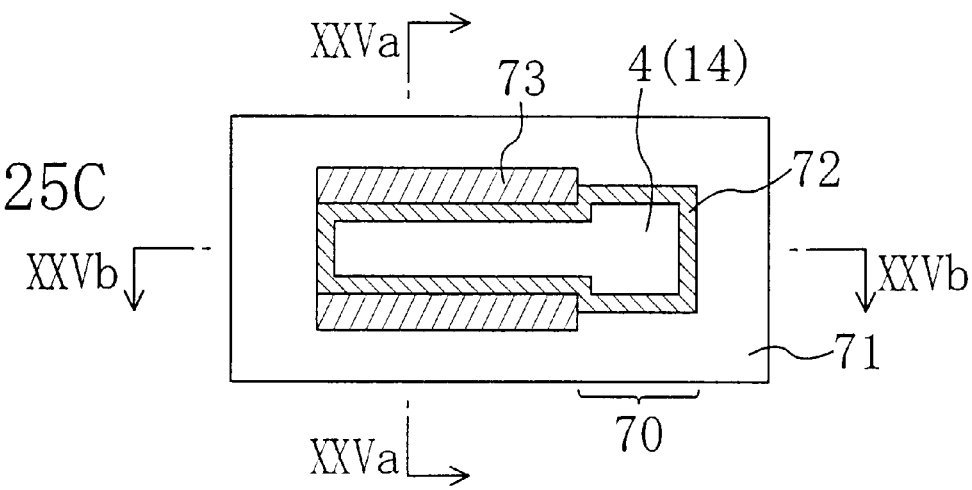

FIGS. 25A through 25C illustrate the structure of a semiconductor device according to a third embodiment of the present invention. Specifically, FIG. 25A illustrates a cross section of the device taken in the channel direction (i.e., in the gate length direction). FIG. 25B illustrates a cross section of the device vertically to the channel direction (i.e., in the gate width direction). And FIG. 25C is a plan view thereof. FIGS. 25A and 25B are taken along the lines XXVa—XXVa and XXVb—XXVb shown in FIG. 25C.

As shown in FIG. 25A, the MIS transistor of the third embodiment has basically the same structure as the counterparts of the first and second embodiments shown in FIGS. 1A and 14A when taken in the gate length direction. Specifically, the transistor also includes Si substrate 1, gate insulating film 2, buried gate electrode 3, upper insulating film 4, sidewall insulating film 72, LDD regions 5 and heavily doped source/drain regions 12 on the cross section taken in the gate length direction. The gate insulating film 2 is formed out of a silicon dioxide film on the substrate 1. The buried gate electrode 3 is formed on the gate insulating film 2 by filling in a hole over the insulating film 2 with an aluminum alloy. The upper insulating film 4 is stacked on the gate electrode 3 and formed out of a plasma silicon dioxide film. The sidewall insulating film 72, formed out of a CVD silicon dioxide film, covers the side faces of the gate electrode 3 and upper insulating film 4. And the LDD and heavily doped source/drain regions 5 and 12 are defined in the substrate 1. As in the foregoing embodiments, the buried gate electrode 3 and upper insulating film 4 will be collectively called a gate electrode section 14. The transistor further includes a trench isolation film 71 and source/drain contacts 73. The isolation film 71 and source/drain contacts 73 are both self-aligned with the gate electrode 3 (or the gate electrode section 14). The source/drain contacts 73, made of tungsten, for example, are interposed between the sidewall insulating film 72 and isolation film 71 and located just over the heavily doped source/drain regions 12. And the respective upper surfaces of the upper insulating film 4, isolation film 71, sidewall insulating film 72 and source/drain contacts 73 have all been planarized to almost the same levels. A retrograde well, functioning as a channel stopper, for example, has also been defined in the substrate 1 as described for the first embodiment.

As shown in FIG. 25B, the device of the third embodiment is different from the device of the first or second embodiment in that the size of the buried gate electrode 3 in the gate width direction is also defined by the isolation film 71. In addition, in the device of the third embodiment, the upper surface of a gate-width-defining portion 71a of the isolation film 71, which is located under a gate contact region 70 of the gate electrode 3, is located at almost the same level as the upper surface of the substrate 1.

Furthermore, as shown in FIG. 25C, the gate electrode section 14 is surrounded by the sidewall insulating film 72 and part of the sidewall insulating film 72 is surrounded by the trench isolation film 71. Contact holes were provided between the sidewall insulating film 72, which is located over the heavily doped source/drain regions 12, and the isolation film 71. And the contact holes have been filled in with the source/drain contacts 73. That is to say, on a transversal cross section taken across a part of the buried gate electrode 3, a periphery, outlining the gate electrode 3, sidewall insulating film 72 and source/drain contacts 73, is surrounded by the isolation film 71 as shown in FIG. 25C.

The device of the third embodiment has the same features as the counterpart of the first embodiment. Specifically, not only the sidewall insulating film 72 and source/drain contacts 73 but also the isolation film 71 are self-aligned with the gate electrode section 14 as well. The upper surface of the trench isolation film 71 is higher than that of the substrate 1 and the upper part of the isolation film 71 is adjacent to the source/drain contacts 73. In other words, the upper half of the isolation film 71 functions as the interlevel dielectric film 111 in the known device shown in FIG. 40. In addition, the device of the third embodiment is also characterized in that the gate-width-defining portion 71a of the isolation film 71, which is located under the gate contact region 70, defines the width of the active region in the gate width direction. As a result, the variation in electrical characteristics of the semiconductor device and the junction capacitance thereof can be reduced as will be described later. Also, the upper surface of the gate-width-defining portion 71a of the isolation film 71, which is located under the gate contact region 70, is located at a level lower than the upper surface of the substrate 1. Thus, the upper surface of the upper insulating film 4 in the gate electrode section 14 and that of the isolation film 71 can be planarized to almost the same levels.

Hereinafter, a method for fabricating the semiconductor device in accordance with the third embodiment of the present invention will be described with reference to FIGS. 26A through 37C. FIGS. 26C, 27C, 28C, 29C, 30C, 31C, 32C, 33C, 34C, 35C, 36C and 37C are plan views of respective structures prepared to complete the device. FIGS. 26A, 27A, 28A, 29A, 30A, 31A, 32A, 33A, 34A, 35A, 36A and 37A illustrate cross sections taken in the gate length direction (i.e., along the lines XXVIa—XXVIa, XXVIIa—XXVIIa, XXVIIIa—XXIIIa, XXIXa—XXIXa, XXXa—XXXa, XXXIa—XXXIa, XXXIIa—XXXIIa, XXXIIIa—XXXIIIa, XXXIVa—XXXIVa, XXXVa—XXXVa, XXXVIa—XXXVIa and XXXVIIa—XXXIIIa shown in FIGS. 26C, 27C, 28C, 29c, 30C, 31C, 32C, 33C, 34C, 35C, 36C and 37C, respectively). FIGS. 26B, 27B, 28B, 29B, 30B, 31B, 32B, 33B, 34B, 35B, 36B and 37B illustrate cross sections taken in the gate width direction (i.e., along the lines XXVIb—XXVIb, XXVIIb—XXVIIb, XXVIIIb—XXVIIIb, XXIXb—XXIXb, XXXb—XXXb, XXXIb—XXXIb, XXXIIb—XXXIIb, XXXIIIb—XXXIIIb, XXXIVb—XXXIVb, XXXVb—XXXVb, XXXVIb—XXXVIb and XXXVIIb—XXXVIIb shown in FIGS. 26C, 27C, 28C, 29C, 30C, 31C, 32C, 33C, 34C, 35C, 36C and 37C, respectively).

Figure 26A:
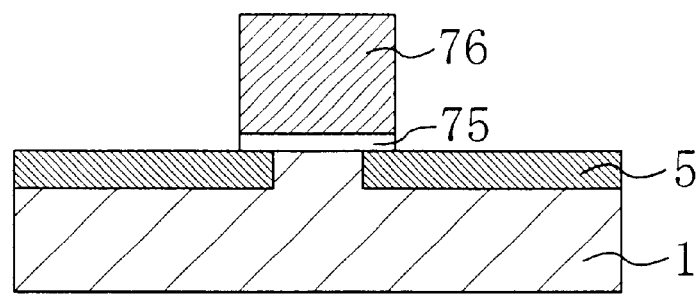
FIGS. 26A through 26C illustrate the step of forming a gate electrode dummy and LDD regions in the process of the third embodiment.
Figure 26B:
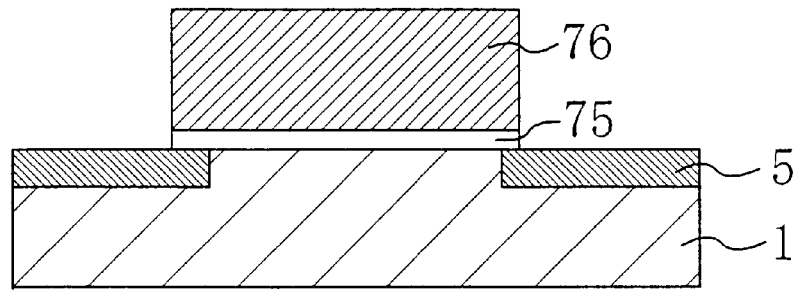
Figure 26C:
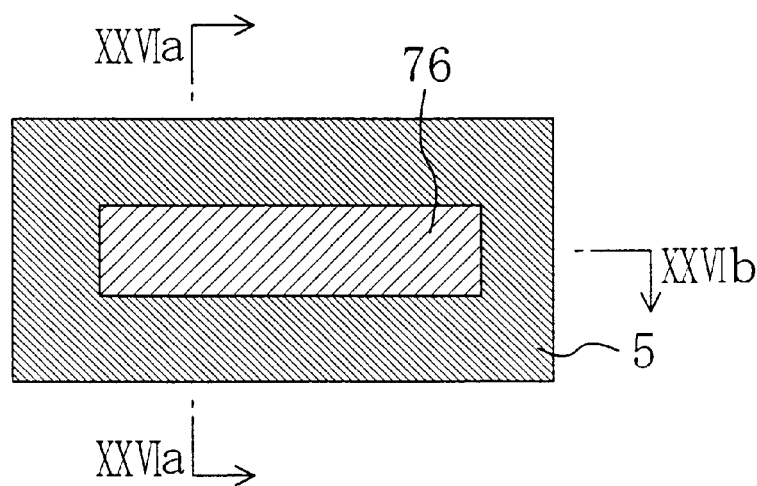

First, in the process step shown in FIGS. 26A through 26C, a retrograde well is formed in an Si substrate 1 by high-energy ion implantation. Then, the surface of the substrate 1 is thermally oxidized, thereby forming a silicon dioxide film to a thickness of about 5 nm. Thereafter, a PSG film is deposited to a thickness of 300 nm on the silicon dioxide film by a CVD process. Then, a resist pattern (not shown) for a gate electrode dummy is defined and these films are dry etched, thereby patterning the PSG and silicon dioxide films. In this manner, the PSG film is shaped into a gate electrode dummy 76 and the silicon dioxide film is shaped into an undercoat insulating film 75. In this case, the size of the gate electrode dummy 76 as measured in the gate length direction should be the sum of a finally required gate length and the total thickness of the right and left-hand side portions of a sidewall insulating film to be formed later. The size of the gate electrode dummy 76 in the gate width direction is set greater than a finally required gate width. It should be noted that the undercoat insulating film 50 does not have to be patterned into the same shape as the gate electrode dummy 76 at this stage.

Thereafter, dopant ions are lightly implanted into the substrate 1 by large-angle-tilt ion implantation so that an angle between 20 and 45 degrees is formed with a normal to the substrate surface on a cross section taken in the gate length direction. In this case, the gate electrode dummy 76 is used as a mask. In this manner, lightly doped source/drain regions (i.e., LDD regions) 5 are defined in the substrate 1 so as to be self-aligned with the gate electrode dummy 76. It should be noted that a thin passivation film may be formed to a thickness of about 5 nm on the exposed surface of the substrate 1 before the ion implantation is carried out to define the LDD regions 5.

Figure 27A:
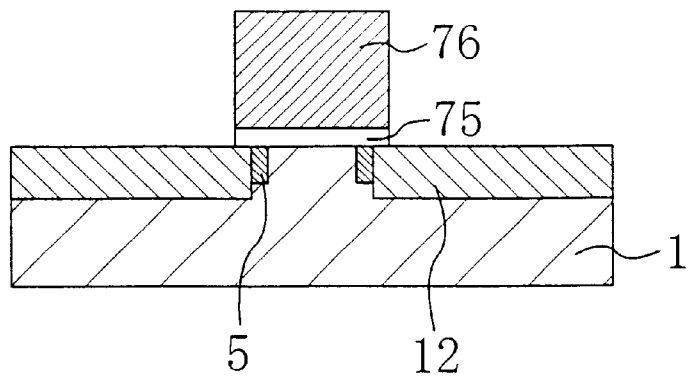
FIGS. 27A through 27C illustrate the step of defining heavily doped source/drain regions in the process of the third embodiment.
Figure 27B:
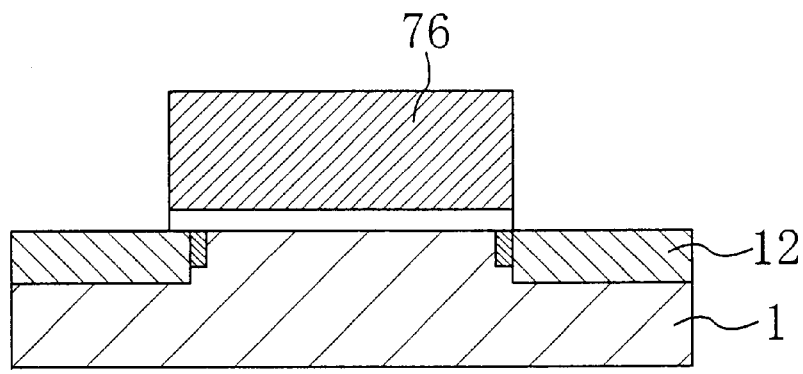
Figure 27C:
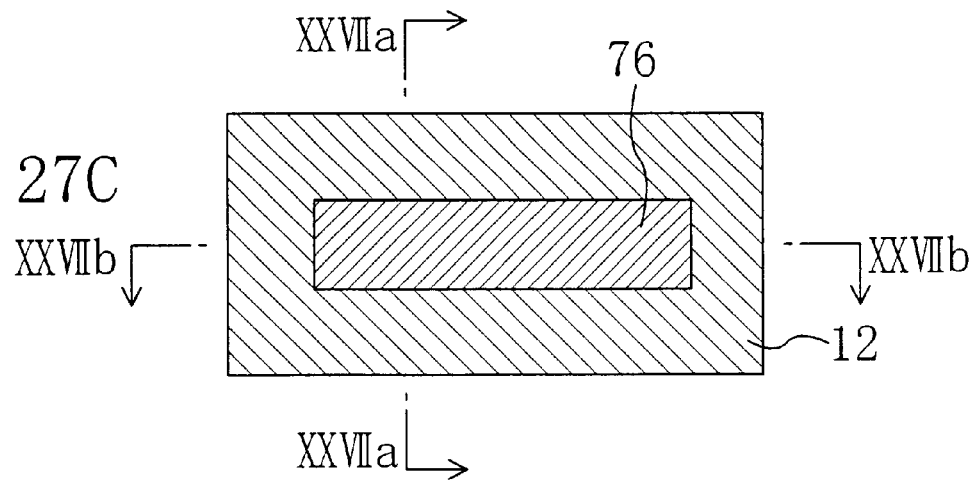

Next, in the process step shown in FIGS. 27A through 27C, dopant ions are implanted into the substrate 1 heavily and almost vertically to the substrate surface (i.e., so that an angle between 0 and 7 degrees is formed with a normal to the substrate surface). In this manner, heavily doped source/drain regions 12 are defined in the substrate 1 so as to be self-aligned with the gate electrode dummy 76. In this case, the gate electrode dummy 76 is also used as a mask. In these process steps, the LDD and heavily doped source/drain regions 5 and 12 may be formed not only in the regions to be source/drain regions in the end, but also in the regions where the isolation film will be formed in the gate length direction.

Figure 28A:
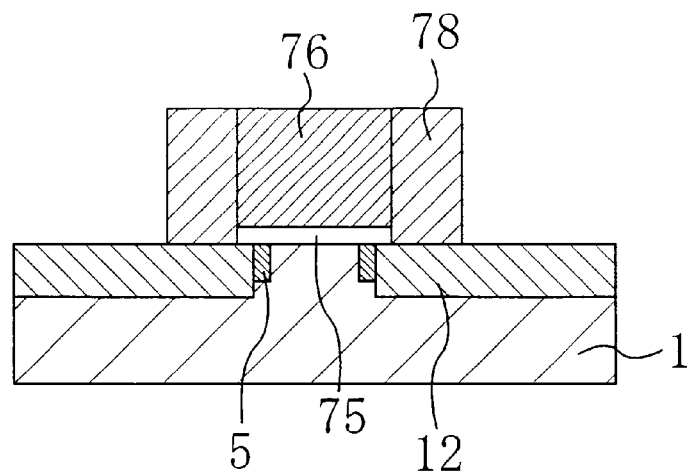
FIGS. 28A through 28C illustrate the step of forming a sidewall dummy in the process of the third embodiment.
Figure 28B:
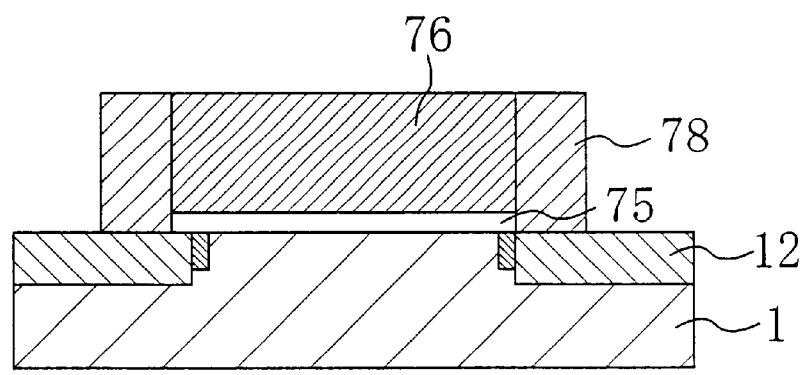
Figure 28C:
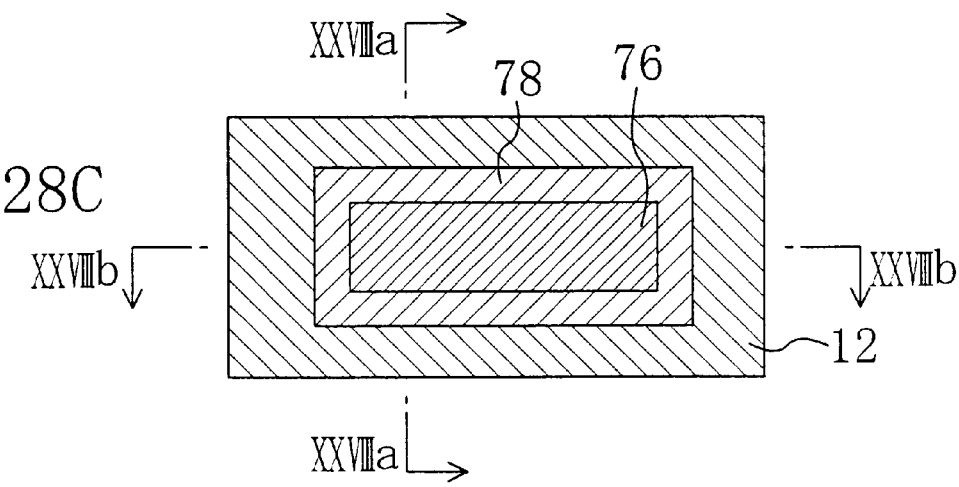

Subsequently, in the process step shown in FIGS. 28A through 28C, a silicon nitride film is deposited to a thickness of 60 nm over the substrate and then etched back, thereby forming a sidewall dummy 78 on the side faces of the gate electrode dummy 76. As in the first and second embodiments, the final size of the source/drain contacts as measured in the gate length direction will be determined in a self-aligned manner depending on the size of the sidewall dummy 78. Accordingly, by adjusting the thickness of the silicon nitride film deposited to be the sidewall dummy 78, the size of the source/drain contacts is controllable. For example, if the size of the source/drain contacts as measured in the gate length direction should fall within the range from 0.01 $\mu$m to 0.1 $\mu$m, which is smaller than the minimum opening size, the silicon nitride film to be the sidewall dummy 78 should be deposited to a thickness between 10 nm and 100 nm.

Figure 29A:
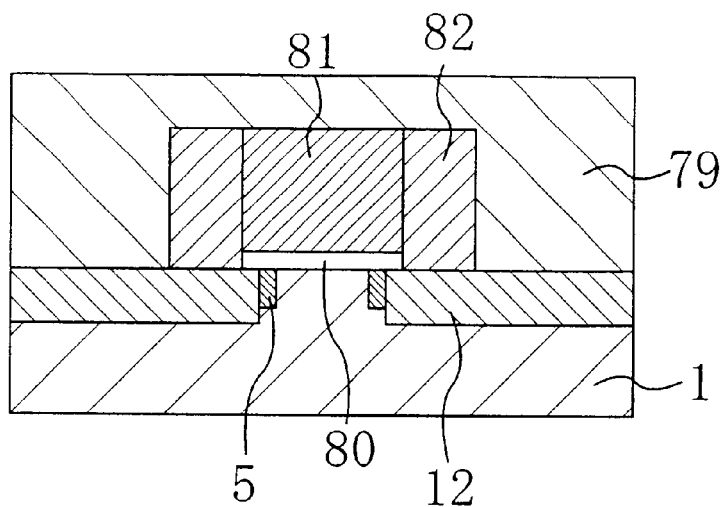
FIGS. 29A through 29C illustrate the step of forming contact dummies in the process of the third embodiment.
Figure 29B:
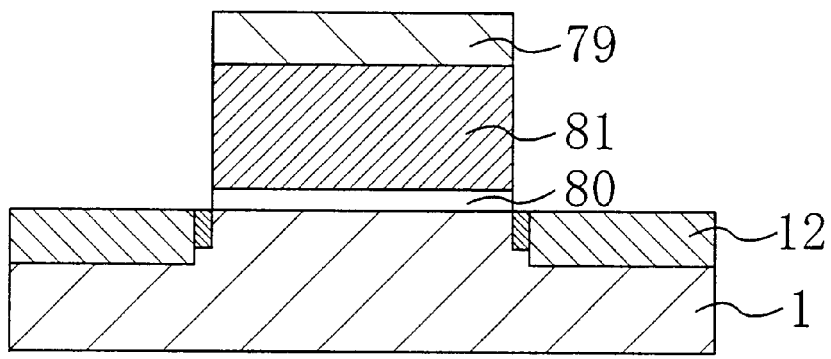
Figure 29C:
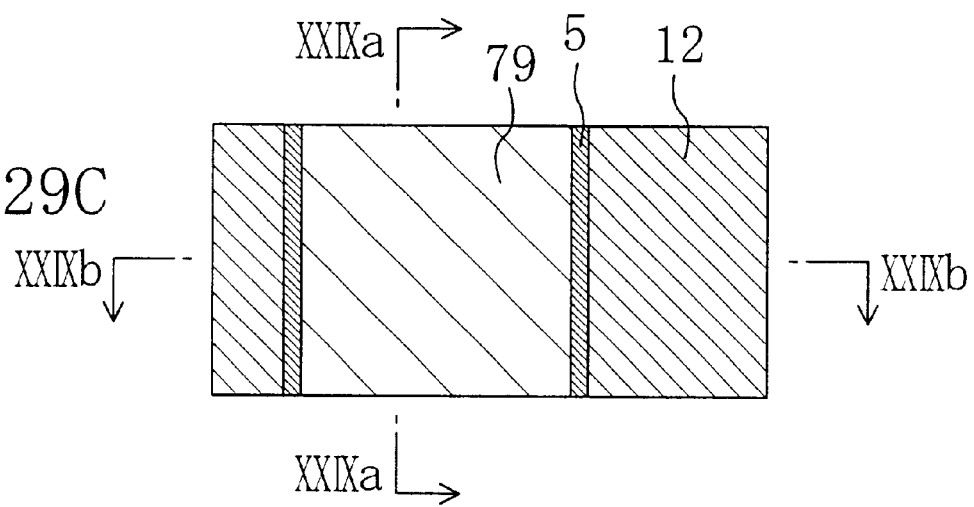

Then, in the process step shown in FIGS. 29A through 29C, a resist film 79 is defined to cover a region to be the active region in the end (which will be called an "active-region-to-be region") in the gate width direction. And both ends of the undercoat insulating film 75, gate electrode dummy 76 and sidewall dummy 78 are selectively etched away using this resist film 79 as a mask, thereby forming partial undercoat insulating film 80, partial gate electrode dummy 81 and contact dummies 82. The size of this resist film 79 in the gate width direction is almost equal to a desired gate width. Accordingly, when the resist film 79 is defined over the gate electrode dummy 76, both ends of the resist film 79 are located inside the preexistent LDD regions 5 and both ends of the gate electrode dummy 76 extend therefrom in the gate width direction. In the gate length direction on the other hand, the resist film 79 only needs to cover at least the gate electrode dummy 76 and sidewall dummy 78. A region of the substrate 1, which is located under the partial gate electrode dummy 81 and contact dummies 82 defined in this process step, will be the active region in the end.

Figure 30A:
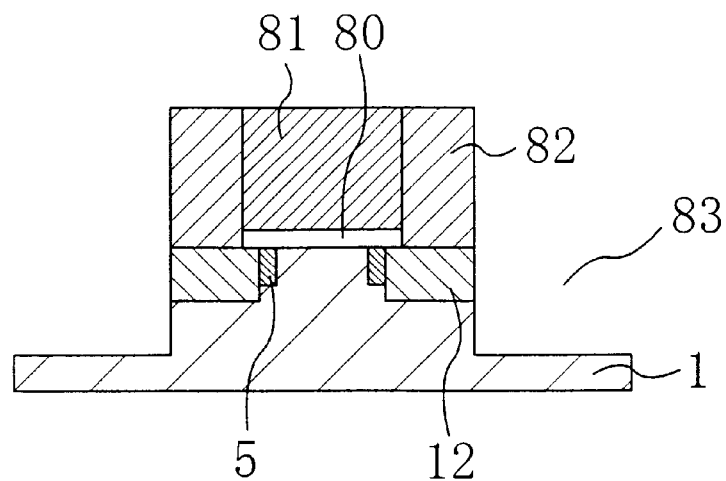
FIGS. 30A through 30C illustrate the step of forming a trench in the process of the third embodiment.
Figure 30B:
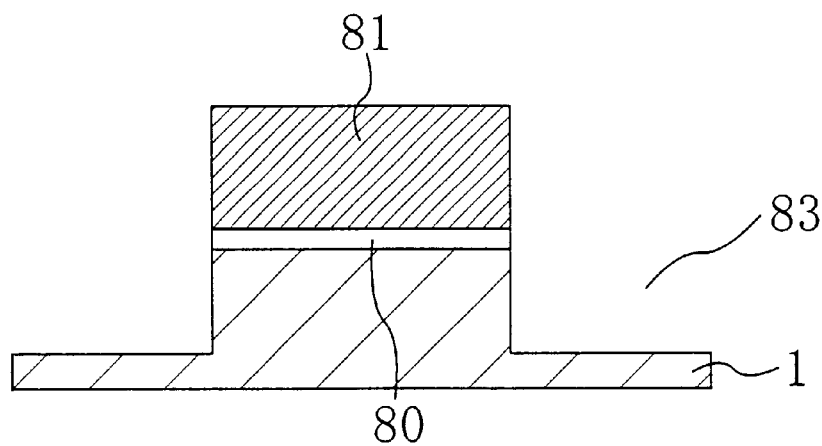
Figure 30C:
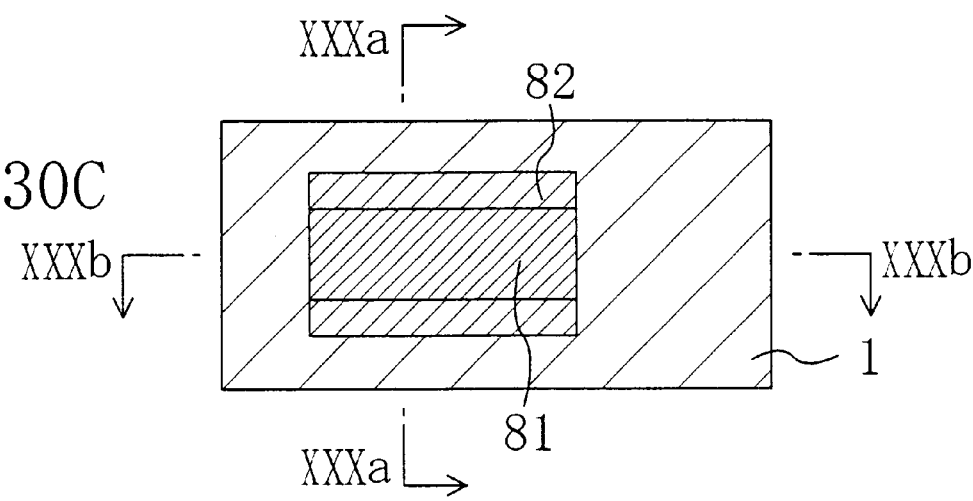

Thereafter, in the process step shown in FIGS. 30A through 30C, the resist film 79 is removed. And the exposed parts of the substrate 1 are selectively etched away vertically using the partial gate electrode dummy 81 and contact dummies 82 as a mask. In this manner, a trench 83 is formed to a depth of 0.3 $\mu$m, which is deeper than the heavily doped source/drain regions 12. The trench 83 is self-aligned with the contact dummies 82. And the contact dummies 82 have been self-aligned with the gate electrode dummy 76, i.e., the partial gate electrode dummy 81, as described above. Accordingly, the trench 83 is also self-aligned with the partial gate electrode dummy 81.

Figure 31A:
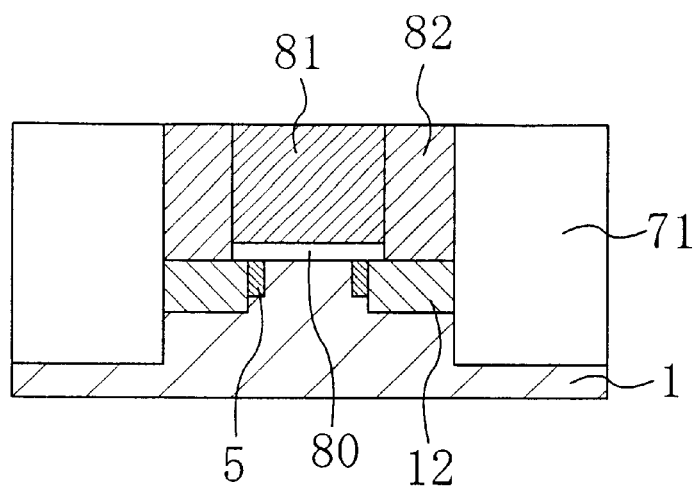
FIGS. 31A through 31C illustrate the step of forming a trench isolation film in the process of the third embodiment.
Figure 31B:
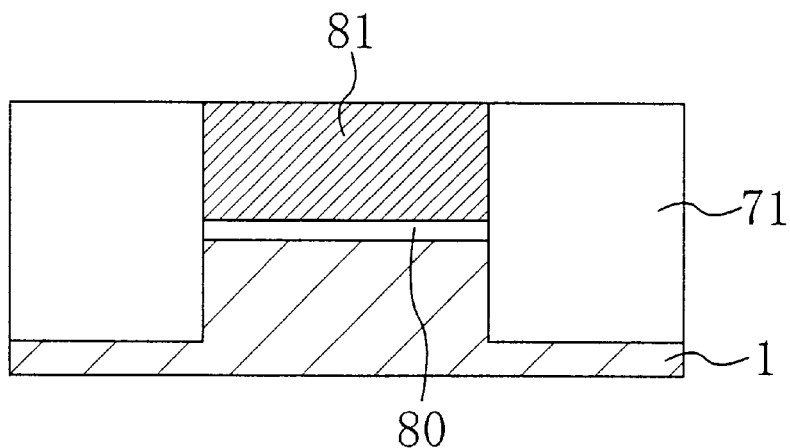
Figure 31C:
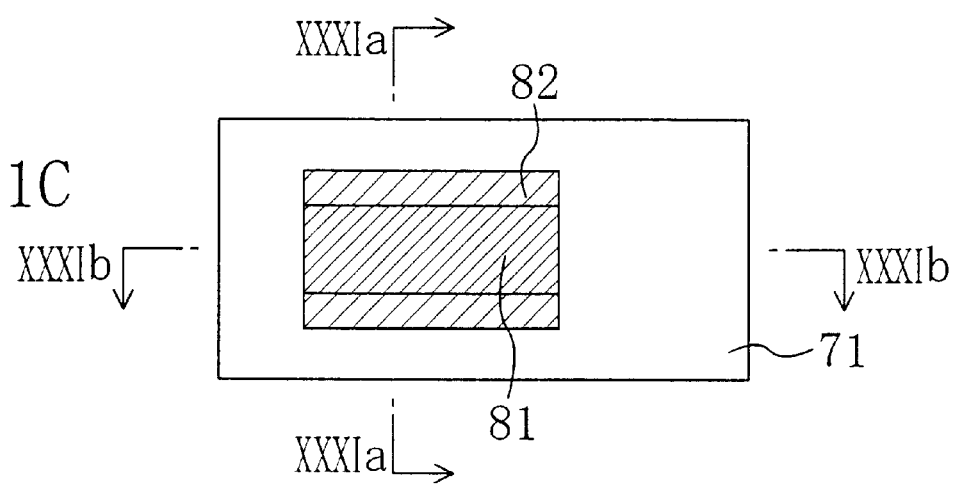

Next, in the process step shown in FIGS. 31A through 31C, a CVD silicon dioxide film is deposited to a thickness of about 1.2 μm over the substrate and then planarized by a CMP process until at least the surfaces of the partial gate electrode dummy 81 and contact dummies 82 are exposed. In this manner, the trench 83 is filled in with the CVD silicon dioxide film, thereby forming an isolation film 71. Alternatively, only the CVD silicon dioxide film may have its upper surface planarized by the CMP process first, and then the surfaces of the partial gate electrode dummy 81 and contact dummies 82 may be exposed by etching back the CVD silicon dioxide film. As a result of this process step, a region inside the substrate 1, surrounded by the isolation film 71, will be the active region.

Figure 32A:
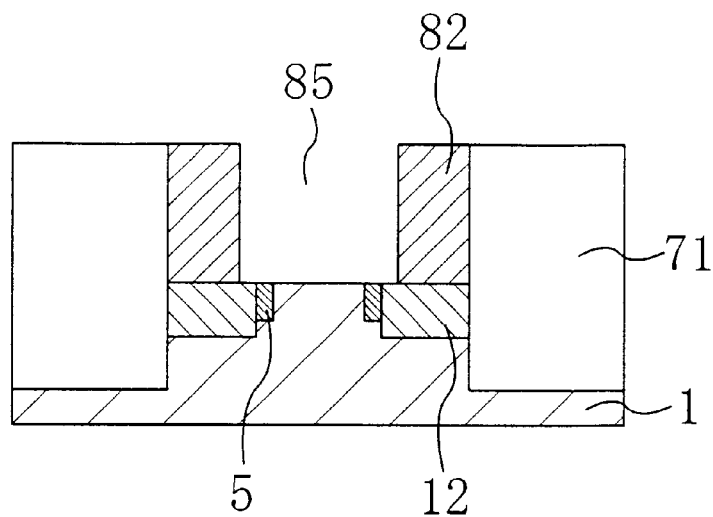
FIGS. 32A through 32C illustrate the step of forming a partial gate hole in the process of the third embodiment.
Figure 32B:
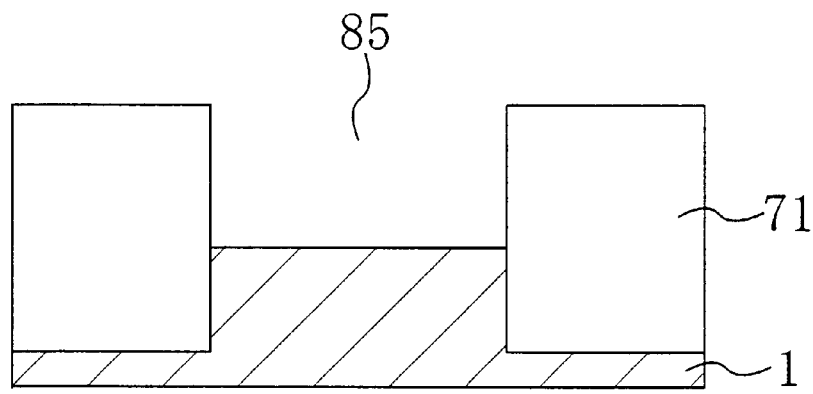
Figure 32C:
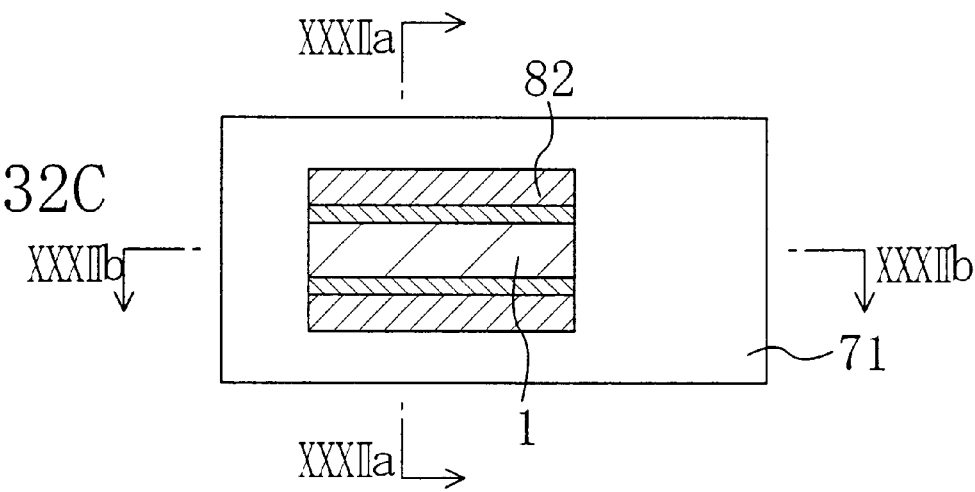

Next, in the process step shown in FIGS. 32A through 32C, the partial gate electrode dummy 81 is selectively removed with a selective etchant such as hydrofluoric acid, for example. Then, the partial undercoat insulating film 80, which has been located under the partial gate electrode dummy 81, is also removed by anisotropic etching. In this manner, a partial gate hole 85 is formed to be self-aligned with the isolation film 71.

Figure 33A:
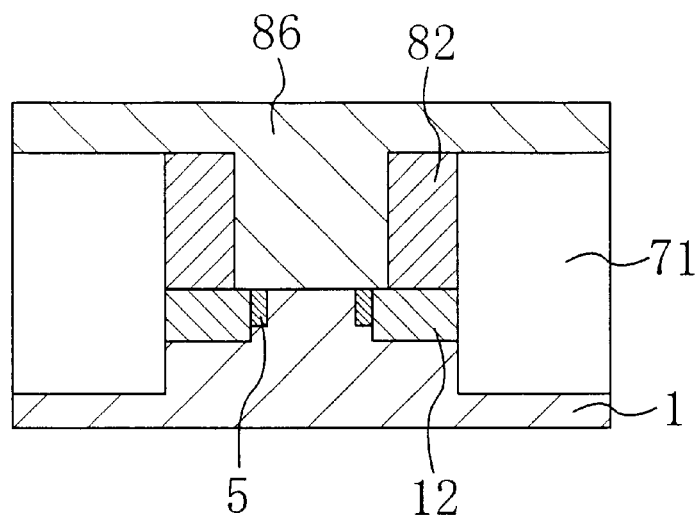
FIGS. 33A through 33C illustrate the step of forming a recess to be part of a gate hole in the process of the third embodiment.
Figure 33B:
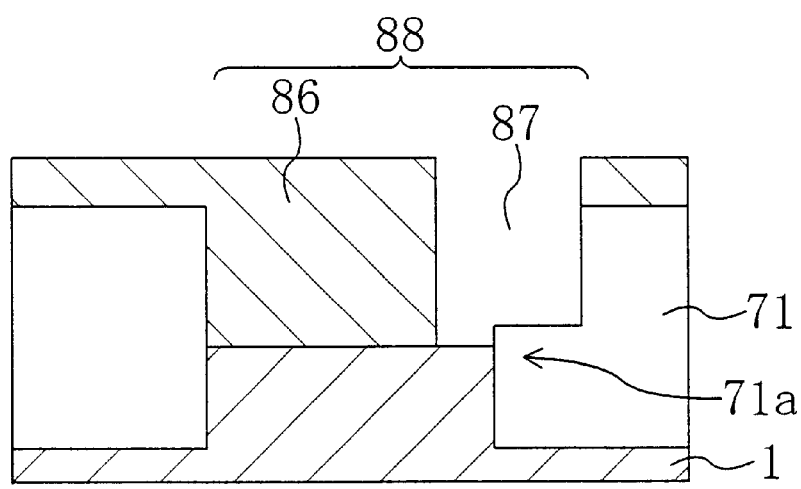
Figure 33C:
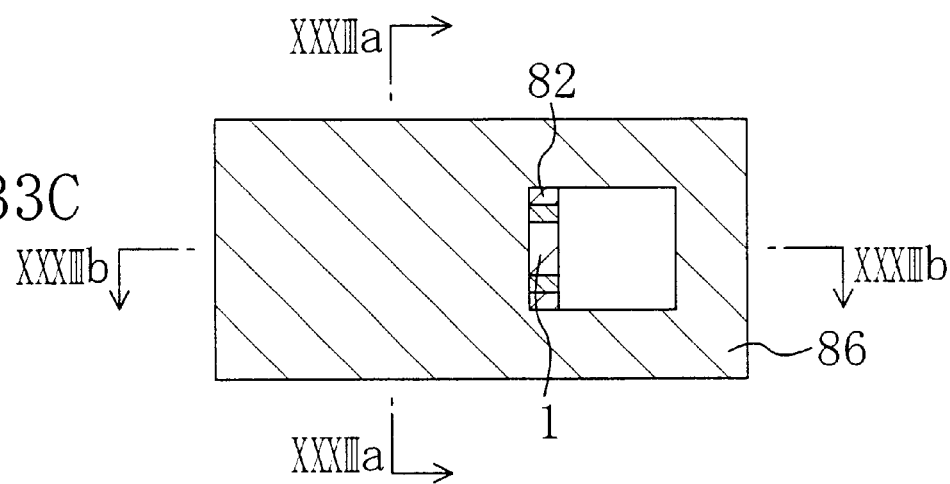

Then, in the process step shown in FIGS. 33A through 33C, a resist film 86, which has an opening over a region where a gate contact will be formed, is defined over the substrate. Using this resist film 86 as a mask, part of the isolation film 71, exposed inside the opening of the resist film 86, is selectively etched away to a depth almost equal to that of the partial gate hole 85, i.e., almost the same level as the upper surface of the substrate 1. In this manner, a recess 87 is formed. In this case, the recess 87 joins the partial gate hole 85 and the recess 87 and hole 85 together makes a gate hole 88. Neither the leftmost end nor the bottom of the recess 87 as defined in the gate width direction needs to be exactly matched to that of the partial gate hole 85. Rather, the recess and hole just have to be linked together in such a manner as to establish electrical connection between them.

Figure 34A:
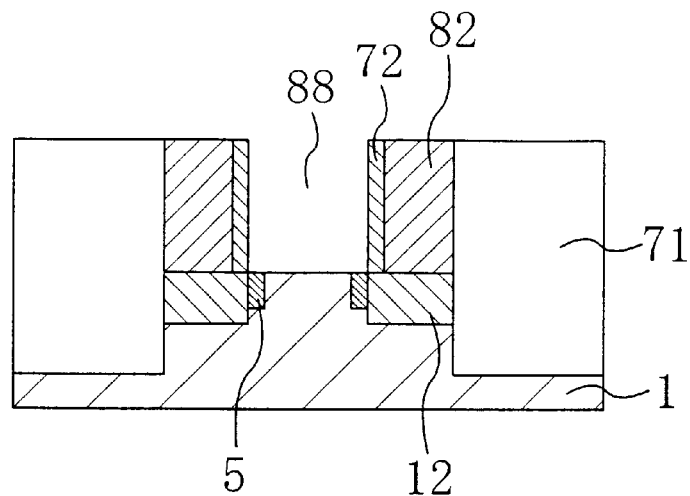
FIGS. 34A through 34C illustrate the step of forming a sidewall insulating film in the process of the third embodiment.
Figure 34B:
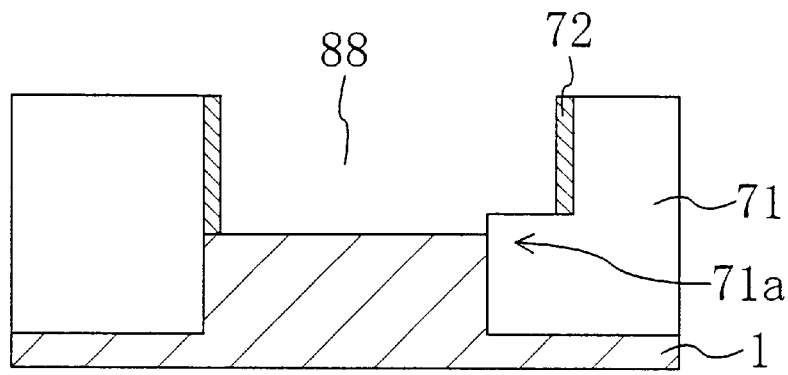
Figure 34C:
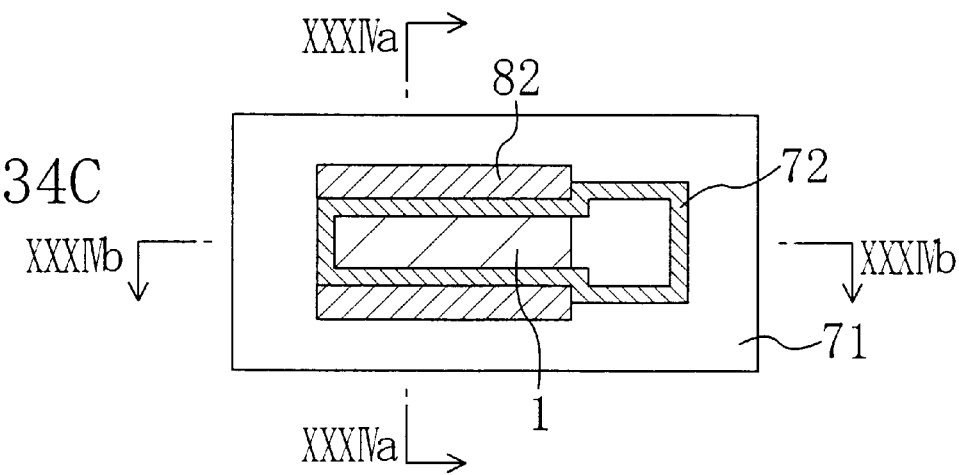

Subsequently, in the process step shown in FIGS. 34A through 34C, the resist film 86 is removed and a CVD silicon dioxide film is deposited to a thickness of about 20 nm over the substrate and then etched back. In this manner, a sidewall insulating film 72 is formed on the side faces of the gate hole 88.

Figure 35A:
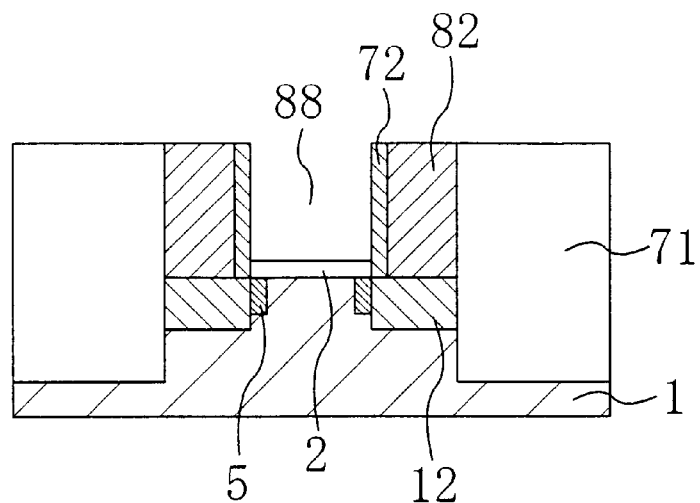
FIGS. 35A through 35C illustrate the step of forming a gate insulating film in the process of the third embodiment.
Figure 35B:
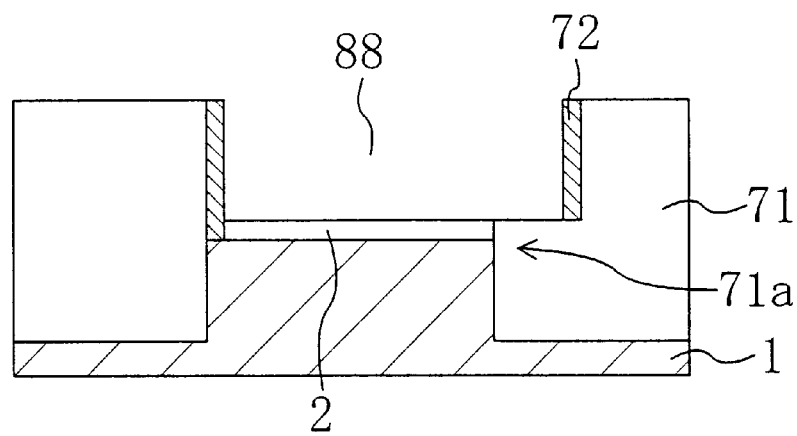
Figure 35C:
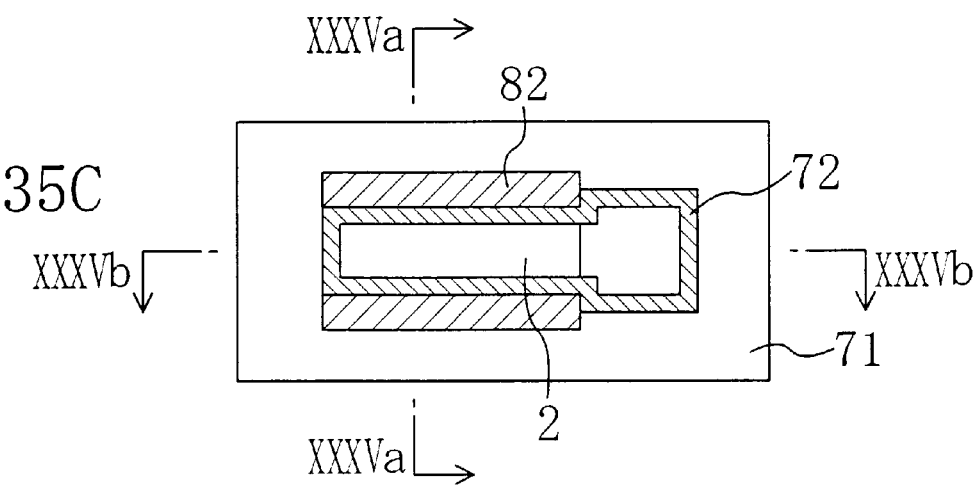

Thereafter, in the process step shown in FIGS. 35A through 35C, the surface of the substrate 1, which is exposed inside the gate hole 88, is thermally oxidized, thereby forming an SiO₂ gate insulating film 2 to a thickness of about 5 nm. In this process step, a silicon oxynitride film may be formed as the gate insulating film 2.

Figure 36A:
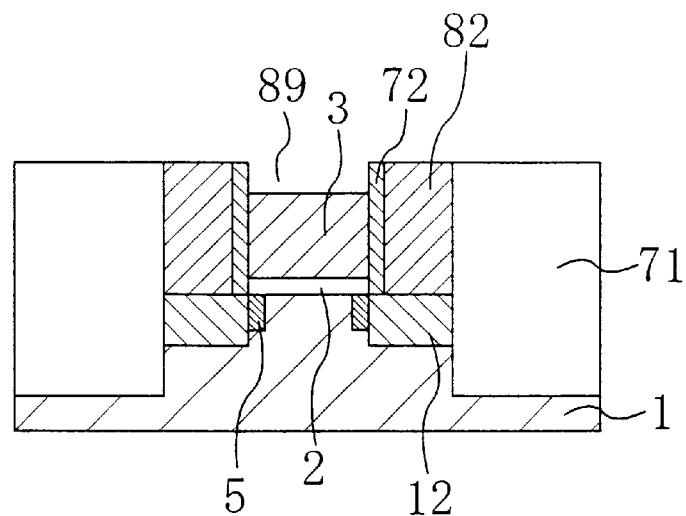
FIGS. 36A through 36C illustrate the step of forming a buried gate electrode in the process of the third embodiment.
Figure 36B:
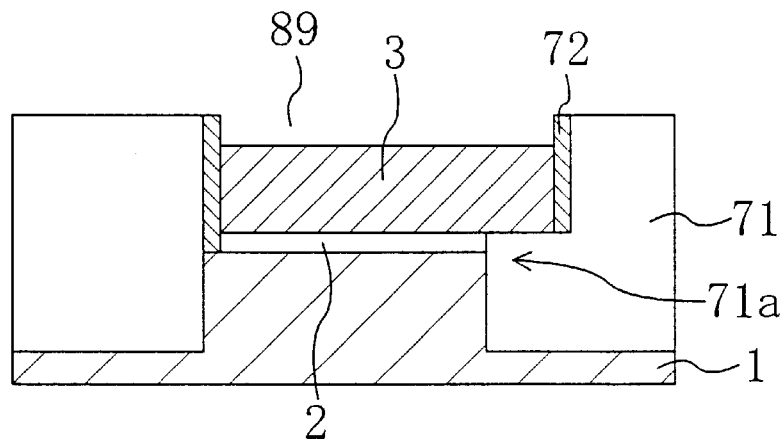
Figure 36C:
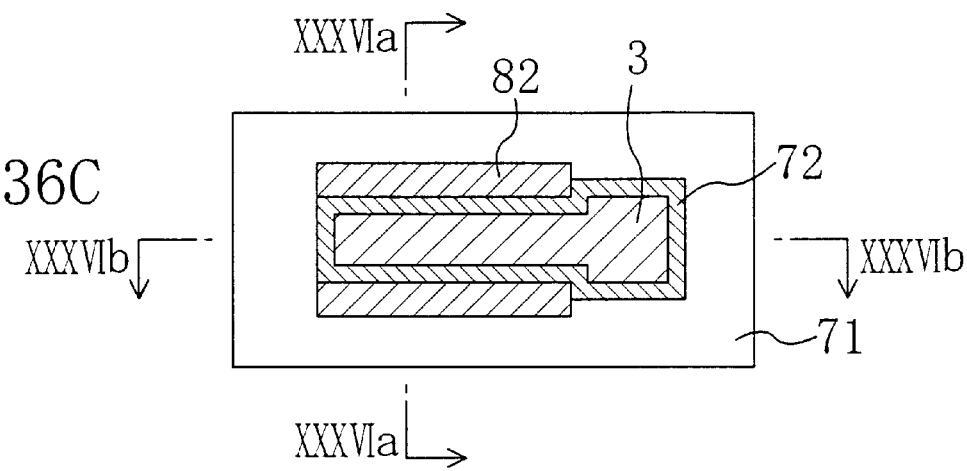

Then, in the process step shown in FIGS. 36A through 36C, an aluminum alloy film is deposited to a thickness of 600 nm over the substrate and then planarized by a CMP process until the surfaces of the isolation film 71 and contact dummies 82 are exposed. Thereafter, the aluminum alloy film, which has been embedded in the gate hole 88, is etched back to a depth of about 100 nm, thereby forming a buried gate electrode 3. In this case, a recess 89 with a depth of about 100 nm is formed over the gate electrode 3 and is surrounded by the sidewall insulating film 72. As the conductor film for forming the gate electrode 3, a metal film like a tungsten film, a polysilicon film or a polycide film may be used instead of the aluminum alloy film.

Figure 37A:
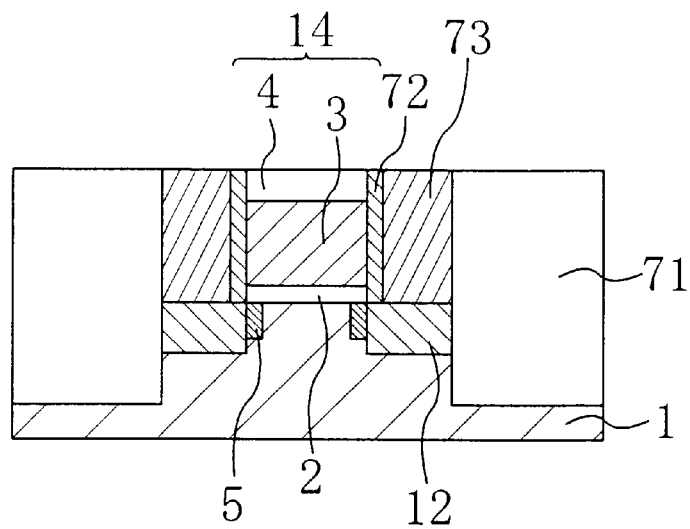
FIGS. 37A through 37C illustrate the step of forming an upper insulating film in the process of the third embodiment.
Figure 37B:
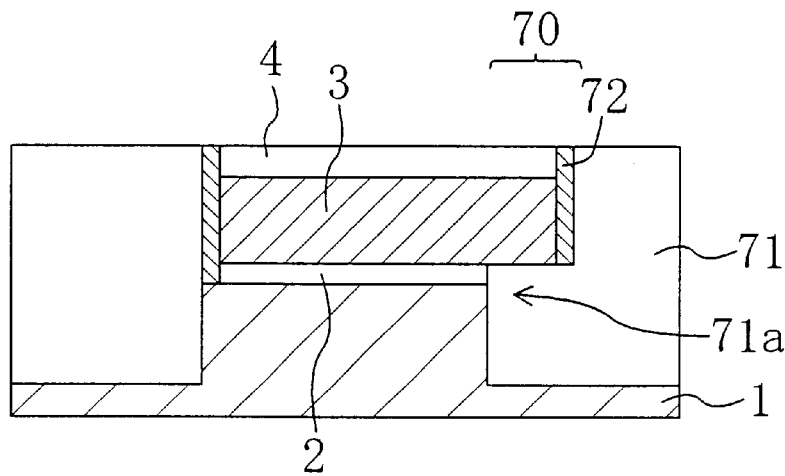
Figure 37C:
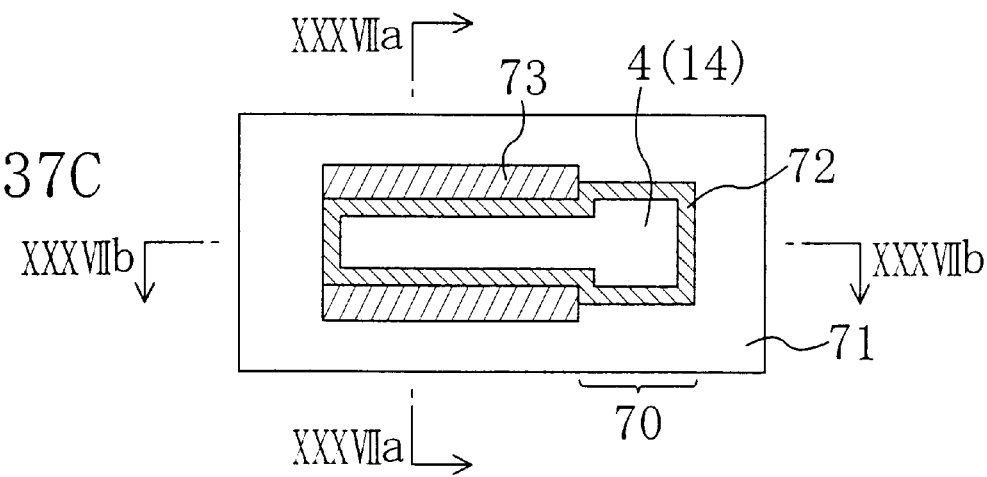

Thereafter, the same process steps as those of the first embodiment illustrated in FIGS. 11A through 13C are performed. In this manner, the upper insulating film 4 is formed on the gate electrode 3. Then, the contact dummies 82 are selectively removed to form contact holes reaching the heavily doped source/drain regions 12. And those contact holes are filled in with tungsten, for example, thereby forming source/drain contacts 73 as shown in FIGS. 37A through 37C.

In the fabrication process of the third embodiment, both ends of the undercoat insulating film 75, gate electrode dummy 76 and sidewall dummy 78 in the gate width direction are selectively removed in the process step shown in FIGS. 29A through 29C. In this manner, the partial undercoat insulating film 80, partial gate electrode dummy 81 and contact dummies 82 are formed over the active-region-to-be region. As a result, the range of the active region is determined. And an active region, which is totally surrounded by the isolation film 71 formed through the process steps shown in FIGS. 30A through 32C, is obtained. Thus, the subsequent process steps can be performed smoothly. Also, in the fabrication process of the third embodiment, the LDD and heavily doped source/drain regions 5, 12, sidewall insulating film 72, isolation film 71 and source/drain contacts 73 can all be self-aligned with the gate electrode section 14 (i.e., the buried gate electrode 3) as in the first and second embodiments.

Accordingly, the source/drain contacts 73 and heavily doped source/drain regions 12 can be formed to less than the minimum opening size without being limited by the mask overlay accuracy or minimum opening size. Thus, the width of the active region can be reduced considerably.

Particularly, in the fabrication process of the third embodiment, the active region is sandwiched in the gate width direction between the gate-width-defining portion 7a of the isolation film 71, which is located under the gate contact region 70, and a portion facing that portion 71a. Thus, the junction capacitance, which is created on both sides of the heavily doped source/drain regions 12 in the gate width direction, can be reduced. In addition, the variation in electrcal characteristics (e.g., threshold voltage and I–V characteristic) of the resultant semiconductor device can be suppressed.

Embodiment 4

Figure 38A:
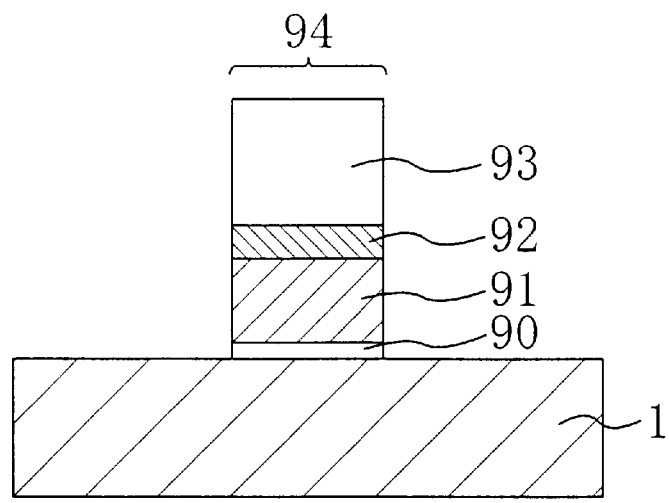
FIGS. 38A through 38C are cross-sectional views, taken in the gate length direction, illustrating process steps for fabricating a semiconductor device according to a fourth embodiment of the present invention.
Figure 38B:
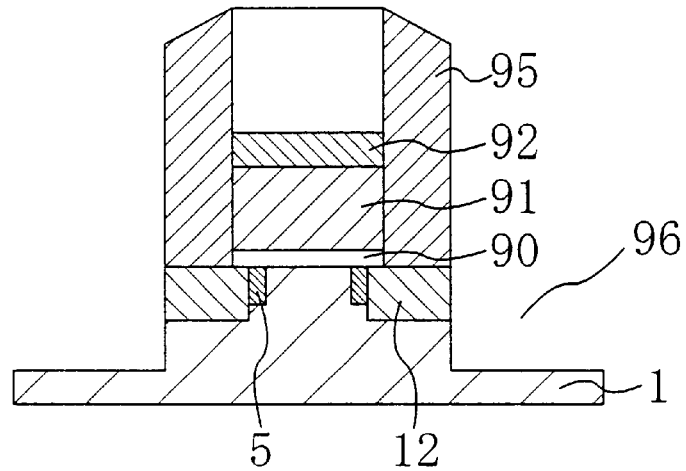
Figure 38C:
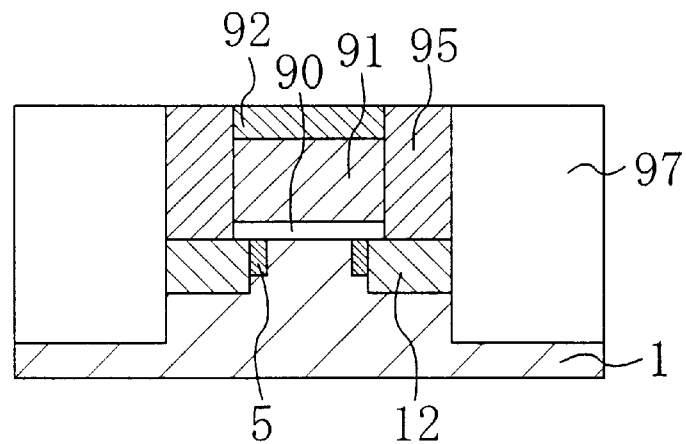

FIGS. 38A through 38C are cross-sectional views, taken in the gate length direction, illustrating alternative process steps for fabricating a semiconductor device according to a fourth embodiment of the present invention. A gate electrode dummy according to the fourth embodiment has a different structure from the counterpart of the foregoing first, second or third embodiment. The fourth embodiment is applicable to any of the foregoing embodiments. In the following description, however, the fourth embodiment will be applied to the fabrication process of the first embodiment for illustrative purposes only.

First, in the process step shown in FIG. 38A, a retrograde well is defined and then the surface of an Si substrate 1 is thermally oxidized to form a silicon dioxide film to a thickness of about 5 nm thereon. Thereafter, PSG, polysilicon and CVD silicon dioxide films are deposited in this order on the silicon dioxide film by a CVD process to respective thicknesses of 250 nm, 50 nm and 300 nm. Then, a resist pattern (not shown) for a buried gate electrode is defined and these films are dry etched, thereby patterning the CVD silicon dioxide, polysilicon, PSG and silicon dioxide films. In this manner, the CVD silicon dioxide film is shaped into a dummy upper passivation film 93. The polysilicon film is shaped into a second gate electrode dummy 92 as an etch stopper. The PSG film is shaped into a first gate electrode dummy 91. And the silicon dioxide film is shaped into an undercoat insulating film 90. As a result of this process step, a gate electrode dummy section 94, consisting of the first and second gate electrode dummies 91 and 92 and dummy upper passivation film 94, is formed.

Thereafter, in the process step shown in FIG. 38B, the LDD and heavily doped source/drain regions 5 and 12 and contact dummies 95 are formed by performing the same process steps as those of the first embodiment illustrated in FIGS. 3A through 6C. Then, the exposed parts of the substrate 1 are selectively etched away vertically using the gate electrode dummy section 94 and contact dummies 95 as a mask. In this manner, a trench 96 is formed to a depth of 0.3 μm, which is deeper than the heavily doped source/drain regions 12, so as to be self-aligned with the gate electrode dummy section 94 as in the first embodiment.

Next, as shown in FIG. 38C, a CVD silicon dioxide film is deposited to a thickness of about 1.2 μm over the substrate and then planarized by a CMP process until the surface of the second gate electrode dummy 92 is exposed. In this manner, an isolation film 97 is formed.

Thereafter, the same process steps as those illustrated in FIGS. 8A through 13C are performed to form the buried gate electrode and source/drain contacts, thereby completing an MIS transistor.

In the fabrication process of the fourth embodiment, the dummy upper passivation film 93 is formed on the second gate electrode dummy 92 to be an etch stopper. And the film 93 is made of a material (e.g., silicon dioxide in this embodiment) with a high etch selectivity against the material (e.g., polysilicon in this embodiment) of the second gate electrode dummy 92. Thus, even if the upper part of the contact dummies 95 inclines unintentionally in the process step shown in FIG. 38B, that inclined upper part can be eliminated by planarizing the structure in the process step shown in FIG. 38C until the surface of the second gate electrode dummy 92 is exposed. As a result, the upper surface of the contact dummies 95 can be planarized to have almost the same area as the lower surface thereof. And by selectively removing these contact dummies 95, the contact holes can be formed in an even better shape compared to the first embodiment. As a result, the source/drain contacts can be formed in a very good shape. The same effects as those of the fabrication process of this embodiment are also attainable by the following ethod.

For example, the gate electrode dummy may be formed out of a PSG film with a thickness of 600 nm in the process step shown in FIG. 38A. Then, the dummy may be planarized by a CMP process until the thickness thereof is reduced to 300 nm in the process step shown in FIG. 38C.

That is to say, the effects of this embodiment are attainable if a gate electrode dummy with a required thickness has been prepared before the planarization process is carried out to form the isolation film. Thus, the gate electrode dummy may be formed initially to a thickness exceeding the minimum thickness required for forming the buried gate electrode in the end.

Alternative Embodiments

Figure 39A:
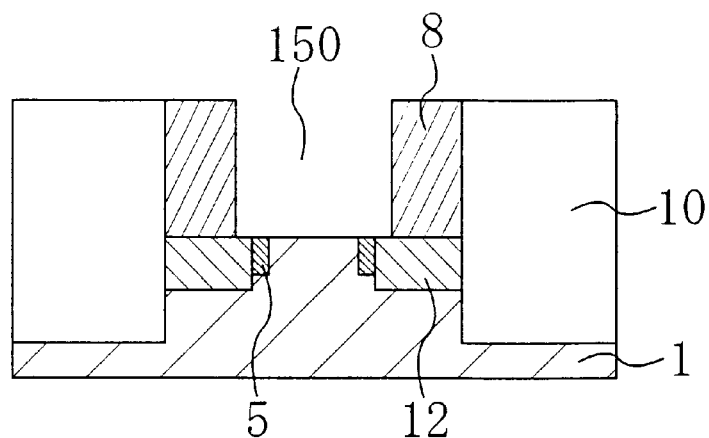
FIGS. 39A through 39C are cross-sectional views, taken in the gate length direction, illustrating alternative process steps for fabricating a semiconductor device according to another embodiment of the present invention.
Figure 39B:
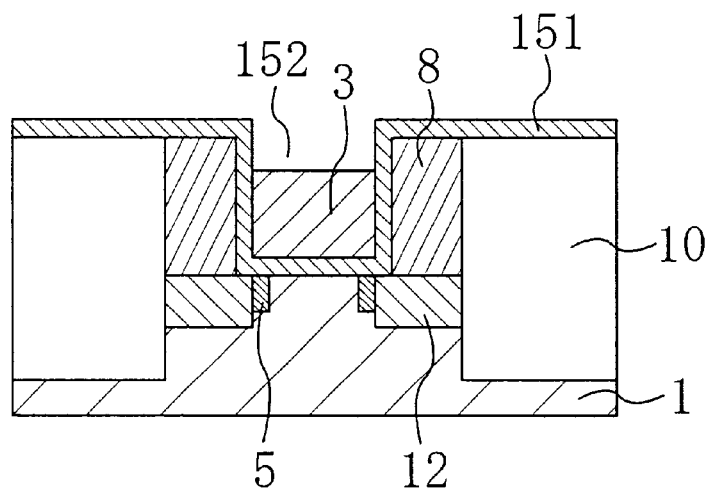
Figure 39C:
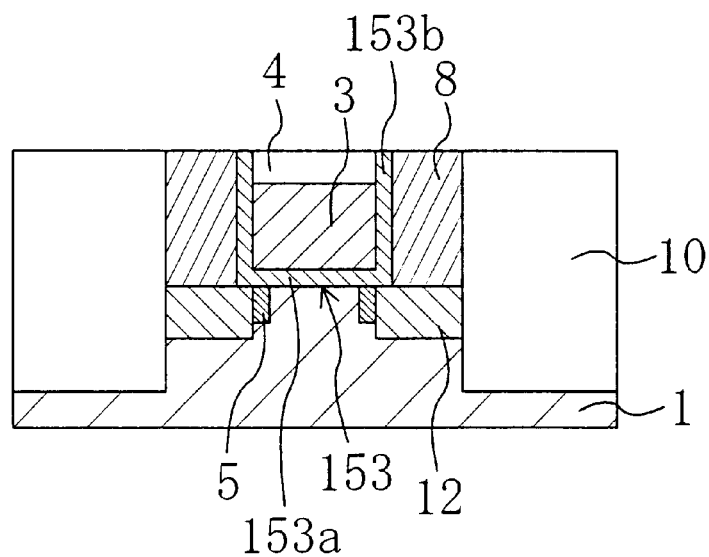

FIGS. 39A through 39C are cross-sectional views, taken in the gate length direction, illustrating respective process steps for fabricating a semiconductor device according to an alternative embodiment of the present invention. According to this alternative embodiment, the gate insulating film and sidewall insulating film are formed in a different manner from any of the foregoing first through fourth embodiments. This alternative embodiment is applicable to any of the foregoing embodiments. In the following description, however, this alternative embodiment will be applied to the fabrication process of the first embodiment for illustrative purposes only.

First, in the process step shown in FIG. 39A, the same process steps as those of the first embodiment shown in FIGS. 2A through 8C are performed, thereby forming LDD and heavily doped source/drain regions 5 and 12, isolation film 10 and contact dummies 8. Then, gate electrode dummy and undercoat insulating film are removed to form a gate hole 150 over an Si substrate 1.

Next, in the process step shown in FIG. 39B, a tantalum pentoxide ($Ta_2O_5$) film 151 with a high dielectric constant is deposited to a thickness of about 20 nm over the substrate and then an aluminum alloy film is deposited to a thickness of 600 nm thereon. Then, the aluminum alloy film is planarized by a CMP process until the surface of the tantalum pentoxide film 151 is exposed. In this case, the planarization process may be performed until the isolation film 10 and contact dummies 8 are exposed. Thereafter, the aluminum alloy film, which has been embedded in the gate hole 150, is etched back to a depth of about 100 nm, thereby forming a buried gate electrode 3. In this case, a recess 152 with a depth of about 100 nm is formed over the gate electrode 3 and is surrounded by the tantalum pentoxide film 151. As the conductor film for forming the gate electrode 3, a metal film like a tungsten film may be used instead of the aluminum alloy film.

Thereafter, in the process step shown in FIG. 39C, a plasma silicon dioxide film is deposited to a thickness of 200 nm over the substrate and then planarized by a CMP process until the surfaces of the isolation film 10 and contact dummies 8 are exposed. In this manner, an upper insulating film 4 is formed inside the recess 152 and a high dielectric constant insulating film 153, which covers the bottom of the gate electrode 3 and the side faces of the gate electrode 3 and upper insulating film 4, is formed. That is to say, according to this embodiment, the gate insulating film and sidewall insulating film are made of the single high dielectric constant insulating film 153.

Thereafter, the same process steps as those of the first embodiment shown in FIGS. 12A through 13C are performed to remove the contact dummies 8 and form source/drain contacts reaching the heavily doped source/drain regions 12.

According to this method, the bottom and side faces of the gate electrode 3 are covered with the high dielectric constant insulating film 153. That part of the high dielectric constant insulating film 153, which is in contact with the bottom of the gate electrode 3, functions as a gate insulating film 153a. The other part of the high dielectric constant insulating film 153, which is in contact with the side faces of the gate electrode 3 and upper insulating film 4, functions as a sidewall insulating film 153b for electrically isolating the gate electrode 3 from the source/drain contacts. The dielectric constant of the gate insulating film 153a made of $Ta_2O_5$ is several times higher than that of an $SiO_2$ film. Thus, even if the gate insulating film 153a is thickened, the $SiO_2$ converted thickness thereof (i.e., the thickness of an $SiO_2$ film that has a capacitance equal to that of the $Ta_2O_5$ film) still can be reduced. As a result, the current drivability of the device can be improved and the increase in leakage current, which usually occurs when the gate insulating film is thinned, can be suppressed.

In addition, according to this embodiment, no thermal oxidation is conducted to form the gate insulating film. Thus, even when the contact dummies 8 are made of a metal, there is no concern about the degradation of their properties resulting from thermal oxidation. Accordingly, the contact dummies 8 can be used as the source/drain contacts as they are.

Alternatively, in the process step shown in FIG. 39B, a CVD silicon dioxide film may be deposited to a thickness of about 10 nm over the substrate and then etched back to form a sidewall insulating film on the side faces of the gate hole 150. Thereafter, a $Ta_2O_5$ film 151 may be deposited to a thickness of about 20 nm over the substrate and then shaped into a high dielectric constant gate insulating film.

In the foregoing embodiments, just after the gate electrode dummy has been formed, a sidewall insulating film may be formed on the side faces of the gate electrode dummy. That sidewall insulating film may be either removed afterward or used as the final sidewall insulating film. In any case, only the LDD regions may be defined when the gate electrode dummy is formed. And the heavily doped source/drain regions may be defined after the sidewall insulating film has been formed.

Also, in the foregoing embodiments, a sidewall conductor film may be formed instead of the contact dummies and may be used as the final source/drain contacts. In that case, the process steps of removing the contact dummies and filling in the contact holes (e.g., the holes 11 shown in FIG. 12A) with a conductor can be omitted, although these process steps are needed in the foregoing embodiments. Thus, the fabrication process can be simplified.

Moreover, in the foregoing embodiments, the sidewall insulating film is formed on the side faces of the gate hole. Alternatively, the sidewall insulating film may be formed on the side faces of the contact holes (e.g., the holes 11 shown in FIG. 12A), which are formed when the contact dummies are removed after the buried gate electrode has been formed. Even by this method, the gate electrode can also be electrically isolated from the source/drain contacts.

Furthermore, in the foregoing embodiments, the LDD regions 5 are defined just after the gate electrode dummy has been formed. The heavily doped source/drain regions 12 do not have to be defined at that time. Instead, just before the source/drain contacts are formed, the heavily doped source/drain regions 12 may be defined by implanting dopant ions into the holes formed by removing the contact dummies. As another alternative, neither the LDD regions 5 nor heavily doped source/drain regions 12 need to be formed just after the gate electrode dummy has been formed. And just before the source/drain contacts are formed, the LDD and heavily doped source/drain regions 5 and 12 may be formed by implanting dopant ions into the holes formed by removing the contact dummies.

Moreover, the LDD regions do not have to be provided in the foregoing embodiments. This is because the short channel effects can also be suppressed sufficiently even with only a single type of diffused regions provided if the diffusion depth thereof is reduced, for example.

Also, in the foregoing embodiments, the isolation film is formed to extend upward from the trench defined in the semiconductor substrate. Alternatively, the isolation film may be formed to extend upward from the upper surface of the substrate.

Furthermore, in the foregoing embodiments, a Ti/TiN barrier metal film, for example, may be formed on the gate insulating film 2 and a conductor film for the buried gate electrode 3, such as an aluminum alloy film or a metal (e.g., tungsten film, may formed on the barrier metal film.

What is claimed is:

1. A semiconductor device comprising:
    a gate insulating film formed on a semiconductor substrate;
    a buried gate electrode formed on the gate insulating film;
    an upper insulating film formed on the buried gate electrode;
    a sidewall insulating film formed on side faces of the buried gate electrode and the upper insulating film;
    a trench isolation film self-aligned with the buried gate electrode, the upper surface of the isolation film being located at a level higher than the upper surface of the buried gate electrode, the lower surface of the isolation film being located at a level lower than the upper surface of the substrate at least on a cross section of the device taken in a gate length direction;
    source/drain diffused regions defined in respective regions of the substrate beside the buried gate electrode; and
    source/drain contacts formed between the sidewall insulating film and the isolation film and self-aligned with the buried gate electrode to make electrical contact with the source/drain diffused regions,
    wherein the size of the buried gate electrode as measured in the gate width direction is larger than that of the source/drain contacts, and the buried gate electrode protrudes laterally on both sides of the source/drain contacts in the gate width direction.

2. The device of claim 1, wherein the buried gate electrode is made of a metal.

3. The device of claim 1, wherein the gate insulating film is formed out of a high dielectric constant insulating film with a dielectric constant higher than that of $SiO_2$.

4. The device of claim 1, wherein as viewed from over the device, the source/drain contacts are in substantially the same planar shape as the source/drain diffused regions in respective areas where the contacts overlap the source/drain diffused regions, and are formed only over the source/drain diffused regions.

5. The device of claim 1, wherein the size of one of the source/drain contacts as measured in the gate length direction is in the range from 0.01 $\mu$m to 0.1 $\mu$m.

6. The device of claim 1, wherein the respective upper surfaces of the upper insulating film, the isolation film and the source/drain contacts are planarized to substantially the same levels.

7. The device of claim 1, wherein on a transversal cross section of the device taken across a part of the buried gate electrode, a periphery, outlining the sidewall insulating film, the buried gate electrode and the source/drain contacts, is surrounded by the isolation film.

8. The device of claim 1, wherein the buried gate electrode in its entirety, including a gate contact region thereof, is located only over the gate insulating film.

9. The device of claim 8, wherein on a transversal cross section of the device taken across a part of the buried gate electrode, a trench is formed in the substrate around a periphery, outlining the sidewall insulating film, the buried gate electrode and the source/drain contacts, and filled in with the isolation film.

10. The device of claim 1, wherein the source/drain diffused regions are composed of LDD regions and highly doped source/drain regions.

* * * * *